United States Patent
Lee et al.

(10) Patent No.: US 8,003,587 B2
(45) Date of Patent: Aug. 23, 2011

(54) SEMICONDUCTOR PROCESS RESIDUE REMOVAL COMPOSITION AND PROCESS

(75) Inventors: Wai Mun Lee, Fremont, CA (US); Cass X Shang, Sunnyvale, CA (US); Atsushi Otake, Kawasaki (JP); Akira Kuroda, Kanagawa (JP); Takanori Matsumoto, Kawasaki (JP); Hisashi Takeda, Tokyo (JP)

(73) Assignee: EKC Technology, Inc., Hayward, CA (US)

( * ) Notice: Subject to any disclaimer, the term of this patent is extended or adjusted under 35 U.S.C. 154(b) by 202 days.

(21) Appl. No.: 12/403,600

(22) Filed: Mar. 13, 2009

(65) Prior Publication Data

US 2009/0203566 A1    Aug. 13, 2009

(51) Int. Cl.
  *C11D 7/50*    (2006.01)
(52) U.S. Cl. .................. 510/175; 510/176; 134/1.3
(58) Field of Classification Search .................. 510/175, 510/176; 134/1.3
  See application file for complete search history.

(56) References Cited

U.S. PATENT DOCUMENTS

| | | | |
|---|---|---|---|
| 4,617,251 A | 10/1986 | Sizensky | |
| 5,308,745 A | 5/1994 | Schwartzkopf | |
| 5,417,877 A | 5/1995 | Ward | |
| 5,709,756 A | 1/1998 | Ward et al. | |
| 5,798,323 A | 8/1998 | Honda et al. | |
| 5,911,835 A | 6/1999 | Lee et al. | |
| 5,928,430 A | 7/1999 | Ward et al. | |
| 5,997,658 A | 12/1999 | Peters et al. | |
| 6,235,693 B1 | 5/2001 | Cheng et al. | |
| 6,261,745 B1 | 7/2001 | Tanabe et al. | |
| 6,268,323 B1 * | 7/2001 | Honda et al. | 510/176 |
| 6,276,372 B1 | 8/2001 | Lee | |
| 6,320,064 B1 | 11/2001 | Oftring et al. | |
| 6,326,130 B1 | 12/2001 | Schwartzkopf et al. | |
| 6,372,050 B2 | 4/2002 | Honda et al. | |
| 6,492,308 B1 * | 12/2002 | Naghshineh et al. | 510/175 |
| 6,531,436 B1 | 3/2003 | Sahbari et al. | |
| 6,558,879 B1 | 5/2003 | Peters et al. | |
| 6,599,370 B2 | 7/2003 | Skee | |
| 6,723,691 B2 | 4/2004 | Naghshineh et al. | |
| 7,135,445 B2 * | 11/2006 | Charm et al. | 510/175 |
| 2001/0004633 A1 | 6/2001 | Naghshineh et al. | |
| 2002/0037819 A1 * | 3/2002 | Sahbari | 510/175 |
| 2003/0130149 A1 | 7/2003 | Zhou et al. | |
| 2003/0171239 A1 | 9/2003 | Patel et al. | |
| 2004/0038840 A1 | 2/2004 | Lee et al. | |
| 2004/0134873 A1 | 7/2004 | Yao et al. | |
| 2004/0137736 A1 | 7/2004 | Daviot et al. | |
| 2004/0147420 A1 | 7/2004 | Zhou et al. | |
| 2005/0178742 A1 | 8/2005 | Chelle et al. | |

FOREIGN PATENT DOCUMENTS

| EP | 1 178 359 | 2/2002 |
|---|---|---|
| JP | 10321569 | 12/1998 |
| JP | 2001077063 | 3/2001 |

OTHER PUBLICATIONS

International Search Report (PCT/US2002/20840); Jun. 23, 2003.

* cited by examiner

*Primary Examiner* — Gregory E Webb
(74) *Attorney, Agent, or Firm* — Dunlap Codding, P.C.

(57) ABSTRACT

A composition that includes 2-(2-aminoethylamino)-ethanol, at least one of a chelating agent and a corrosion inhibitor, and water. The composition is capable of removing organic, organometallic and metal oxide residues from semiconductor substrates. The invention also relates to a method of removing etching residue from a semiconductor substrate.

10 Claims, 10 Drawing Sheets

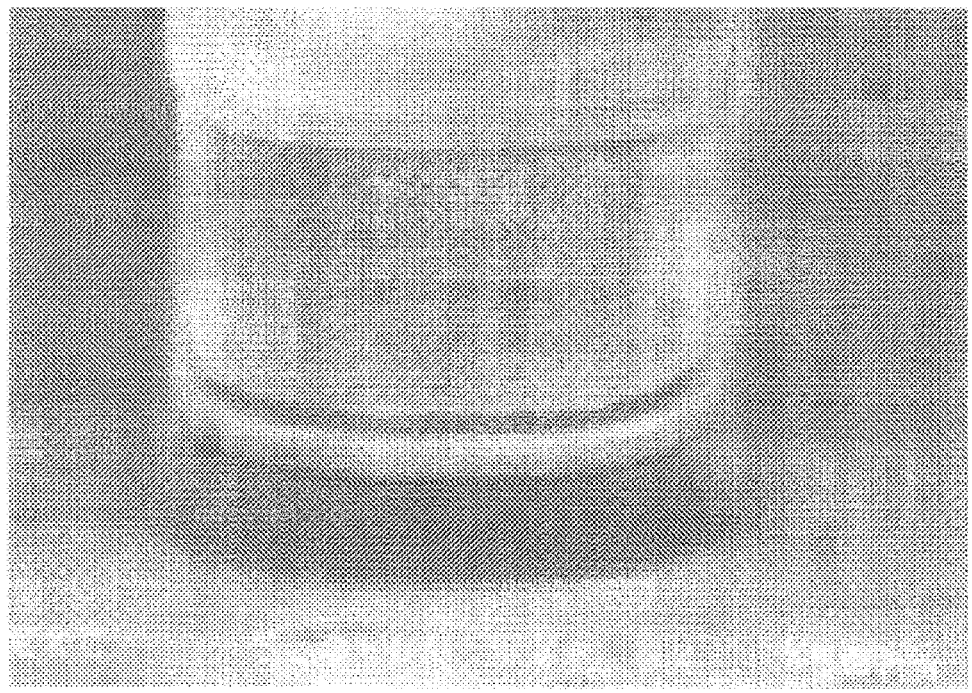
FIG._1
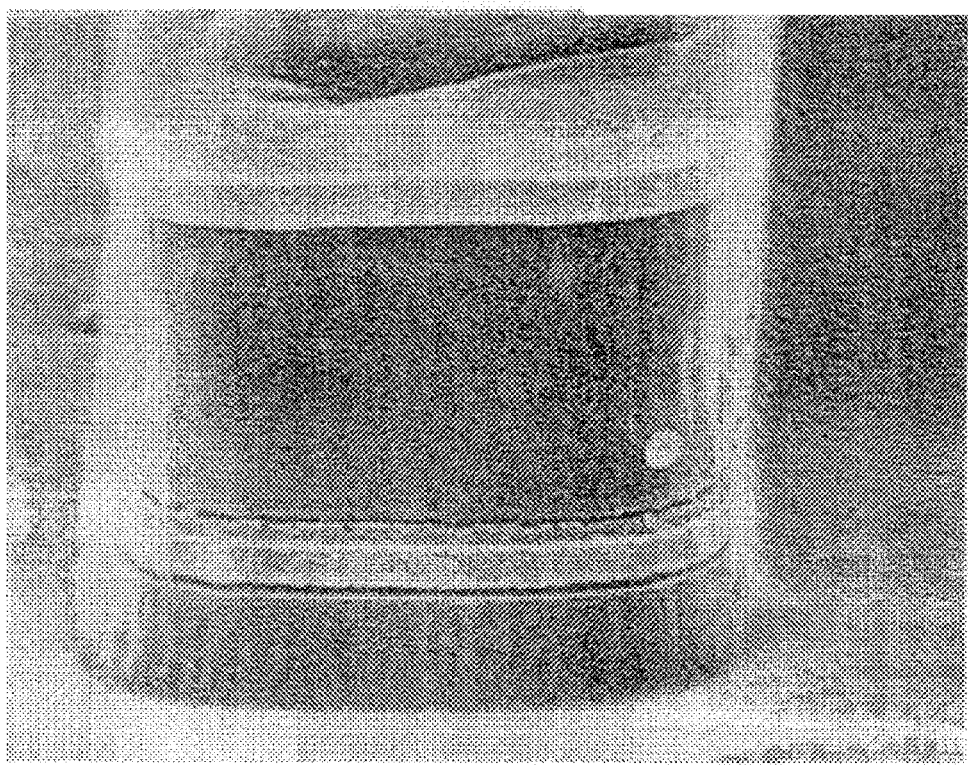
FIG._2

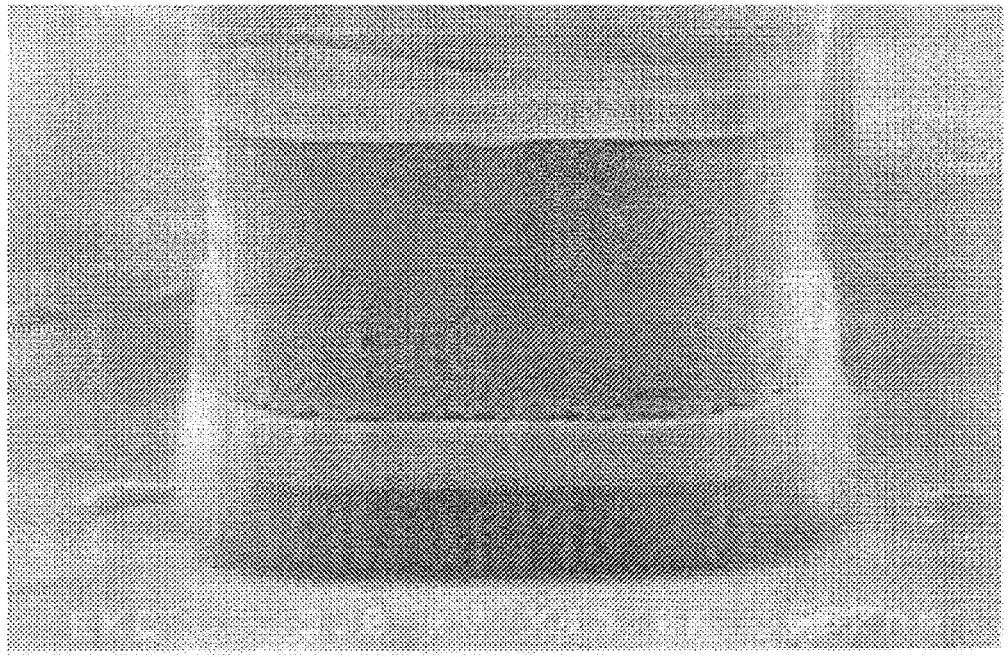
FIG._3
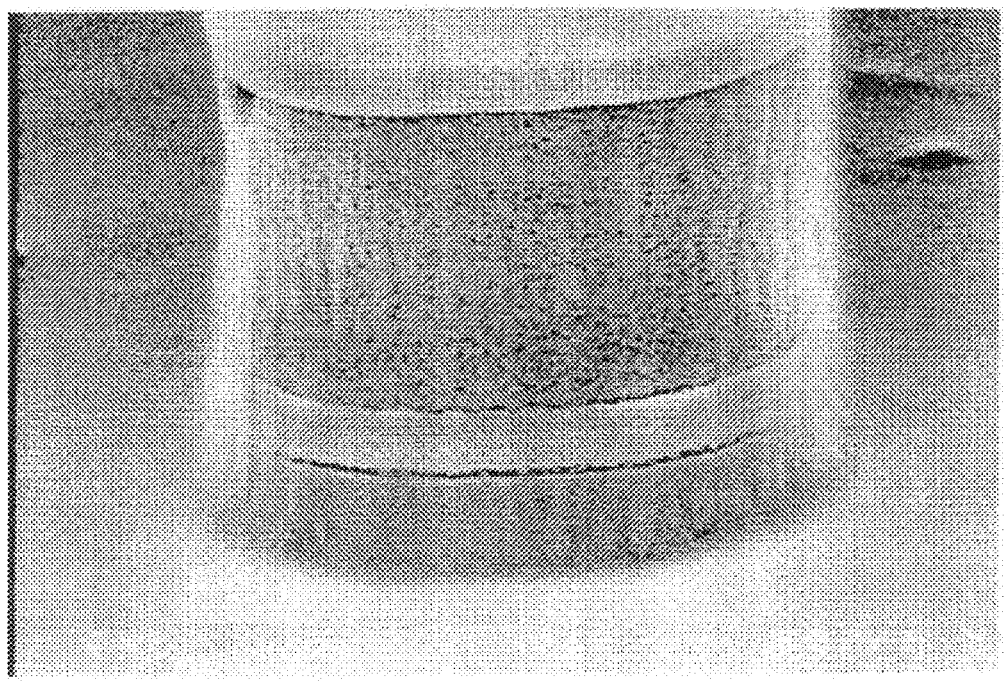
FIG._4

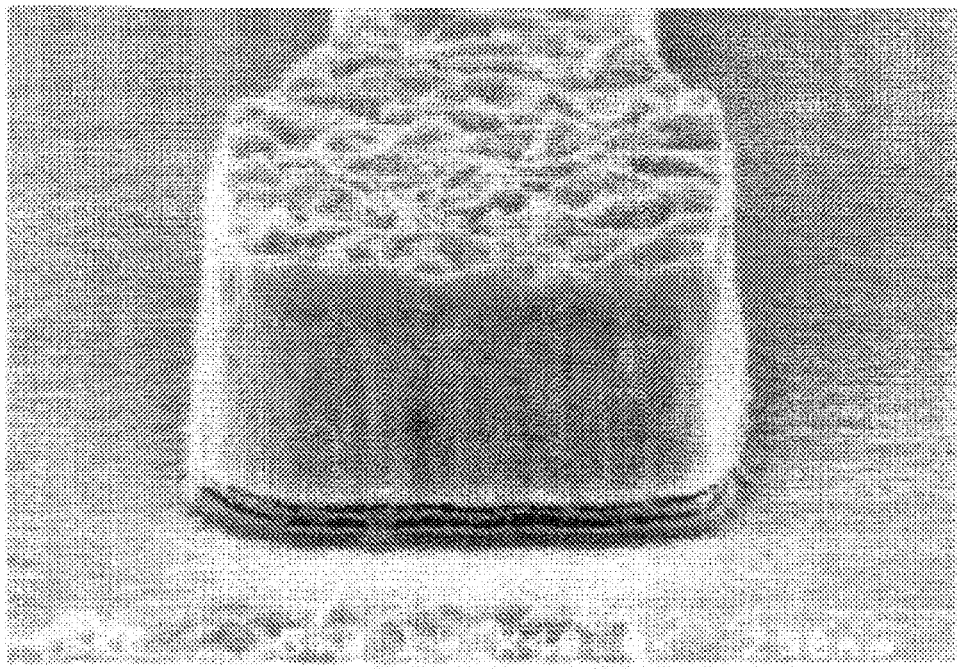
FIG._5
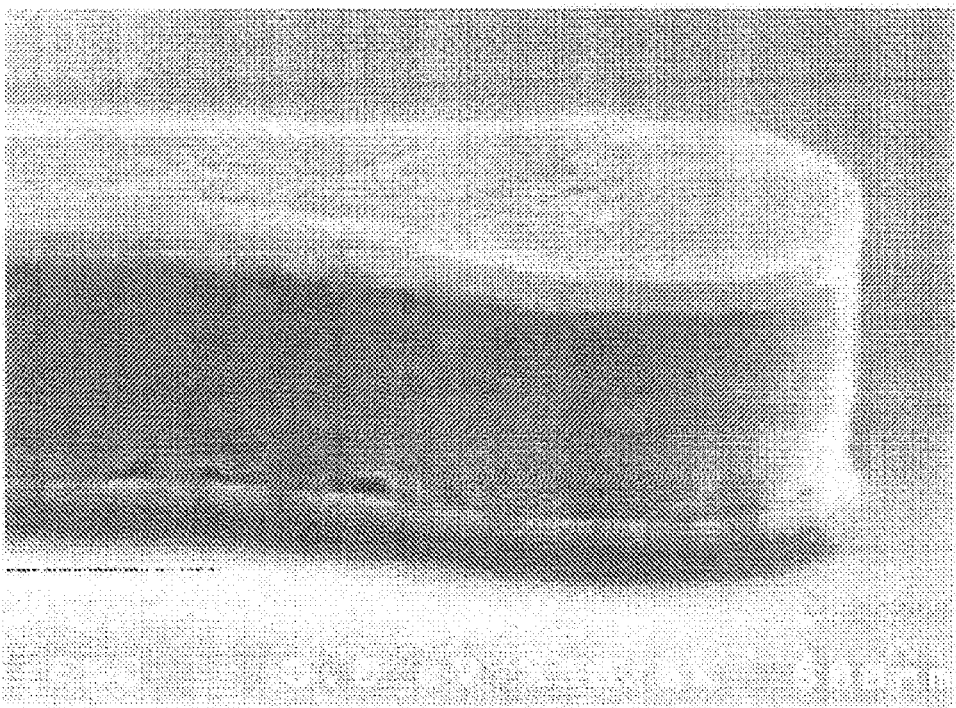
FIG._6

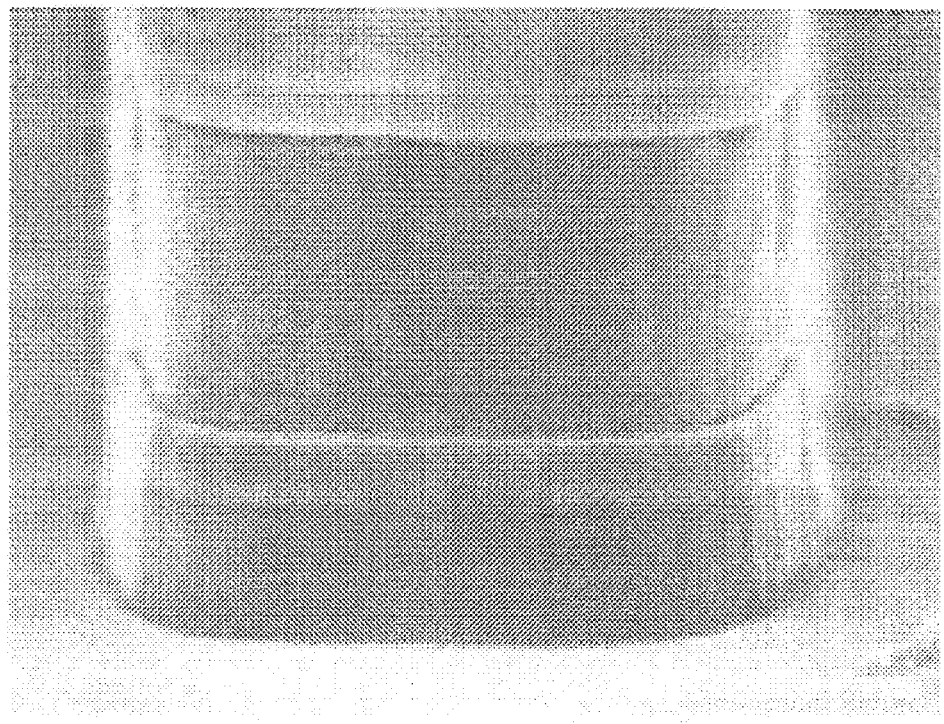
FIG._7
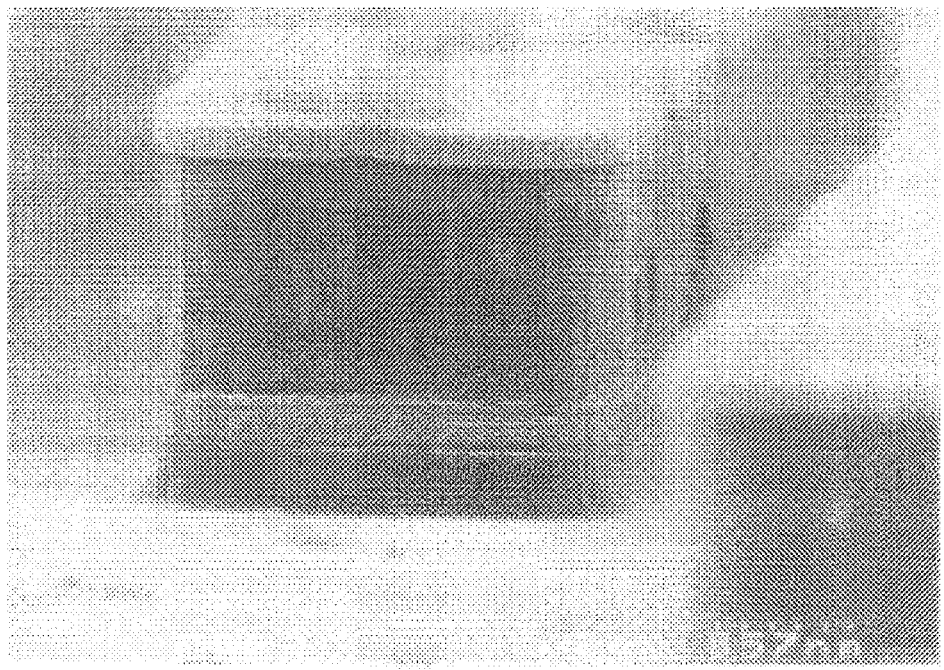
FIG._8

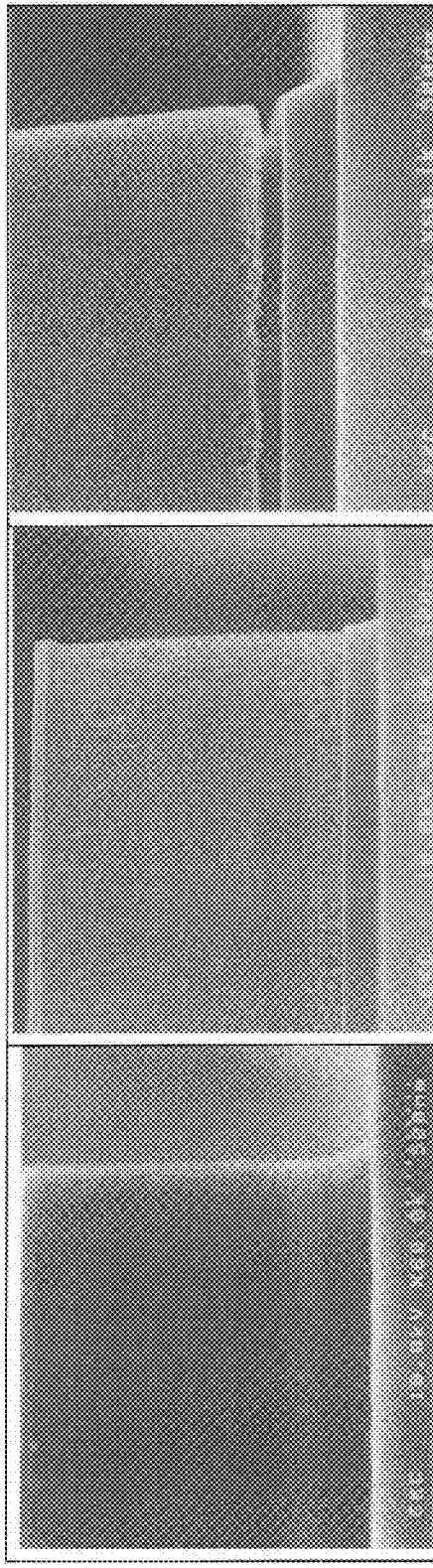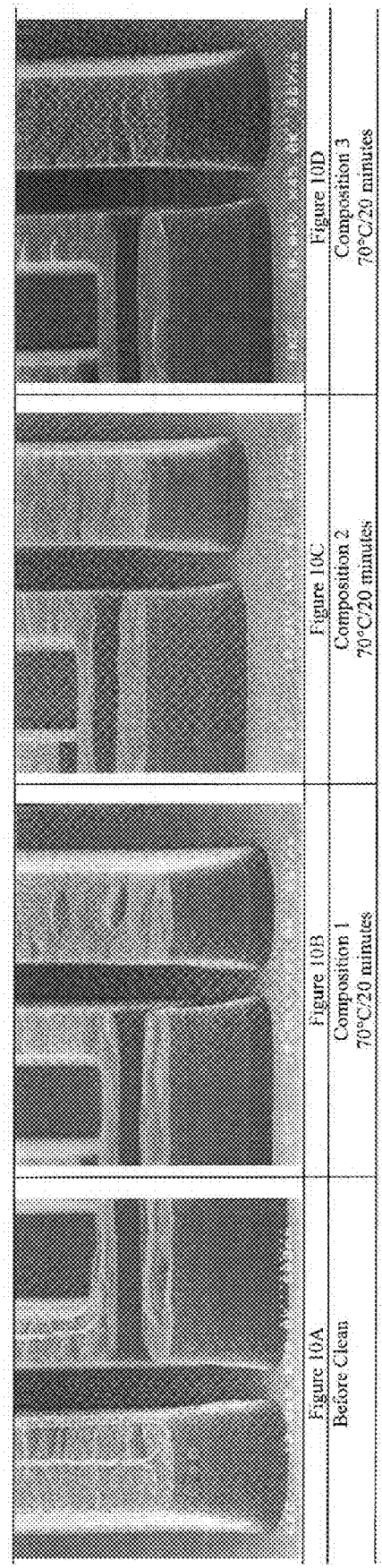

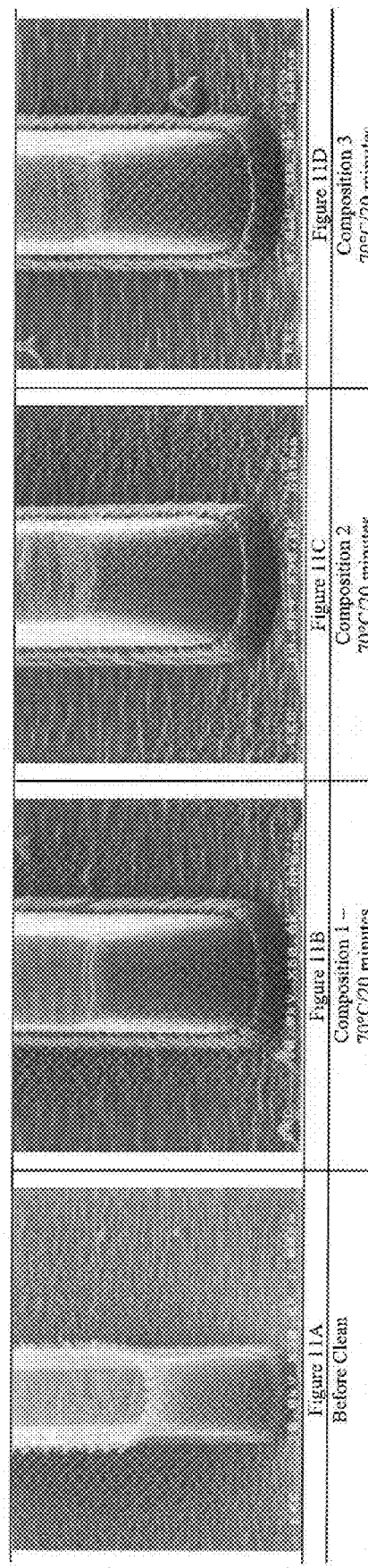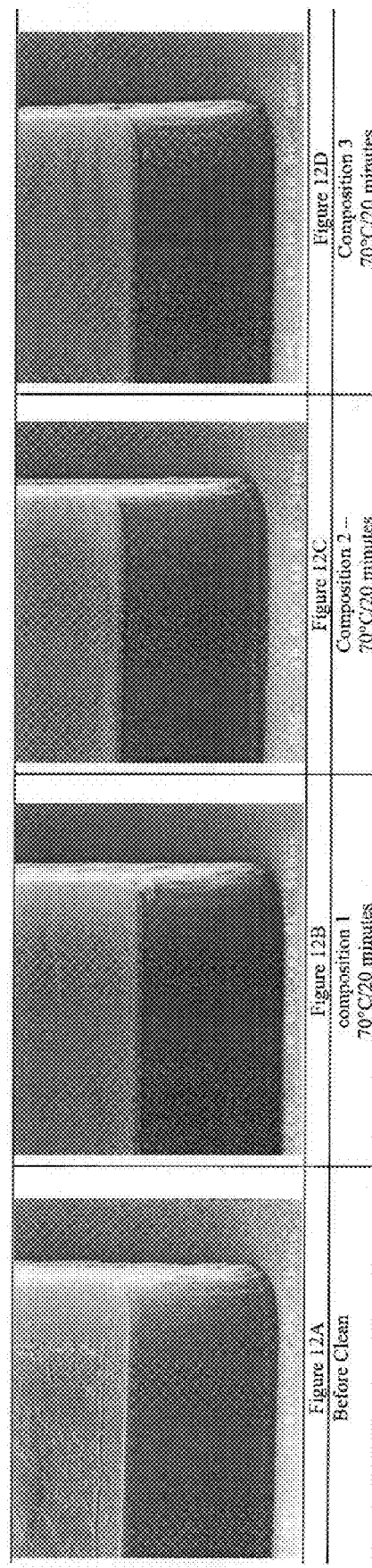

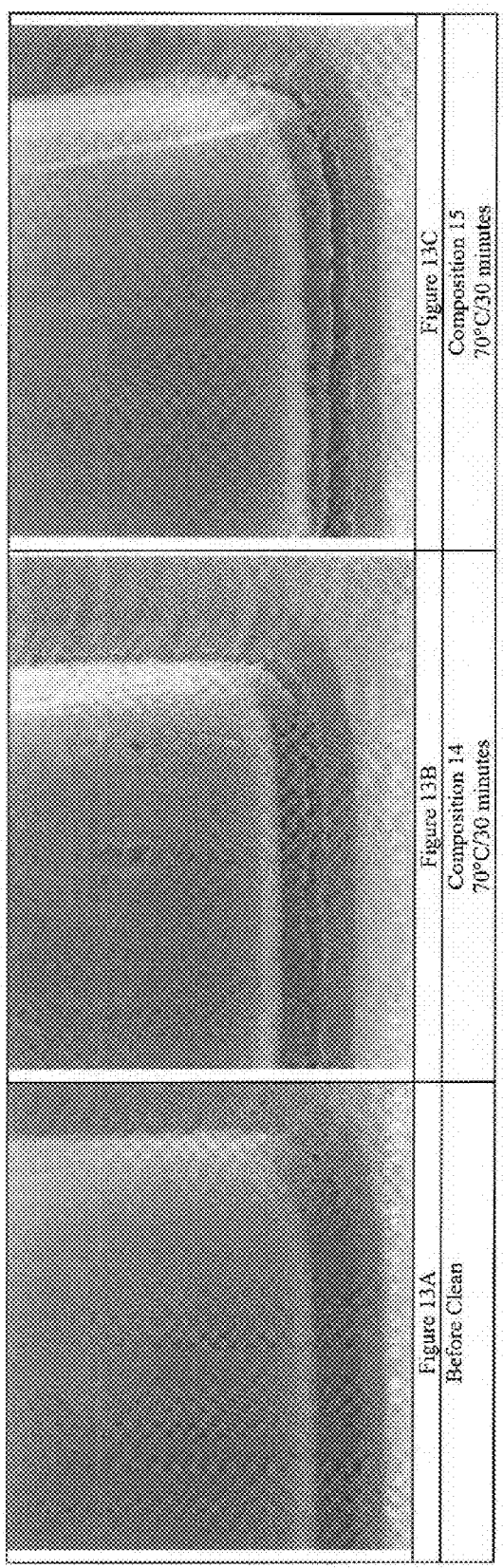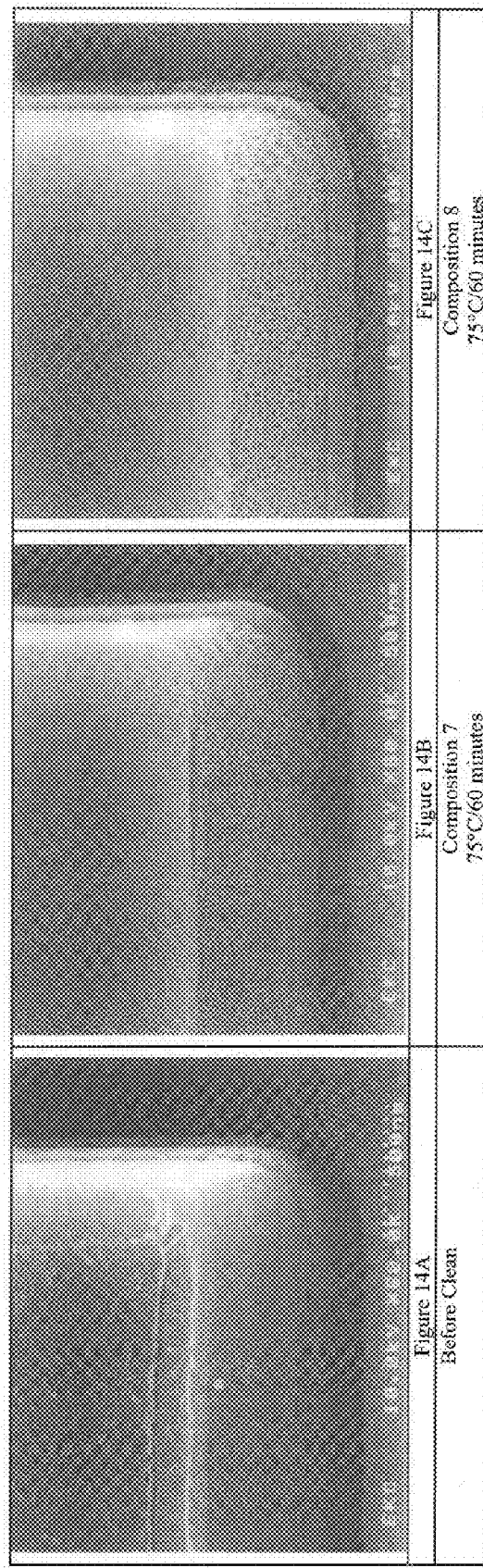

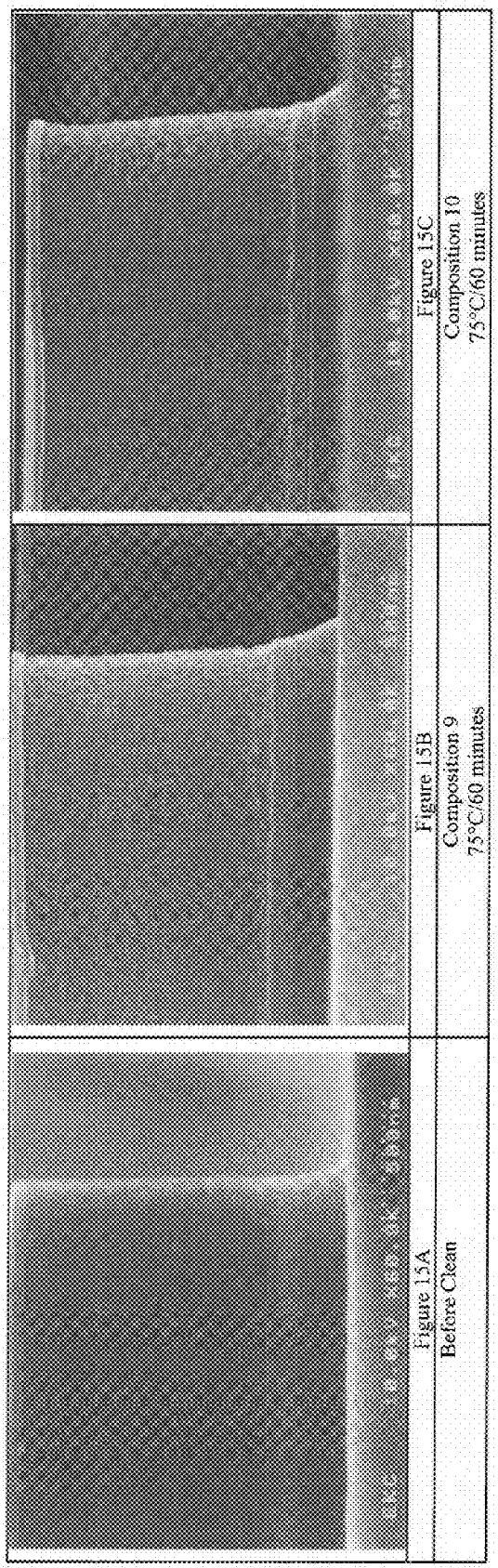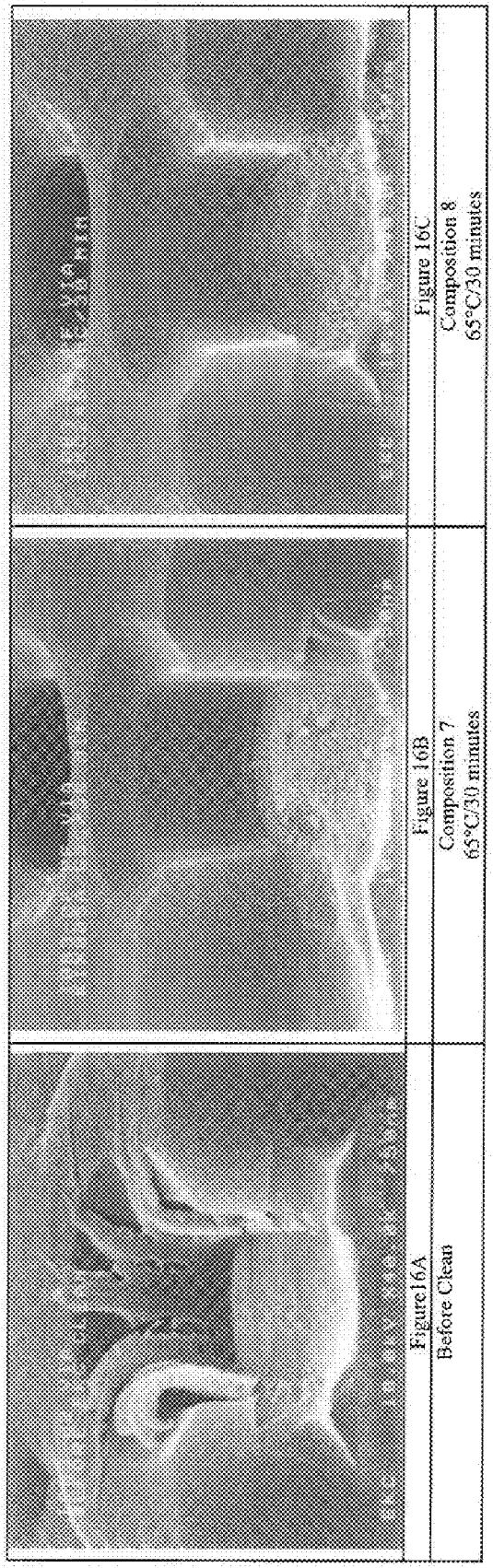

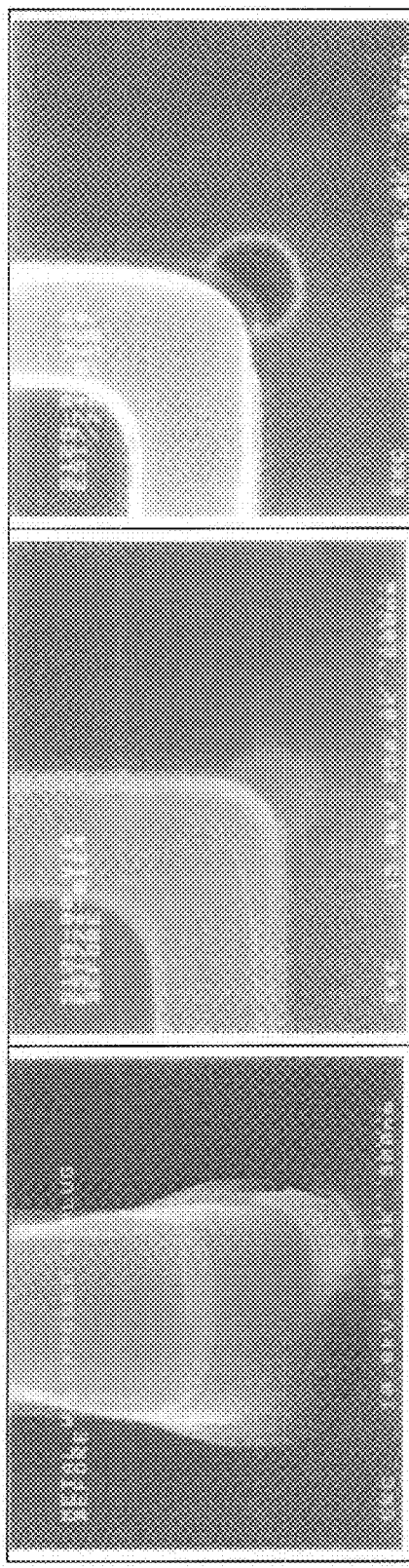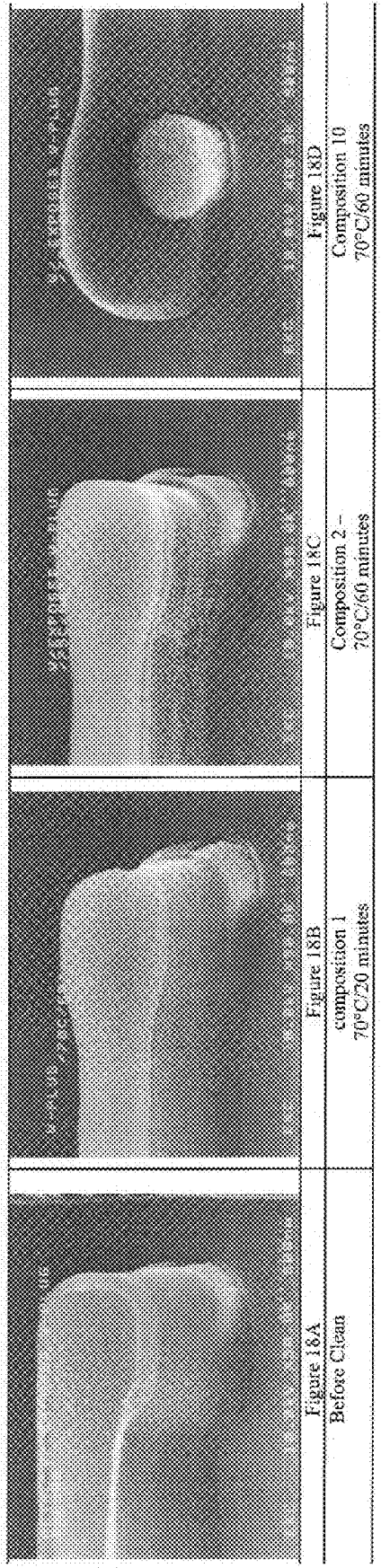

Before Clean composition 6
70°C/20 minutes

Composition 15
70°C/20 minutes

US 8,003,587 B2

SEMICONDUCTOR PROCESS RESIDUE REMOVAL COMPOSITION AND PROCESS

FIELD OF THE INVENTION

The present invention relates generally to a cleaning composition and process for removal of organic, organometallic, and/or metallic residues from semiconductor substrates, and also to a composition which can be used to apply controlled and predetermined etch rates on selected metal substrates. More particularly, the present invention relates to compositions including 2-carbon atom linkage alkanolamines, in particular 2-(2-aminoethylamino)-ethanol (AEEA), which are useful for removing semiconductor device fabrication residues and in some embodiments a small predetermined amount of substrate from semiconductor-type substrates. The invention also includes the processes of using the compositions of the present invention to clean and/or etch substrates particularly containing exposed aluminum, titanium, coppers tungsten, and or alloys thereof.

BACKGROUND OF THE INVENTION

As integrated circuit manufacturing has become more complex and the dimensions of circuit elements fabricated on silicon or other semiconductor wafers have become smaller, continued improvement in techniques used to remove residues formed from such materials has been required. Resists, used to mask substrates such that patterned material can be added, need to be removed from substrates.

Many formulations have been developed to remove both positive and negative resist. A resist includes polymeric material, which may be crosslinked or hardened by baking. Therefore, a simple combination of solvents will often remove resists, though time and temperature constraints in the manufacturing process have in general moved the industry to slightly more aggressive compounds.

Early compositions used for removing photoresists and other substrate layers have, for the most part, been highly flammable. In addition, reactive solvent mixtures can exhibit an undesirable degree of toxicity and are generally hazardous to both humans and the environment. Moreover, these compositions are not only toxic, but their disposal is costly, since they must be disposed of as a hazardous waste. In addition, these prior art compositions generally have a severely limited bath life and, for the most part, are Dot recyclable or reusable.

U.S. Pat. No. 4,617,251 to Sizensky, which issued on Oct. 14, 1986, describes a solution for removing polymeric resists that contains from 2 to 98% of an organic polar solvent and from 2 to 98% of an amine, particularly AEEA, 2-(2-aminothothoxy)-ethanol (DGA), or a mixture thereof. The patent teaches that the formulation is effective even on baked resists which have been exposed to temperatures of up to 200° C. for up to 30 minutes. The patent suggests that up to 50% of water or more can be added, and also that wetting agents and surfactants can be added.

Other prior art compositions for removing photoresists include inorganic alkalis in water, and polar organic solvents for positive photoresists. Polar organic solvents 10 are used generally at temperatures below 50° C. Mixtures of alkanolamines in water can be used for most types of resists.

Additionally, because many of the toxic components of such compositions are highly volatile and subject to unduly high evaporation rates, the compositions require special human and environmental safety precautions to be taken during storage and use of said compositions.

The resists may in some locations be altered, for example by etching, into various compounds, which incorporate the altered resist, as well as some usually altered substrate. For example, oxygen plasma oxidation is often used for removal of resists or other polymeric materials after their use, during the fabrication process has been completed.

Such high energy processes typically result in the formation of organometallic and other residues, for example metal oxides, on sidewalls of the structures being formed in the fabrication process. Other etching, including the use of directed energy and/or chemical etching, leave different types of residue, for example organometallic compound and/or metal fluorides. Finally, direct layer deposition using convertible organometallic compounds, which mayor may not require etching to form a pattern, may leave yet other types of residues. These residues must be removed without substantially altering the underlying substrate.

U.S. Pat. No. 6,372,050 teaches a composition for cleaning residue from a substrate that contains 5 to 50% of a solvent selected from a particular group that includes M-methyl-2-pyrrolidone (NMP), dimethyl sulfoxide (DMSO), N,N-dimethylacetamide, and many others; 10 to 90% of an alkanolamine selected from diethyleneglycolamine (DGA), monoethanolamine (MEA), diethanolamine (DEA), triethanolamine (TEA), AEEA, and mixtures thereof; from 0.1 to 10% of a carboxylic acid selected from formic acid, acetic acid, phthalic acid, salicylic acid, oxalic acid, and many others; and 1 to 40% water.

A variety of metal and other layers are commonly employed in integrated circuit fabrication, including aluminum, aluminum/silicon/copper, copper, titanium, titanium nitride, titanium/tungsten, tungsten, silicon oxide, polysilicon crystal, and the like. The use of such different layers results in the formation of different organometallic residues in the high energy processes. Further, there is almost always at least two, but in some cases there may be more than two substrate types on an outer layer to be cleaned. A cleaning composition is often designed to be compatible with a single substrate exposed to the cleaning composition.

A variety of residue removal compositions and processes suitable for 10 integrated circuit fabrication, have been developed and marketed by EKC Technology, Inc. (hereinafter "EKC"), the assignee of the present application. Some of these compositions and processes are also useful for removing photoresist, polyimide, or other polymeric layers from substrates in integrated circuit fabrication, and EKC has also developed a variety of compositions and processes specifically for removing such polymeric layers from substrates in integrated circuit fabrication. Additionally, EKC has developed a variety of compositions and processes to selectively remove specific substrate compositions from a substrate surface at a controlled rate. Such compositions and processes are disclosed in the following commonly assigned issued patents:

U.S. Pat. No. 6,367,486 to Lee et al. which issued on Apr. 9, 2002, entitled Ethylenediaminetetraacetic acid or its ammonium salt semiconductor process residue removal process;

U.S. Pat. No. 6,313,039 to Small et al., which issued on Nov. 6, 2001, entitled Chemical mechanical polishing composition and process;

U.S. Pat. No. 6,276,372 to Lee, which issued on Aug. 21, 2001, entitled Process using hydroxylamine-gallic acid composition;

U.S. Pat. No. 6,251,150 to Small et al., which issued on Jun. 26, 2001, entitled Slurry composition and method of chemical mechanical polishing using same;

U.S. Pat. No. 6,248,704 to Small et al., which issued on Jun. 19, 2001 entitled Compositions for cleaning organic and plasma etched residues for semiconductors devices;

U.S. Pat. No. 6,242,400 to Lee, which issued on Jun. 5, 2001, entitled Method of stripping resists from substrates using hydroxylamine and alkanolamine;

U.S. Pat. No. 6,235,693 to Cheng et al., which issued on May 22, 2001, entitled Lactam compositions for cleaning organic and plasma etched residues for semiconductor devices;

U.S. Pat. Nos. 6,187,730 and 6,221,818, both to Lee, which issued on Feb. 13, 2001 and on Apr. 24, 2001, respectively entitled Hydroxylamine-gallic compound composition and process;

U.S. Pat. No. 6,156,661 to Small, which issued on Dec. 5, 2000, entitled Post clean treatment;

U.S. Pat. No. 6,140,287 to Lee, which issued on Oct. 31, 2000, entitled Cleaning compositions for removing etching residue and method of using;

U.S. Pat. No. 6,121,217 to Lee, which issued on Sep. 19, 2000 entitled Alkanolamine semiconductor process residue removal composition and process;

U.S. Pat. No. 6,117,783 to Small et al., which issued on Sep. 12, 2000, entitled Chemical mechanical polishing composition and process;

U.S. Pat. No. 6,110,881 to Lee et al., which issued on Aug. 29, 2000, entitled Cleaning solutions including nucleophilic amine compound having reduction and oxidation potentials;

U.S. Pat. No. 6,000,411 to Lee, which issued on Dec. 14, 1999, entitled Cleaning compositions for removing etching residue and method of using;

U.S. Pat. No. 5,981,454 to Small, which issued on Nov. 9, 1999, entitled Post clean treatment composition comprising an organic acid and hydroxylamine;

U.S. Pat. No. 5,911,835 to Lee et al., which issued on Jun. 15, 1999, entitled Method of removing etching residue;

U.S. Pat. No. 5,902,780 to Lee, which issued on May 11, 1999, entitled Cleaning compositions for removing etching residue and method of using;

U.S. Pat. No. 5,891,205 to Picardi et al., which issued on Apr. 6, 1999, entitled Chemical mechanical polishing composition;

U.S. Pat. No. 5,672,577 to Lee, which issued on Sep. 30, 1997, entitled Cleaning compositions for removing etching residue with hydroxylamine, alkanolamine, and chelating agent;

U.S. Pat. No. 5,482,566 to Lee, which issued on Jan. 9, 1996, entitled Method for removing etching residue using a hydroxylamine-containing composition;

U.S. Pat. No. 5,399,464 to Lee, which issued on Mar. 21, 1995, entitled Triamine positive photoresist stripping composition and post-ion implantation baking;

U.S. Pat. No. 5,381,807 to Lee, which issued on Jan. 17, 1995, entitled Method of stripping resists from substrates using hydroxylamine and alkanolamine;

U.S. Pat. No. 5,334,332 to Lee, which issued on Aug. 2, 1994, entitled Cleaning compositions for removing etching residue and method of using;

U.S. Pat. No. 5,279,771 to Lee, which issued on Jan. 18, 1994, entitled Stripping compositions comprising hydroxylamine and alkanolamine;

U.S. Pat. No. 4,824,763 to Lee, which issued on Apr. 25, 1989, entitled Triamine positive photoresist stripping composition and prebaking process; and U.S. Pat. No. 4,395,348 to Lee, which issued on Jul. 26, 1983, entitled Photoresist stripping composition and method; the entire disclosures of all of which are incorporated herein for all purposes by express reference thereto. These compositions have achieved substantial success in integrated circuit fabrication applications.

U.S. Pat. No. 5,997,658 describes a remover for photoresist and etching residue that contains water, an amine, and a corrosion inhibitor including benzotriazole, gallic acid, or both.

As a result of a continuous effort to decrease critical dimension size in the integrated circuit industry, such as in the fabrication of sub-micron size devices, etching residue removal and substrate compatibility with chemicals employed in wet processing is becoming more and more critical for obtaining acceptable yield in very large scale integration (VLSI) and ultra large scale integration (ULSI) processes. The effectiveness of residue removal by etching, to a large extent, depends on the composition of the surfaces or materials to the etched and the composition of the etchant, as well as many other variables too numerous to mention. The composition of such etching residue is generally made up primarily of the etched substrates, underlying substrate, etched and/or ashed photoresist, and etching gases. The substrate compatibility of the wafers with wet chemicals is highly dependent on the processing of the polysilicon, multilevel interconnection dielectric layers, and metallization in thin film deposition, etching and post-etch treatment of the wafers.

Processing conditions are often quite different from, one fabrication process to another, making it difficult to apply a particular composition to obtain both effective residue removal and substrate compatibility. For example, some compositions have produced corrosion on certain metal substrates, such as those including a titanium metal layer. Titanium has become more widely used in semiconductor manufacturing processes. It is employed both as a barrier layer to prevent electromigration of certain atoms and as an antireflector or refractory metal layer on top of other metals. Used in such a capacity, the layer is often very thin, and corrosion or etching during cleaning operations may compromise the purpose of the layer.

Hydroxylamine (HA) formulations have been found to be useful in the removal of substrate, for example as an etchant used in chemical-mechanical etching processes, as described in U.S. Pat. Nos. 6,313,039; 6,251,150; and 6,117,783.

Hydroxylamine formulations have also been useful in removing photoresists, such as is found in U.S. Pat. Nos. 5,279,771 and 5,381,807, which describe formulations containing hydroxylamine, an alkanolamine, and optionally a polar organic solvent.

Hydroxylamine formulations have also been useful in removing etching residue, such as is found in U.S. Pat. No. 5,334,332, which describes a formulation containing hydroxylamine, an alkanolamine, water, and a chelating agent. Hydroxylamine-containing formulations designed to remove residues are known to be aggressive to metals, particularly to titanium film and under more aggressive process conditions to aluminum film.

As a result, various formulations have been developed to control the corrosion. The attack of titanium can be moderated by using different chelator, e.g., such as disclosed in U.S. Pat. No. 6,276,372, and/or by selecting a class of alkanolamine with 2-carbon linkage(s), which is disclosed, e.g., in U.S. Pat. No. 6,121,217. For example, other formulations include those disclosed in: U.S. Pat. Nos. 6,276,372, 6,221, 818, and 6,187,730, which each describe a hydroxylamine formulation with a gallic compound (as opposed to catechol) and an alcohol amine; U.S. Pat. No. 6,242,400, which describes a hydroxylamine formulation with an alcohol amine and a polar organic solvent; U.S. Pat. Nos. 6,156,661 and 5,981,454, which each describe a buffered hydroxylamine formulation with an organic acid; U.S. Pat. Nos. 6,140,287 and 6,000,411, which each describe a hydroxylamine formulation with an alkanolamine and a chelating agent; U.S. Pat. No. 6,121,217, which describes a hydroxylamine formulation with an alkanolamine and gallic acid or catechol; U.S. Pat. No. 6,110,881, which describes a hydroxylamine formulation with an organic solvent, water, and a chelating agent; U.S. Pat. No. 5,911,835, which describes a nucleophillic amine compound formulation with an organic solvent, water, and a chelating agent; and U.S. Pat. Nos. 5,902,780, 5,672,577, and 5,482,566, which each describe a hydroxylamine formulation with an alkanolamine, water, and a dihydroxybenzene chelating agent.

U.S. Pat. No. 5,997,658 to Peters et al, describes a hydroxylamine-free photoresist stripping and cleaning composition, for use particularly of copper or titanium substrates, having about 70 to 85% by weight of an alkanolamine, about 0.5 to 2.5% by weight of benzotriazole, about 0.5 to 2.5% by weight of gallic acid and the remainder being water. Alkanolamines include N-methylethanolamine (NMEA), monoethanolamine (MEA), diethanolamine, mono-, di-, and tri-isopropanolamine, 2-(2-aminoethylamino)-ethanol, 2-(2-aminoethoxy)-ethanol, triethanolamine, and the like, The preferred alkanolamine is N-methylethanolamine (MEA).

Additionally, U.S. Pat. No. 5,928,430 to Ward et al., entitled Aqueous stripping and cleaning compositions containing hydroxylamine and use thereof, describes an aqueous stripping composition comprising a mixture of about 55% to 70% by weight of a polar amine solvent, about 22.5 to 15% by weight of a basic amine, especially hydroxylamine, gallic acid as a corrosion inhibitor, and water. U.S. Pat. No. 5,419,779 to Ward describes a stripping composition containing water, 22.5 to 15% by weight of hydroxylamine, 55% to 70% monoethanolamine, and preferably up to about 10% by weight of a corrosion inhibitor, particularly one selected from the group consisting of catechol, pyrogallol, anthranilic, acid, gallic acid, and gallic ester.

Other cleaning type compositions exist, for example as found in U.S. Pat. No. 6,261,745 to Tanabe et al., entitled Post-ashing treating liquid compositions and a process for treatment therewith, which describes a post-ashing treating liquid composition comprising a salt of hydrofluoric acid with a base free from metal ions, a water-soluble organic solvent, water, and an acetylene alcohol/alkylene oxide adduct.

Other prior art, e.g., U.S. Pat. Nos. 6,372,050, 6,326,130, 6,268,323, 6,261,745, 5,997,658, 5,417,877, and 4,617,251, inter alia, have demonstrated the corrosion of the aluminum metal film caused by various amines and other compounds in photoresist stripper formulations.

However, further development of integrated circuits and their fabrication processes have created a need for improvement in residue removal compositions and processes.

SUMMARY OF THE INVENTION

One important problem with respect to residue removers is the permissible operating temperature. Generally, higher temperatures are preferred by manufacturers to reduce particle counts and to increase process speed. There are generally three limitations on the operating temperature, safety concerns, composition longevity, and etch rates.

It is usually desirable that the operating temperature should not exceed the flash point of the mixture. The flash point is the lowest temperature at which a liquid can form an ignitable mixture in air near the surface of the liquid. The lower the flash point, the easier it is to ignite the material. For example, gasoline has a flash point of −40° C., and it is therefore more flammable than ethylene glycol which bas a flash point of 111° C. (232° F.).

Flammable liquids that are water miscible may have increased or decreased flash points when mixed with water. Often, the flash point of a mixture will be classified the same as that of the liquid with the lowest flash point.

This problem has been addressed in the prior art by limiting process temperatures. U.S. Pat. No. 5,419,779 to Ward describes a process for removing an organic coating from a substrate by applying a composition consisting of about 62% by weight of MEA, about 19% by weight HA, a corrosion inhibitor which includes gallic acid and gallic acid esters, and water. This patent limits the operating temperature to between 40° C. and 75° C. The flash point of MEA is 93° C. Typically, however, manufacturers use strippers and residue removers at higher temperatures to accelerate residue and especially polymer removal.

Even if the composition is held below its flash point, low boiling temperature compounds will nevertheless preferentially distill out of the stripper or residue cleaner composition over time. The compositions may change with time because they are generally stored for up to several days at operating temperatures during use. In many instances, the flash point of a mixture changes as certain components are distilled from the mixture. The cleaning and substrate etching characteristics of a formulation will change as the amounts of the components change.

Some manufacturers provide replenishing solutions that contain one or more components that are lost over time while storing the residue remover at operating temperature. Since low-boiling-temperature organics are preferentially lost and these low-boiling-temperature organics have lower flash points than high-boiling-temperature organics, this replenishing formulation typically has a very low flash point. During the process of adding the replenishing solutions, the system may have localized areas where the temperature exceeds the flash point of the liquid, which can result in dangerous conditions.

Advantageously, for certain embodiments of this invention, replenishing solutions consist essentially of water and, optionally, hydroxylamine and/or a hydroxylamine derivative. The replenishing solutions are preferably substantially free of alkanolamines and polar organic solvents, and optionally chelating agents and/or corrosion inhibitors.

The etch rates of most residue remover formulations increases with increasing process temperature. Some manufacturers suggest using formulations at low temperatures, such as at 30° C., to provide low etch rates at "normal" operating temperatures. Lower temperatures do not provide adequate removal of tougher residues, which may include polymeric material, within an feasible processing time.

It is possible to use highly reactive components in residue removers, which 35 allows elimination of many solvents and other organics. Fluoride-containing compositions can be used for oxide etch residue. This allows higher flashpoints for mixtures, in some cases exceeding 105° C. However, aluminum and titanium etch rates, at ambient temperatures of 3 to 6 Å/minute are found in commercial inhibited formulations. Therefore, higher temperatures are not practicable for such formulations.

Finally, there may be more than one substrate exposed to a cleaner. Many cleaner formulations exhibit reduced etching activity for one substrate but poor etching activity with other substrate(s). Different etch rates will often produce undesired results.

Accordingly, one object of the invention is to provide a family of photoresist and residue removing compositions which overcomes the above and other stated problems with the prior art. Another object of this invention is to provide an improved composition for residue removal and process using such a composition suitable for meeting current semiconductor fabrication requirements. It is another object of the invention to provide a process which is suitable for meeting the above objects. The attainment of the foregoing and related objects, advantages, and features of the invention should be more readily apparent to those skilled in the art, after review of the following more detailed description of the invention, taken together with the examples and claims, as described herein.

One embodiment of the invention is a residue removing composition which is effective for removing residues such as resists and etching residues after etching processes, e.g., plasma etching, which are undesired byproducts generated during the fabrication of integrated circuits on silicon wafers and similar processes, and also resists or other undesired materials, but does not attack the different underlying substrate metallurgies and insulation layers used in integrated circuit fabrication.

One embodiment of the invention is a residue removing composition that is effective for removing residues, such as resists and etching residues, after etching processes, e.g., plasma etching, which residues can be undesired byproducts generated during the fabrication of integrated circuits on semiconductor wafers, but which composition does not aggressively attack underlying titanium and/or aluminum used in integrated circuit fabrication.

One embodiment of the invention is a residue removing composition that, when used as an etchant or when used as a residue remover/etchant, provides a controlled slow etch rate on various substrates, in addition to cleaning any residues.

One embodiment of the invention is a residue removing composition that, when used as an etchant or when used as a residue remover/etchant, provides a controlled slow etch rate on various substrates, in addition to cleaning any residues, wherein the etch rates on the different metal compositions are substantially the same, or alternatively differ in a predetermined amount.

One embodiment of the invention is a residue removing composition that is effective for removing residues, such as resists and etching residues, and which composition exhibits a low etch rate for a variety of metallic substrates while used at higher temperature, i.e., greater than 70° C., preferably greater than 90° C., for example in some instances greater than 110° C.

One embodiment of the invention is a residue removing composition that is effective for removing residues, such as, resists and etching residues, and which composition advantageously has a low formulation loss and a low composition change (excluding water and in some cases hydroxylamine), when stored and used at relatively higher temperatures.

One embodiment of the invention is a residue removing composition that is effective for removing residues, such as resists and etching residues, and which composition has a flash point in excess of 115° C., preferably in excess of 125° C., for example in excess of 130° C. Another embodiment of the invention is a residue removing composition that is effective for removing residues such as resists and etching residues and which contains less than 10%, preferably less than 5% and more preferably is substantially free of components with a flash point below about 115° C. preferably below about 125° C. for example below about 130° C.

One embodiment of the invention is a residue removing composition that is effective for removing residues, such as resists and etching residues, and which composition contains less than 10%, preferably less than 5%, and more preferably is substantially free of organic components having a boiling point below about 199° C., preferably below about 215° C. for example below about 235° C.

One embodiment of the invention is a residue removing composition that is effective for removing residues, such as resists and etching residues, and which composition contains less than 10%, preferably less than 5%, and more preferably is substantially free of organic components having a boiling point not between about 199° C. and 290° C., preferably between about 215° C. and 290° C.

One embodiment of the invention is a residue removing composition that is effective for removing residues, such as resists and etching residues, and which composition contains less than 10%, preferably less than 5%, and more preferably is substantially free of organic components having a boiling point not between about 235° C. and 260° C.

One embodiment of the invention is a family of a residue removing compositions that contain AEEA and that are effective for removing residues, such as resists and etching residues, while being less aggressive to titanium and/or aluminum substrates than similar compositions with other alkanolamines different than AEEA.

One embodiment of the invention is a family of solvent-based residue removing compositions that contain AEEA and that are effective for removing residues, such as resists and etching residues, while being useful for a variety of metallic and dielectric substrates, wherein the flash point of the cleaning composition is greater than about 120° C., preferably greater than about 125° C., more preferably greater than about 130° C.

One embodiment of the invention is a family of solvent-based residue removing compositions that contain AEEA and that are effective for removing residues, such as resists and etching residues, while being useful for a variety of metallic and dielectric substrates, wherein the flash point of the cleaning composition is greater than about 120° C., preferably greater than about 125° C., more preferably greater than about 130° C. Another embodiment is a method of cleaning polymeric material, etching residue, or both from a semiconductor substrate, which method includes using the aforementioned family of solvent-based residue removing compositions in a process operated at a temperature between about 90° C. and about 120° C.

One embodiment of the invention is a family of solvent-based residue removing compositions that contain AEEA and that are effective for removing residues, such as resists and etching residues, while being useful for a variety of metallic and dielectric substrates, wherein the flash point of the cleaning composition is greater than about 125° C. Hydroxylamine does not have a reported flash point.

Another embodiment of the invention is a multi component residue removing composition that is effective for removing residues, such as resists and etching residues, and that contains less than 10%, preferably less than 5%, and more preferably is substantially free of volatile organic components having a boiling point not between about 220° C. and about 250° C. Hydroxylamine is not considered a volatile organic component for these purposes.

Another embodiment of this invention is a family of residue removers that etch various substrates at a predetermined rate, for example etching aluminum, titanium, tungsten, and alloys thereof at approximately the same rate.

Another embodiment of this invention a family of residue removers that etch various substrates at a predetermined rate, for example etching aluminum at a rate comparable to chemical mechanical etching solutions, but are not aggressive to other selected metals, for example titanium and alloys thereof.

Another embodiment of the invention is a composition and process that is suitable for removing residues from wafers and other substrates including one or more metal or metal alloy layers without substantial attack on such layers.

A residue removal and/or etching composition in accordance with this invention includes 2-(2-aminoethylamino)-ethanol (AEEA), which is an alcohol amine compound that has a relatively high-boiling point, a relatively high flash point, and a relatively low (in some cases, nonexistent) etch rate under standard process conditions for metallic substrates or layers.

In some embodiments of the invention, the attainment of these and related objects may be achieved through use of the residue removal and/or etching composition comprising a derivative of 2-(2-aminoethylamino)-ethanol formed by adding substituting groups onto a 2-(2-aminoethylamino)-ethanol base.

A process for removing a residue from a substrate and/or for etching a metal or metal alloy on a substrate, in accordance with this invention, includes contacting the substrate with a composition that contains a two-carbon atom linkage alkanolamine compound, particularly 2-(2-aminoethylamino)-ethanol, for a time and at a temperature sufficient to remove the residue from the substrate and/or to selectively etch the metal and/or metal alloy from the substrate.

One embodiment of the invention is a composition comprising (a) 2-(2-aminioethylamino)-ethanol; (b) at least one of a chelating agent and a corrosion inhibitor; and (c) water, the composition capable of removing organic, organometallic and metal oxide residues from semiconductor substrates. In this embodiment, the corrosion inhibitor is selected from the group consisting of choline hydroxide; bischoline hydroxide; trischoline hydroxide; TMAH; TMAH pentahydrate; BTMAH; TBAH and mixtures thereof (Table 11 provides a list of abbreviations associated with various chemical compounds used in the compositions of the invention.) The chelating agent is selected from the group consisting of phosphonic acid, amino tris(methylenephosphonic) acid, citric acid, lactic acid, glycolic acid, tartaric acid, formic acid, glyoxylic acid, acetic acid, propionic acid and mixtures thereof. In another embodiment, 2-(2-aminoethylamino)-ethanol is present in an amount less than about 1.5% by weight. In yet another embodiment, the composition of the invention consists essentially of (a) 2-(2-aminoethylamino)-ethanol; (b) at least one of a chelating agent and a corrosion inhibitor; and (c) water.

In another embodiment, the above composition further comprises an alkanolamine compound other than 2-(2 aminoethylamino)-ethanol. This compound can be selected from the group consisting of DGA; MEA; MMEA; MIPA; DEA; 2-[(2-aminoethyl)-(2-hydroxyethyl)-amino]-ethanol; TEA; N-aminoethyl-N'-hydroxyethyl-ethylenediamine; N,N'-dihydroxyethyl-ethylenediamine; 2-[2-(2-aminoethoxy)-ethylamino]-ethanol; 2-[2-(2-aminoethylamino)-ethoxy]-ethanol; 2-[2-(2-aminoethoxy)-ethoxy]-ethanol; tertiarybutyldiethanolamine; isopropanolamine; diisopropanolamine; NPA; isobutanol amine; 2-(2-aminoethoxy)-propanol; 1-hydroxy-2-aminobenzene, methyldiethanolamine; aminoethylpropanolamine; diethyl ethanolamine; monobutylethanolamine and mixtures thereof.

In another embodiment, the above composition further includes an amine compound that is not an alkanolamine. This compound can be selected from the group consisting of o-diaminobenzene; p-diaminobenzene; N-(2-aminoethyl)-ethylenediamine; piperazine, N-substituted piperazine derivatives, piperidine; N-substituted piperidine derivatives; 2-methyleneaminopropylenediamine; hexamthylene tetramine; EDA; DETA; PMDTA; TETA; tetramethylethylenediamine and mixtures thereof.

In another embodiment, the above composition further includes a surfactant. The surfactant can be selected from the group consisting of epoxy polyamide resin; 3,3,4,4,5,5,6,6,7,7,8,8-tridecafluorooctanesulfonic acid; Ftergent 215M; monoammonium bis(nonafluorobutanesulfonyl)imide; polyoxyethylene(23)lauryl ether and mixtures thereof. Ftergent 215M is a surfactant produced by Neos Chemical Co. of Kobe, Japan.

In another embodiment, the above composition further includes a polar organic solvent. In yet another embodiment, the above composition is substantially free of hydroxylamine.

One embodiment of the invention is directed to a method of removing etching residue from a semiconductor substrate, said method comprising: (a) providing a substrate comprising metal and/or metal alloy portions and/or layers and a surface having organic, organometallic, and/or metal oxide residue thereon, and (b) contacting the substrate with a composition comprising 2-(2-aminoethylamino)-ethanol and water and which composition is substantially free of hydroxylamine, wherein said composition is capable of removing said organic, organometallic, and metal oxide residues, for a time and at a temperature sufficient to remove the residue from the semiconductor substrate. In one aspect of this invention, 2-(2-aminoethylamino)-ethanol is present in an amount less than about 1.5% by weight. In another aspect, the compositions used in this method further comprise at least one of a chelating agent and a corrosion inhibitor.

In another embodiment, the compositions used in the methods of the invention can be further diluted with deionized water at the point of use. The preferred dilution ratio can be up to about 300 to 1.

In another embodiment, the pH of the composition can be further adjusted with acids or bases. The acids and bases can be organic or inorganic.

In another embodiment, the preferred pH of the composition used in the methods of the invention is between about 1.5 and about 12.

In practice, is has been found that use of a two-carbon atom linkage alkanolamine compound gives a residue removing composition that reduces attack on some substrates, e.g., titanium, to a value substantially less than prior cleaning compositions. At the same time, the two-carbon-atom-linkage-alkanolamine-compound-containing composition gives equivalent performance as a residue removing composition.

BRIEF DESCRIPTION OF THE DRAWINGS

FIGS. 1-19 are scanning electron microscope (SEM) photographs showing comparative results achieved using selected embodiments of compositions and processes of the present invention, as described in the examples herein.

DEFINITIONS

Figures 19A, 19B, 19C:
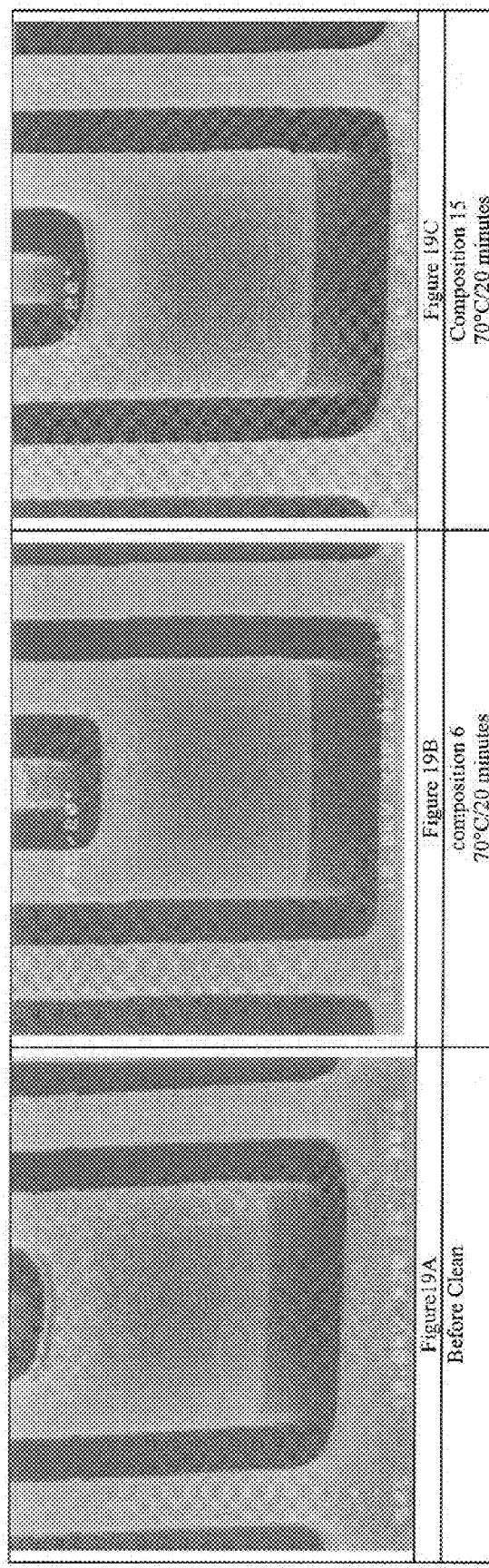

Unless otherwise specified, all percentages expressed herein should be understood to refer to percentages by weight. Also, the term "about," when used in reference to a range of values, should be understood to refer to either value in the range, or to both values in the range.

As used herein, the phrases "contains substantially no" and "is substantially free from," in reference to a composition means: for major components including alkanolamines including AEEA, polar organic solvents including non-hydroxyl-containing amines, water, organic solvents, hydroxylamine and hydroxylamine derivatives, the aforementioned phrases should be understood to mean that the composition contains less than 1.5%, preferably less than about 1% more preferably less than about 0.1%, of the specific element mentioned thereafter; for minor components including chelating agents, corrosion inhibitors, HF and HF salts, surfactants, and the like, the aforementioned phrases should be understood to mean that the composition contains less than 0.2%, preferably less than about 0.1%, most preferably less than about 0.01%, of the specific element mention thereafter; and for trace contaminants such as metal ions, substantially free is defined in the specification, i.e., less than 10 ppm metals and metal ions.

Preferably, when one of the aforementioned phrases is used, the composition is completely free of any added element specifically mentioned thereafter, or at least does not contain the added element in an amount such that the element affects the efficacy, storability, usability regarding necessary safety concerns, or stability of the composition.

Unless otherwise specified, and wherever possible, a compound should generally Dot be characterized under more than one enumerated element of the composition according to the invention. If a compound is capable of being characterized under, for example, two enumerated embodiments of the composition, such a compound may be characterized herein only under either one of the two enumerated elements, but not under both. At times, the distinction may be made based on the content of the compound in the composition. For instance, catechol or gallic acid can act primarily as a corrosion inhibitor at "high" concentrations, i.e. about 0.5% to 20%, or primarily as a metal chelator at "low" concentrations, i.e., in the ppm to 0.5 wt % range.

As used herein, hydroxylamine and hydroxyamine derivatives are not considered organic, despite the organic substituents that may be present on substituted hydroxylamine.

DETAILED DESCRIPTION OF THE PREFERRED EMBODIMENTS

The compositions according to a preferred embodiment of this invention contain AEEA.

In another embodiment of the invention, the compositions according to embodiments of this invention contain a derivative of AEEA, wherein the derivative is obtained by substituting a polar and/or non-polar moiety or moieties onto an AEEA base.

The AEEA and or AEEA derivative can be present in an amount ranging from about 1% to about 99%, though in most instances the amount ranges from about 10% to about 85%. For each AEEA range given for various compositions described herein, there is a "high-AEEA" embodiment where the amount of AEEA is in the upper half of the range, and a "low-AEEA" embodiment where AEEA is present in an amount bounded by the lower half of the range. Generally, the higher AEEA embodiments exhibit lower etch rates than the low AEEA embodiments for selected substrates, especially aluminum and titanium.

In most embodiments, these compositions also include other compounds, particularly polar organic solvents, water, alkanolamines, hydroxylamines, chelating agents, and/or corrosion inhibitors.

A preferred alkanolamine is a two carbon atom linkage alkanolamine. The generic two carbon atom linkage alkanolamine compounds suitable for inclusion in the invention have the structural formula,

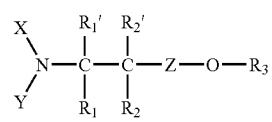

wherein $R_1$, $R_1'$, $R_2$, $R_2'$, and R) are, independently in each case, hydrogen or a linear, branched, or cyclic hydrocarbon containing from 1 to 7 carbon atoms; wherein Z is a group having the formula $-(-Q-CR_1R_1'-CR_2R_2'-)_m-$, such that m is a whole number from 0 to 3 (i.e., when m=0, there is no atom between the $-CR_2R_2'-$ group and the $-OR_3$ group in the formula above), $R_1R_1'$, $R_2$ and $R_2'$ may be independently defined in each repeat unit, if m>1, within the parameters set forth for these moieties above, and Q may be independently defined in each repeat unit, if m>1 each Q being independently either $-O-$ or $-NR_3-$; and wherein X and Y are, independently in each case, hydrogen, a $C_1$-$C_7$, linear, branched, or cyclic hydrocarbon, or a group having the formula $-CR_1R_1'-CR_2$, $R_2'$-Z—F, with F being either $-O-R_3$ or $NR_3R_4$, where $R_4$ is defined similarly to $R_1$, $R_1'-CR_2$, $R_2'-$, and $R_3$ defined as above, or wherein X and Y are linked together form a nitrogen-containing heterocyclic $C_4$-$C_7$ ring.

In a preferred embodiment, the composition contains a two-carbon atom linkage alkanolamine compound, in which m is greater than or equal to 1. In another preferred embodiment, the composition contains a two-carbon atom linkage alkanolamine—compound, in which: m is 1; and $R_1$, $R_1'$, $R_2$, $R_2'$, and $R_3$ are all hydrogen or a $C_1$-$C_4$ linear or branched hydrocarbon. In a more preferred embodiment, the composition contains a two-carbon atom linkage alkanolamine compound, in which: m is 1; $R_1$, $R_1'$, $R_2$, $R_2'$, and $R_3$ are all hydrogen or a $C_1$-$C_4$ linear or branched hydrocarbon; and Q is $-NR_3$ In a most preferred embodiment, the composition contains a two-carbon atom linkage alkanolamine compound, in which: m is 1; $R_1$, $R_1'$-$R_2$, $R_2'$- and $R_3$ are all hydrogen; X and Y are, independently, hydrogen or a linear or branched $C_1$-$C_4$ hydrocarbon; and Q is $-NH-$, $-NCH_3-$, or $-N[(C_2$-$C_4)$ linear or branched hydrocarbon]-.

One problem with prior art cleaning compositions is that the operating temperature was previously near or above the flash point of the composition mixture. For example, in the case of the monoethanolamine-catechol-dimethylacetamide-water compositions, as described in U.S. Pat. No. 5,988,186, the operating temperature was given as approximately 100° C., and in the case of monoethanolamine-catechol hydroxylamine-water compositions described in U.S. Pat. No. 5,419,779, was approximately 90° C. In order to maintain safety, however, the operating temperature is advantageously restricted to about 10-15° C. below the flash point of the composition. The presently described compositions, having relatively high flash points in comparison to prior art compositions, allow more latitude in selecting an operating temperature within a safe range. Additionally, compounds with lower boiling points would be distilled from prior art compositions over time, resulting in off specification cleaners, special make-up solutions, or both.

Many two-carbon atom linkage alkanolamine compounds have relatively low boiling points and relatively low flash points. The two carbon atom linkage alkanolamine compounds useful in the present invention preferably have relatively high boiling points (e.g., 185° C. or above, preferably 200° C. or above, alternately 215° C. or above) and preferably have relatively high flash points (e.g., 95° C. or above, preferably 100° C. or above, alternately 110° C. or above). Preferred specific examples of such two carbon atom linkage alkanolamine compounds include AEEA and 2-(2-aminoethoxy)ethanol ("DGA"). AEEA, or N-hydroxyethyl-ethylenediamine, is the most preferred of the two carbon atom linkage alkanolamine compounds, though it may be admixed with other two carbon atom linkage alkanolamine compounds to achieve a particular result, such as increased etching or lower cost.

In an embodiment, the compositions according to the invention contain AEEA, a derivative of AEEA, or both, though preferably at least AEEA.

AEEA, which has a CAS No. of 111-41-1, describes a molecular compound with the following chemical structure:

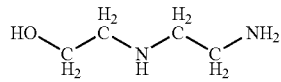

In another preferred embodiment, the composition according to the invention contains a mixture of two or more individual two-carbon atom linkage alkanolamine compounds, which preferably consist essentially of AEEA, at least a second two-carbon atom linkage alkanolamine compound other than AEEA, and optionally a corrosion inhibitor and/or a chelator.

AEEA is a preferred component of the compositions of the present invention, in part because of its physical properties and in part because of its surprising and unexpected low corrosion rates, particular found when admixed into cleaning compositions described herein. AEEA has an advantage over most other alkanolamines disclosed in the prior art, due to its higher boiling point and flash point, as shown by the following data gathered from the Aldrich Chemical Catalog (2001-2002) and the Hawley's Condensed Chemical Dictionary (Twelfth Edition). Higher flash point and/or boiling point allows longer bath life usage, due to lower evaporation rates. Additionally, higher flash point and/or boiling point allows for safer operation at standard working conditions, and also for use of the composition at increasingly elevated temperatures.

| Compound | Boiling Point | Flash Point |
|---|---|---|
| Monoethanolamine (MEA) | 170° C. | 93° C. |
| Isopropanolamine (MIPA) | 160° C. | 73-77° C. |
| 2-amino-1-propanol (propanolamine) | 173-176° C. | 83° C. |
| 2-(2-Aminoethoxy) Ethanol (DGA) | 218-224° C. | 126° C. |
| 2-(2-Aminoethylamino)ethanol (AEEA) | 238-244° C. (@ 752 torr) | 135° C. |

AEEA is also a nucleophilic amine and is a two carbon atom linkage alkanolamine, and AEEA contains two nitrogen molecules that allow it to form more stable complexes with etching residues. EKC Technology has developed numerous formulations that contain alkanolamines such as DGA. We have surprisingly found that the use of AEEA in a weight-far-weight substitution with DGA or other alkanolamines in these solutions can significantly lower the aggressiveness of the resulting formulation towards both titanium and aluminum without adversely affecting its cleaning ability. This allows for either more aggressive process conditions to remove tough residue (e.g., polymer, metal oxide, metal nitride, metal halides, organometallic compounds, etc.) for a given etching task- or lower levels of etching of metal under identical process conditions, or both. A lower aggressiveness t) otherwise sensitive metals widens the available process window (time, temperature) for cleaning. There is also a potential cost advantage involved with the two-nitrogen alkanolamines such as AREA.

It is surprising that AEEA should behave so differently, especially with respect to corrosion of aluminum, titanium, and tungsten, from the teachings and disclosures of the prior art. By doing a series of blanket etch rate experiments, the etch rate data, e.g., for titanium (as a function of component concentration), can, in some cases, be fit to an equation of the form:

$$Ti\ \text{etch rate} = A[\text{Alkanolamine}] + B[\text{Hydroxylamine}] +$$

where A and B are regression coefficients relating to each of the components of the composition. The units can be in weight %, but similar results are found when expressed as molar %, because the molecular weights of AEEA and diglycolamine (DGA) are virtually identical. The etch units can be in Å/min, and the experimental data from which this equation was derived was obtained at a temperature of about 70° C.

In this example, the larger the magnitude of A, the more aggressive towards titanium the alkanolamine is. The regression coefficients obtained empirically for DGA and AEEA (when admixed with hydroxylamine and water) were 0.36 and 0.18, respectively, indicating much gentler behavior towards titanium attack on the part of AEEA, at least as compared to DGA.

This equation is only a linear regression providing a first-order treatment. Such a equation ignores synergy in the chemistry. The first-order treatment is a good approximation to real world situations. Higher order fits start to lose (chemical) meaning.

If measuring an etch rate, having (non-chemically obvious) synergistic interactions between two liquid components and the etched surface, where neither of the components passivates the surface of the substrate, constitutes a situation akin to a "three-body" collision, which is practically very rare. Therefore, the first order formulas for etch rate of substrate;

$$Ti\ \text{etch rate (at 70° C.)} = 0.36\ [\text{Diglycolamine}] + B[\text{Hydroxylamine}]^* \ldots ; \text{and}$$

$$Ti\ \text{etch rate (at 70° C.)} = 0.18\ [AEEA] + B[\text{Hydroxylamine}]^*$$

can be combined, knowing this is a first order regression that ignores synergy and is good for only reasonable composition ranges, to read:

$$Ti\ \text{etch rate (at 70° C.)} = 0.18\ [AEEA]0.36\ [\text{Diglycolamine}] + B[\text{Hydroxylamine}]^*.$$

Surprisingly, data suggests there is synergy between AEEA and DGA when used with HA and water. There is no obvious synergy observed between AEEA and DGA for aluminum.

Therefore, the etch rate of, for example, aluminum, can be expressed as:

Al etch rate=$Y$[AEEA]+$Z$[Diglycolamine]+ $C$[Hydroxylamine]*.

The generation of such equations provides a novel mechanism to thereby allow selection of compounds to give matched etch rates for, e.g., both Al and Ti, or if it is advantageous very different etch rates for Al and Ti. This same process is, of course, amenable for use with other substrates, such as copper, tungsten, alloys, nitrides, dielectrics, and the like. In one embodiment of the invention, a formulation is developed by altering the composition to achieve a non-zero, positive etch rate for a plurality of materials on a surface of a substrate, wherein the etch rates are both low and substantially equal for each of the substrate metals encountered on a semiconductor surface. For example, if a process step results in both Ti or a li-alloy and Al or an Al-alloy, the formulation can be tailored to provide a small etch rate to each compound, wherein the etch rates for each of the selected substrates exposed to the formulation are within, for example, 50% of one another, preferably within 20% of one another. It may be necessary to add a corrosion inhibitor, for example catechol, to achieve similar etch rates for aluminum and titanium.

In another embodiment, the manufacturer may wish to etch only selected substrates, and the formulation can also be adjusted to meet these criteria. One embodiment of this invention shows no etching of titanium and severe etching of aluminum.

Advantageously, the formulations of the present invention can be stable for long periods of time, i.e., for at least 2 or 3 days, when exposed to normal operating or process conditions. By normal operating conditions we mean between about 50 and 100° C., for example between 60 and 75° C. By stable we mean the corrosion characteristics on various metal substrates is relatively unchanging. By stable we mean water can be added to the formulation, but is in some eases not added to the formulation. This requires the boiling points and/or the flash points of the alkanolamines be selected so that the formulation does not substantially change composition during use. High boiling point alkanolamines are, therefore, the preferred component to vary when tailoring the cleaner/ etcher composition to the plurality of substrates.

Examples of other two-carbon atom linkage alkanolamine compounds include, but are in no way limited to, DGA. 2-aminoethanol ("monoethanolamine" or "MEA"), 2-(N-methylamino) ethanol ("monomethyl ethanolamine" or "MMEA"), 2-amino-1-propanol ("monoisopropanolamine" or "MIPA"), 2-(N-hydroxyethyl-amino)-ethanol ("diethanolamine" or "DEA"), 2-[(2-aminoethyl)-(2-hydroxyethyl)-amino]-ethanol ("N,N-bis-hydroxyethyl-ethylenediamine"), N,N,N-tris-(2-hydroxyethyl)-ammonia ("triethanolamine" or "TEA"), N-aminoethyl-N'-hydroxyethyl-ethylenediamine, N,N'-dihydroxyethyl-ethylenediamine, 2-[2-(2-aminoethoxy)-ethylamino)-ethanol, 2-[2-(2-aminoethylamino)-ethoxy]-ethanol, 2-[2-(2-aminoethoxy)-ethoxy]-ethanol, tertiarybutyldiethanolamine, isopropanolamine, diisopropanolamine, 3-amino-1-propanol ("n-propanolamine" or "NPA"), isobutanolamine, 2-(2-aminoethoxy)-propanol; 1-hydroxy-2-aminobenzene; or the like, or any combination thereof.

In one embodiment, the compositions according to the invention optionally contain a chelating agent. In another embodiment, the composition according to the invention contains a single chelating agent, which is preferably EDTA (or a non-metallic salt thereof), gallic acid, or catechol. Catechol has a boiling point of 245° C., and a flash point of 127° C. The corrosion inhibitor can be resorcinol, with a boiling point of 281° C. and a flash point of 127° C. In another embodiment, the composition according to the invention contains a mixture of two chelating agents, preferably catechol and gallic acid. In another embodiment, the composition according to the invention contains a mixture of two chelating agents, preferably catechol and EDTA. In an alternate embodiment, the composition is substantially free from chelating agents.

Examples of chelating agents include, but in no way limited to, mono-, di-, or multi-hydroxybenzene-type compounds, e.g., such as catechol, resorcinal, butylated hydroxytoluene ("BHT"), and the like, or a combination thereof. In one embodiment the chelators include three or more carboxylic acid-containing moieties, e.g., such as ethylenediamine tetraacetic acid ("EDTA"), non-metallic EDTA salts, and the like, or a combination thereof. Compounds containing a two carboxylic acid moieties, such as citric acid, are less preferred. Compounds containing both hydroxyl and carboxylic acid moieties. e.g., such as gallic acid and the like, are useful in one embodiment. Aromatic compounds containing thiol groups e.g., such as thiphenol-amino-carboxylic acids; diamines, e.g., such as ethylene diamine; polyalcohols; polyethylene oxide polyamines; polyimines, or a combination thereof, are useful in one embodiment. In one embodiment, two or more chelating agents can be used in one composition, where the chelating agents are selected from groups described above. Alternately or additionally, some chelating agents are described in U.S. Pat. No. 5,417,877, issued May 23, 1995 to Ward, and in commonly assigned U.S. Pat. No. 5,672,577, issued Sep. 3D, 1997 to Lee, the disclosures of each of which are incorporated herein by reference.

In one embodiment, the compositions according to the invention optionally contain a corrosion inhibitor. In another embodiment, the composition according to the invention contains a single corrosion inhibitor, which is preferably choline hydroxide, bischoline hydroxide, or trischoline hydroxide. In an alternate embodiment, the composition according to the invention is substantially free from corrosion inhibitors.

Examples of corrosion inhibitors include, but are not limited to, nitrate salts of ammonium; hydrocarbon-substituted ammonium nitrate salts; benzotriazole; 2,4-pentandione dioxime; 1,6-dioxaspiro[4,4] nonane 2,7-dione (di-ether); thiourea; ammonium bisulfite; choline bisulfite; choline hydroxide; bischoline hydroxide; trischoline hydroxide; glycerol; sorbitol; gelatine; starch; phosphoric acid; silicic acid; polyethylene oxide; polyethylene imine; and the like; or a combination thereof. Preferably, the corrosion inhibitors are substantially free of metals and/or metal ions.

Catechol can, in one embodiment, act as both a chelating agent and as a corrosion inhibitor.

In one embodiment, the compositions according to the invention optionally contain a salt of hydrofluoric acid and a base that is substantially free from metal ions (hereinafter "HF-base salt:" without intent to limit). Examples of HF-base salts include, but are in no way limited to, ammonium fluoride, diisopropylethylammonium fluoride, ammonium bifluoride, pyridinium fluoride, amine fluorides, and the like, or a combination thereof. In one embodiment, the HF base salt includes diisopropylethylammonium fluoride or ammonium fluoride. Such compositions advantageously include AEEA, a corrosion inhibitor, and optionally a polar organic solvent. Most formulation described herein are preferably free of fluoride ions, however, so, in an alternate embodiment, the composition according to the invention is substantially free from HE-base salts.

In one preferred embodiment, the compositions according to the invention also contain hydroxylamine or a derivative thereof, which satisfies the general formula.

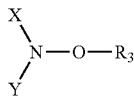

wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen-containing heterocyclic $C_4$-$C_7$ ring.

Examples of derivatives of hydroxylamine according to the invention include, but are in no way limited to, hydroxylamine, N-methyl-hydroxylamine, N,N-dimethyl-hydroxylamine, N-ethyl-hydroxylamine, N,N-diethyl-hydroxylamine, methoxylamine, ethoxylamine, N-methylmethoxylamine, and the like. As used herein, hydroxylamine is not an organic, and the boiling point and flash point of hydroxylamine and hydroxylamine derivatives is of no consequence to the formulation. It should be understood that hydroxylamine and its derivatives, as defined above, are available (and may be included in a composition according to the invention) as salts, e.g., sulfate salts, nitrate salts, or the like, or a combination thereof; and the invention includes these forms of hydroxylamine compounds and their derivatives. These salts greatly increase the theoretical flash point of hydroxylamine derivatives. Therefore, in another embodiment, the composition contains hydroxylamine, a sulfate or nitrate salt of hydroxylamine, or a combination thereof. Hydroxylamines are not desired in a subset of the formulations described herein. Therefore, in some embodiments, the composition according to the invention is substantially free from hydroxylamine and/or derivatives thereof.

In one embodiment, the composition according to the invention optionally contains water. Water is preferred in a majority of residue removing compositions. Additionally, HA is commercially available in an aqueous, i.e., a 50% aqueous, solution. Hydroxylamine derivatives are typically available in more concentrated aqueous forms, for example 85% solutions with 15% water. However, hydroxylamine and/or hydroxylamine derivatives can be obtained or manufactured in some instances and in some concentrations, in a water-free formulation. As described above, in an alternate embodiment, the composition according to the invention is substantially free from water.

In one embodiment, the composition according to the invention optionally contains a polar organic solvent. Examples of polar organic solvents for the composition according to the invention include, but are in no way limited to, dimethyl sulfoxide, ethylene glycol, ethylene glycol alkyl ether, diethylene glycol alkyl ether, triethylene glycol alkyl ether, propylene glycol, propylene glycol alkyl ether, dimethyl sulfoxide, N-substituted pyrrolidone such as N-methyl-2-pyrrolidone (NMP), sulfolanes, dimethylacetamide, and the like, or any combination thereof. Dimethylsulfone, CAS No. 126-33-0, with a boiling point of 237° C., is preferred in some embodiments of the invention. NMP, with a boiling point of 199-202° C. and a flash point of only 96° C., may be useful in some embodiments because of low cost. NMP does, however, tend to lower the flash point of mixtures of the present invention. Similarly, DMSO, with a boiling point of 189° C. and a flash point of only 95° C., is less preferred in some embodiments of the invention. 2,4-dimethylsulfolane, with a boiling point of 280° C. and a flash point of 143° C., is preferred in some embodiments of the invention. Care must be taken because, in the absence of alkanolamines and the like, 2,4-dimethylsulfolane is only slightly miscible with water.

According to the present invention, amines, particularly alkanolamines and also particularly low molecular weight amines, are separate from, and are not classified as, a polar organic solvent. Other additional polar organic solvents as known in the art, other than those specifically excluded, can also be used in the composition of the present.

In another embodiment, the composition according to the invention contains a two-carbon atom linkage alkanolamine AEEA compound in at amount from about 0.1% to about 50%, alternately from about 1% to about 45%, from about 2% to about 40%, from about 5% to about 35%, or from about 10% to about 35%. In yet another embodiment, the composition according to the invention contains a two-carbon atom linkage alkanolamine AEEA compound in an amount from about 50% to about 99.9% alternately from about 51% to about 99%, from about 55% to about 98%, from about 51% to about 90%, or from about 50% to about 85%.

In one embodiment the composition of the present invention consists essentially of AEEA and water. In another embodiment the composition of the present invention consists essentially of AEEA, water, and a chelating agent. In another embodiment the composition of the present invention consists essentially of AEEA, water, and a corrosion inhibitor. In yet another embodiment the composition of the present invention consists essentially of AEEA, water, a chelating agent, and a corrosion inhibitor which is different from the chelating agent. Preferably in this last embodiment, the corrosion inhibitor and chelator are selected such that neither primarily persons both functions.

In one embodiment the composition of the present invention consists essentially of AEEA, a second two carbon atom linkage alkanolamine, and water. In another embodiment the composition of the present invention consists essentially of AEEA, a second two carbon atom linkage alkanolamine, water, and a chelating agent. In another embodiment the composition of the present invention consists essentially of AEEA, a second two carbon atom linkage alkanolamine, water, and a corrosion inhibitor. In yet another embodiment the composition of the present invention consists essentially of AEEA, a second two carbon atom linkage alkanolamine, water, a chelating agent, and a corrosion inhibitor which is different from the chelating agent. Preferably, in this last embodiment, the corrosion inhibitor and chelator are selected such that neither primarily performs both functions.

When one or more two-carbon atom linkage alkanolamine compounds other than ABEA are included in the composition according to the invention, they can advantageously be present in an amount such that the ratio between the AEEA and other two-carbon atom linkage alkanolamine compound (hereinafter "AEEA:alkanolamine ratio," without any intent to limit) is from about 20:1 to about 1:20. In one embodiment, the AEEA:alkanolamine ratio is from about 15:1 to about 11, alternately from about 10:1 to about 1.5:1, for example, from about 4:1 to about 2:1.

In another embodiment, the AEEA:alkanolamine ratio is from about 1:1 to about 1:15, alternately from about 1:1.5 to about 1:10, for example, from about 1:4 to about 1:2.

In another embodiment of the invention, the AEEA:alkanolamine ratio is pre-selected to provide a desired rate of etching of a particular metal or metals and/or metal alloy or alloys layer, or portion thereof, on a particular substrate or substrates.

When present, the amount of chelating agent in the composition according to the invention can advantageously be from about 0.01% to about 15%, preferably from about 0.1% to about 10%, for example, from about 2% to about 5%, or alternately from about 0.01% to about 0.1%.

When present, the amount of corrosion inhibitor in the composition according to the invention can advantageously be from about 0.1% to about 10%, preferably from about 1% to about 5%.

When present, the amount of HF-base salt in the composition according to the invention can advantageously be from about 0.01% to about 20%, for example, from about 0.1% to about 5%, or alternately from about 1% to about 10%. Advantageously, a composition containing IF-base salt and AEEA is preferably substantially free from polar organic solvent, and may optionally contain one or more of the following: one or more additional two-carbon atom linkage alkanolamine compounds; one or more chelating agents or corrosion inhibitors; or water.

When present, the amount of hydroxylamine and/or derivatives thereof in the composition according to the invention can advantageously be from about 0.1% to about 50%, preferably from about 1% to about 25%, more preferably from about 5% to about 20%, alternately from about 1% to about 10% or from about 10% to about 20%.

When present, the amount of water in the composition according to the invention can advantageously be from about 1% to about 50%, preferably from about 2% to about 45%, more preferably from about 5% to about 40%, alternately from about 15% to about 35%.

When present, the amount of polar organic solvent in the composition according to the invention can advantageously be from about 1% to about 75%, for example from about 5% to about 50%, or alternately from about 0.1% to about 45%, for example from about 2% to about 30%.

In another embodiment, the composition may contain at least about 10% by weight, preferably from about 10% to about 80%, of at least one two carbon atom linkage alkanolamine compound, from about 5% to about 40% by weight, preferably from about 5% to about 30%, of gallic acid, catechol or other chelating agent, and optionally, up to about 50 percent by weight, but preferably from about 10% to about 30%, of a 50% by weight aqueous hydroxylamine solution. In this embodiment, the balance of the composition can compose water, preferably high purity deionized water, or a suitable polar organic solvent or mixture thereof. In one embodiment this composition is substantially free or water, polar organic solvents, or both.

In practice, it appears that, when present, the chelating agent (particularly in the form of catechol or gallic acid) enhances the ability of the two carbon atom linkage alkanolamine compound to remove the residue. At the same time, when present, the catechol, gallic acid, or chelating agent can help to prevent attack on the metal or metal alloy substrate, e.g., titanium.

In one embodiment, the present invention relates to a composition which is capable of removing organic, organometallic, and/or metal oxide residues from substrates comprising metal and/or metal alloy portions and/or layers, wherein the composition contains 2-(2-aminoethylamino)-ethanol and water. Advantageously, this composition can be substantially free from one or more of the following: polar organic solvents; organic solvents; surfactants; chelating agents and/or corrosion inhibitors; non-hydroxyl-containing amines; a salt of hydrofluoric acid and a base that is substantially free from metal ions; or hydroxylamine and/or hydroxylamine derivatives, having the structural formula:

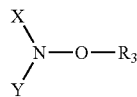

wherein $R_3$ is hydrogen or a linear, branched, or cyclic hydrocarbon containing from 1 to 7 carbon atoms, and wherein X and Y are, independently, hydrogen or a linear, branched, or cyclic hydrocarbon containing from 1 to 7 carbon atoms, or wherein X and Y are linked together form a nitrogen-containing heterocyclic $C_4$-$C_7$ ring.

It is known that aqueous amines corrode metal, for example when washing off cleaning compositions. Surprisingly, it has been discovered that a composition consisting essentially of AEEA and water removes residue and does not promote corrosion of Ti or Al. Advantageously, such a composition has greater than about 60% AEEA, more preferably greater than about 70% AEEA, and even more preferably greater than about 80% AEEA. In one embodiment, a composition containing about 85 to about 95% AEEA can both remove residue and not promote corrosion even when washed off with water. It is believed that a composition consisting essentially of AEEA can be used to remove residue, especially from substrate surfaces comprising Ti, Al, Cu, W, or mixtures or alloys thereof.

In one embodiment, the above described compositions further comprise a chelating agent and/or a corrosion inhibitor. In one embodiment, the above described compositions further comprise a salt of hydrofluoric acid and a base that is substantially free from metal ions, and optionally a chelating agent and/or a corrosion inhibitor. In another embodiment, any of the above described compositions further comprise a second chelating agent and or a corrosion inhibitor.

In one embodiment, the present invention relates to a composition which is capable of removing organic, organometallic, and/or metal oxide residues from substrates comprising metal and/or metal alloy portions and/or layers, wherein the composition contains 2-(2-aminoethylamino)-ethanol, water, and hydroxylamine and/or a hydroxylamine derivative, having the structural formula:

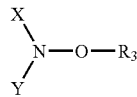

wherein $R_3$ is hydrogen or a linear, branched; or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen-containing heterocyclic $C_4$-$C_7$ ring.

Advantageously, $R_3$ can be hydrogen and X and Y can be, independently, hydrogen or a linear hydrocarbon containing from 1 to 3 carbon atoms. Advantageously, the above described compositions can also be substantially free from one or more of the following: polar organic solvent; organic solvent; surfactants; chelating agents and/or corrosion inhibitors; non-hydroxyl-containing amines; or a salt of hydrofluoric acid and a base that is substantially free from metal ions.

In one embodiment, the present invention relates to a composition which is capable of removing organic, organometallic, and/or metal oxide residues from substrates comprising metal and/or metal alloy portions and/or layers, wherein the composition contains: 2-(2-aminoethylamino)-ethanol; a two carbon atom linkage alkanolamine compound other than 2-(2 aminoethylamino)-ethanol, having the structural formula:

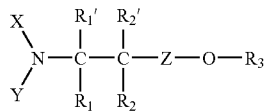

wherein $R_1$, $R_1'$, $R_2$, $R_2'$, and $R_3$ are independently in each case, hydrogen or a linear, branched, or cyclic hydrocarbon containing from 1 to 7 carbon atoms; wherein Z is a group having the formula $-(-Q-CR_1-R_1'-CR_2-R_2')$ such that in is a whole number from 0 to 3 (i.e., when m=O. there is no atom between the $-CR_2, R_2'-$ group and the $-OR_3$ group in the formula above $CR_1$, $R_1'$, $R_2$, and $R_2'$ may be independently defined in each repeat unit if m=1, within the parameters set forth for these moieties above, and Q may be independently defined in each repeat unit, if m>1, each Q being independently either -0- or $NR_3-$; and wherein X and Y are, independently in each case, hydrogen, a $C_1$-$C_7$ linear, branched, or cyclic hydrocarbon, or a group having the formula $-CR_1R_1'-CR_2R_2'-Z-F$, with F being either $-O-R_3$, or $-NR_3R_4$, where $R_4$ is defined similarly to $R_1$, $R_1'$, $R_2$, $R_2'$ and $R_3$ above, and with Z, $R_1$, $R_1'$, $R_2$, $R_2'$ and $R_1$ defined as above, or wherein X and Y are linked together form a nitrogen-containing heterocyclic $C_4$-$C_7$ ring; and hydroxylamine and/or a hydroxylamine derivative, having the structural formula:

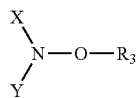

wherein $R_3$ is hydrogen or a linear, branched, or cyclic hydrocarbon containing from 1 to 7 carbon atoms; and wherein X and Y are, independently hydrogen or a linear, branched, or cyclic hydrocarbon containing from 1 to 7 carbon atoms, or wherein X and Y are linked together form a nitrogen-containing heterocyclic $C_4$-$C_7$, ring. Advantageously, R) can be hydrogen and X and Y can be, independently, hydrogen or a linear hydrocarbon containing from 1 to 3 carbon atoms.

In a preferred embodiment, the two carbon atom linkage alkanolamine 25 compound other than 2-(2-aminoethylamino)-ethanol has a flash point greater than about 100° C., preferably greater than 130° C., and/or a boiling point greater than about 200° C., preferably greater than 220° C., and is present in an amount less than about 35% by weight of the composition.

Advantageously, the above compositions may be substantially free from one 30 or more of the following: polar organic solvent; organic solvent; surfactants; chelating agents and/or corrosion inhibitors; non-hydroxyl-containing amines; and a salt of hydrofluoric acid and a base that is substantially free from metal ions. In another embodiment of the above compositions, the weight ratio of AEEA to the two carbon atom linkage alkanolamine compound other than AEEA is more than about 1:1.

In one embodiment, the present invention relates to a composition which is capable of removing organic, organometallic, and/or metal oxide residues from substrates comprising metal and/or metal alloy portions and/or layers, wherein the composition consists essentially of: 2-(2-aminoethylamino)-ethanol; a two carbon atom linkage alkanolamine compound other than 2-(2-aminoethylamino)-ethanol, having a boiling point greater than about 200° C., having a flash point of greater than about 100° C., preferably 120° C., and having the structural formula,

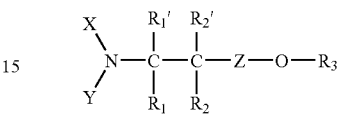

wherein $R_1$, $R_1'$, $R_2$, $R_2'$ and $R_3$ are, independently in each case, hydrogen or a linear, branched, or cyclic hydrocarbon containing from 1 to 7 carbon atoms; wherein Z is a group having the formula $-(-Q-CR_1R_1'-CR_2R_2'-)_m$, such that m is a whole number from 0 to 3 (i.e., when m=0, there is no atom between the $-CR_2R_2'-$ group and the $-OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either $-O-$ or $-NR_3-$; and wherein X and Y are, independently in each case, hydrogen, a $C_1$-$C_7$ linear, branched, or cyclic hydrocarbon, or a group having the formula $-CR_1R_1'-CR_2R_2'-Z-F$, with F being either $-O-R_3$ or $-NR_3R_4$, where $R_4$ is defined similarly to $R_1$, $R_1'$, $R_2$, $R_2'$ and $R_3$ above, and with Z, $R_1$, $R_1'$, $R_2$, $R_2'$ and $R_3$ defined as above, or wherein X and Y are linked together form a nitrogen-containing heterocyclic $C_4$-$C_7$ ring; and hydroxylamine and/or a hydroxylamine derivative, having the structural formula:

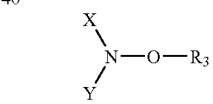

wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen-containing heterocyclic $C_4$-$C_7$ ring.

In another preferred embodiment, the present invention relates to a composition which is capable of removing organic, organometallic, and/or metal oxide residues from substrates comprising metal and/or metal alloy portions and/or layers, wherein the composition consists essentially of: 2-(2-aminoethylamino)-ethanol; a first two carbon atom linkage alkanolamine compound other than 2-(2-aminoethylamino)-ethanol, having the structural formula,

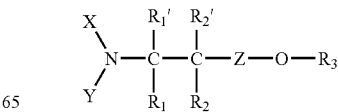

wherein $R_1$, $R_1'$, $R_2$, $R_2'$ and $R_3$ are independently in each case, hydrogen or a linear, branched, or cyclic hydrocarbon containing from 1 to 7 carbon atoms; wherein Z is a group having the formula $-(-Q-CR_1R_1'-CR_2R_2'-)_m-$, such that m is a whole number from 0 to 3 (i.e., when m=0, there is no atom between the $-CR_2R_2'-$ group and the $-OR_3$ group in the formula above), $R_1$, $R_1'$, $R_2$, and $R_2$ may be independently defined in each repeat unit, if m>1, within the parameters set forth for these moieties above, and Q may be independently defined in each repeat unit, if m>1, each Q being independently either $-O-$ or $-NR_3-$; and wherein X and Y are, independently in each case, hydrogen, a $C_1$-$C_7$ linear, branched, or cyclic hydrocarbon, or a group having the formula $-CR_1$, $R_1'-CR_2$ $R_2'$-Z—F, with F being either $-O-R_3$ or $-NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$-$C_7$, ring; a second two carbon atom linkage alkanolamine compound other than 2-(2-aminoethylamino)-ethanol and the first two carbon atom linkage alkanolamine compound, the second two carbon atom linkage alkanolamine compound having the aforementioned structural formula; and hydroxylamine and/or a hydroxylamine derivative, having the structural formula:

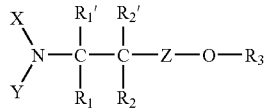

wherein $R_3$ is hydrogen or a linear, branched, or cyclic hydrocarbon containing from 1 to 7 carbon atoms; and wherein X and Y are independently, hydrogen or a linear, branched, or cyclic hydrocarbon containing from 1 to 7 carbon atoms, or wherein X and Y are linked together form a nitrogen-containing heterocyclic $C_4$-$C_7$ ring. Preferably, each of the two carbon atom linkage alkanolamine compounds has a boiling point greater than about 190° C., preferably greater than about 200° C., more preferably greater than about 225° C., and a flash point of greater than about 95° C., preferably greater than about 100° C., more preferably greater than about 130° C.

In one embodiment, the present invention relates to a composition which is capable of removing organic, organometallic, and/or metal oxide residues from substrates comprising metal and, or metal alloy portions and/or layers, wherein the composition consists essentially of 2-(9-aminoethylamino)-ethanol. water, and hydroxylamine and/or a hydroxylamine derivative, having the structural formula:

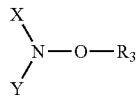

wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen-containing heterocyclic $C_4$-$C_7$, ring. In a preferred embodiment, the present invention relates to a composition which is capable of removing organic, organometallic, and/or metal oxide residues from substrates comprising metal and/or metal alloy portions and/or layers, wherein the composition consists essentially of 2-(2-aminoethylamino)-ethanol, water, and hydroxylamine. In another embodiment, the present invention relates to a composition which is capable of removing organic, organometallic, and/or metal oxide residues from substrates comprising metal and/or metal alloy portions and/or layers, wherein the composition consists essentially of 2-(2-aminoethylamino)-ethanol, water, hydroxylamine, and a corrosion inhibitor, for example catechol.

In one embodiment, the present invention relates to a composition which is capable of removing organic, organometallic, and/or metal oxide residues from substrates comprising metal and/or metal alloy portions and/or layers, wherein the composition includes 2-(2-aminoethylamino)-ethanol, less than about 50% by weight of a polar organic solvent, gallic acid, and optionally a two carbon atom linkage alkanolamine compound other than 2-(2-aminoethylamino)-ethanol, having the structural formula,

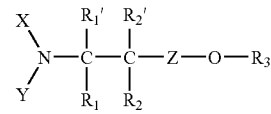

wherein $R_1$, $R_1'$ $R_2$, $R_2'$, and $R_3$ are, independently in each case, hydrogen or a linear, branched, or cyclic hydrocarbon containing from 1 to 7 carbon atoms; wherein Z is a group having the formula $-(-Q-CR_1R_1'-CR_2R_2'-)_m-$, such that m is a whole number from 0 to 3 (i.e., when m=0, there is no atom between the $-CR_2R_2'-$ group and the $-OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either $-O-$ or $-NR_3-$; and wherein X and Y are, independently in each case, hydrogen a $C_1$-$C_7$ linear, branched, or cyclic hydrocarbon, or a group having the formula $-CR_1$, $R_1'$, $CR_2$, $R_2'$-Z—F, with F being either $-O-R$, or $-NR_3R_4$, where n is defined similarly to $R_1$, $R_1'$, $R_2$, $R_2^9$, and $R_3$ above, and with X, $R_1$, $R_1'$, $R_2$, $R_2'$, and $R_3$ defined as above, or wherein X and Y are linked together form a nitrogen-containing heterocyclic $C_4$-$C_7$ ring. Preferably, each of the two carbon atom linkage alkanolamine compounds has a boiling point greater than about 190° C., preferably 220° C., and a flash point of greater than about 95° C., preferably greater than about 120° C. In another embodiment, the two carbon atom linkage alkanolamine compound other than 2-(2-aminoethyliamino)-ethanol has a flash point greater than about 100° C. and/or a boiling point greater than about 200° C., and is present in an amount less than about 10% by weight of the composition.

The above described compound may also optionally contain water and hydroxylamine and/or a hydroxylamine derivative, having the structural formula:

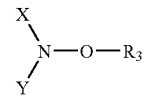

wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein N and Y are linked together form a nitrogen-containing heterocyclic $C_4$-$C_7$ ring.

The above described compound may also optionally contain a non-hydroxyl-containing amine compound. However, in many embodiments the compositions are substantially free of such amines.

Advantageously, the above compositions may be substantially free fromn one or more of the following: non-polar organic solvent; surfactants; non-hydroxyl-containing amines; a salt of hydrofluoric acid and a base that is substantially free from metal ions; water; and hydroxylamine and/or a hydroxylamine derivative, as defined above. The elimination of selected compounds results in cleaning and etching performance that is predictable to one of skill in the art when viewing this disclosure and the documents incorporated herein by reference.

In one embodiment, the present invention relates to a composition which is capable of removing organic. organometallic, and/or metal oxide residues from substrates comprising metal and/or metal alloy portions and/or layers, wherein the composition includes 2-(2 aminoethylamino)-ethanol, less than about 50% by weight of a polar organic solvent, a dihydroxybenzene compound (e.g., including catechol), and optionally a two carbon atom linkage alkanolamine compound other than 2-(2-aminoethylamino)-ethanol, having the structural formula,

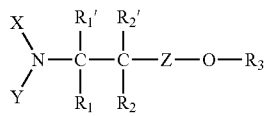

wherein $R_1$, $R_1'$, $R_2$, $R_2'$, and $R_3$ are, independently in each case, hydrogen or a linear, branched, or cyclic hydrocarbon containing from 1 to 7 carbon atoms; wherein Z is a group having the formula -(-Q-$CR_1R_1'$—$CR_2R_2'$—)$_m$— such that m is a whole number from 0 to 3 (i.e., when m=0, there is no atom between the —$CR_2R_2'$— group and the —$OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either —O— or —$NR_3$—; and wherein X and Y are, independently in each case, hydrogen, a $C_1$-$C_7$ linear, branched, or cyclic hydrocarbon, or a group having the formula —$CR_1R_1'$—$CR_2R_2'$-Z—F, with F being either —O—$R_3$ or —$NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$-$C_7$ ring. Preferably, each of the two carbon atom linkage alkanolamine compounds has a boiling point greater than about 190° C. and a flash point of greater than about 95° C. In another embodiment, the two carbon atom linkage alkanolamine compound other than 2-(2-aminoethylamino)-ethanol has a flash point greater than about 100° C. and/or a boiling point greater than about 200° C., and is present in an amount less than about 10% by weight of the composition.

The above described compound may also optionally contain water and hydroxylamine and/or a hydroxylamine derivative. having the structural formula:

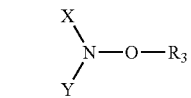

wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together for a nitrogen-containing hetrocyclic $C_4$-$C_7$ ring.

The above described compound may also optionally contain a non-hydroxyl-containing amine compound.

Advantageously, the above compositions may be substantially free from one or more of the following: non-polar organic solvent; surfactants; non-hydroxyl-containing amines; a salt of hydrofluoric acid and a base that is substantially free from metal ions; water; and hydroxylamine and/or a hydroxylamine derivative, as defined above.

In one embodiment, the present invention relates to a composition which is capable of removing organic, organometallic, and/or metal oxide residues from substrates comprising metal and/or metal alloy portions and/or layers, wherein the composition includes 2-(2-aminoethylamino)-ethanol, 2-(2-aminoethylamino)-ethylamine, and optionally a two carbon atom linkage alkanolamine compound other than 2-(2-aminoethylamino)-ethanol, having the structural formula,

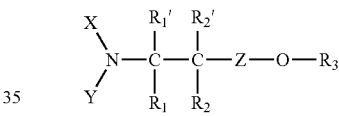

wherein $R_1$, $R_1'$, $R_2$, $R_2'$, and $R_3$ are, independently in each case, hydrogen or a linear, branched, or cyclic hydrocarbon containing from 1 to 7 carbon atoms; wherein Z is a group having the formula -(-Q-$CR_1R_1'$—$CR_2R_2'$—)$_m$—, such that m is a whole number from 0 to 3 (i.e., when m=0, there is no atom between the —$CR_2$ $R_2'$ group and the —$OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either —O— or —$NR_3$—; and wherein X and Y are, independently in each case, hydrogen, a $C_1$-$C_7$ linear, branched, or cyclic hydrocarbon, or a group having the formula —$CR_1R_1'$—$CR_2$, $R_2'$,-Z—F, with F being either —O—R, or —$NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$-$C_7$ ring. Preferably, each of the two carbon atom linkage alkanolamine compounds has a boiling point greater than about 190° C., for example greater than about 220° C., and a flash point of greater than about 95° C., more preferably greater than about 125° C. In another embodiment, the two carbon atom linkage alkanolamine compound other than 2-(2-aminoethylamino)-ethanol has a flash point greater than about 130° C. and/or a boiling point greater than about 230° C., and is present in an amount less than about 40% by weight of the composition.

The above described compound may also optionally contain water and hydroxylamine and/or a hydroxylamine derivative, having the structural formula:

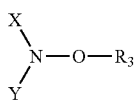

wherein $R_3$ is hydrogen or a linear, branched, or cyclic hydrocarbon containing from 1 to 7 carbon atoms; and wherein X and Y are, independently, hydrogen or a linear, branched. or cyclic hydrocarbon containing from 1 to 7 carbon atoms, or wherein X and Y are linked together form a nitrogen-containing heterocyclic $C_4$-$C_7$ ring. The above described compound may also optionally contain a chelating agent and/or a corrosion inhibitor.

The above described compound may also optionally contain another non-hydroxyl-containing amine compound, other than 2-(2-aminoethylamino)-ethylamine which is already present).

Advantageously, the above compositions may be substantially free from one or more of the following: non-polar organic solvent; surfactants; a salt of hydrofluoric acid and a base that is substantially free from metal ions; water; and hydroxylamine and/or a hydroxylamine derivative, as defined above.

In one embodiment, the present invention relates to a composition which is capable of removing organic, organometallic, and/or metal oxide residues from substrates comprising metal and/or metal alloy portions and/or layers, wherein the composition includes 2-(2-aminoethylamino)-ethanol. from about 25% to about 75% by weight of a polar organic solvent, from about 13% to about 50% by weight of ethylenediaminete-tetraacetic acid or an mono-, di-, trio, or tetra-ammonium salt thereof, optionally from about 0.151% to about 10% by weight of an ammonium salt (e.g., tartrate, citrate, formate, glucanate, nitrate, thiosulfate, persulfate, bicarbonate, phosphate. fluoride, and the like, or a combination thereof), optionally from about 5% to about 75% water, and optionally a two carbon atom linkage alkanolamine compound other than 2-(2-aminoethylamino)-ethanol, having the structural formula,

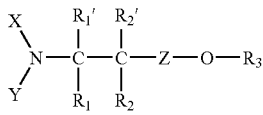

wherein $R_1$, $R_1'$, $R_2$, $R_2'$, and $R_3$ are, independently in each case, hydrogen or a linear, branched, or cyclic hydrocarbon containing from 1 to 7 carbon atoms; wherein Z is a group having the formula -(-Q-$CR_1R_1'$—$CR_2R_2'$—$)_m$—: such that m is a whole number from 0 to 3 (i.e., when m=0, there is no atom between the —$CR_2R_2'$— group and the —$OR_3$ group in the formula above), $R_1$, $R_1'$, $R_2$, and $R_2'$ may be independently defined in each repeat unit, if m>1, within the parameters set forth for these moieties above, and Q may be independently defined in each repeat unit, if m>1, each Q being independently either —O— or —$NR_3$—; and wherein X and Y are, independently in each case, hydrogen, a $C_1$-$C_7$ linear, branched, or cyclic hydrocarbon, or a group having the formula —$CR_1R_1'$—$CR_2R_2'$-Z—F, with F being either —O—$R_3$ or —$NR_3R_4$, where $R_4$ is defined similarly to $R_1$, $R_1'$, $R_2$, $R_2'$, and $R_3$ above, and with Z, $R_1$, $R_1'$, $R_2$, $R_2'$, and $R_3$ defined as above, or wherein X and Y are linked together form a nitrogen-containing heterocyclic $C_4$-$C_7$, ring. Preferably, each of the two carbon atom linkage alkanolamine compounds has a boiling point greater than about 190° C., preferably greater than about 220° C., and a flash point of greater than about 95° C., preferably greater than about 120° C. In another embodiment, the two carbon atom linkage alkanolamine compound other than 2-(2-aminoethylamino)-ethanol has a flash point greater than about 130° C. and/or a boiling point greater than about 230° C., and is present in al amount less than about 10% by weight of the composition.

The above described compound may also optionally contain water and hydroxylamine and/or a hydroxylamine derivative, having the structural formula:

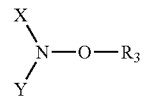

wherein $R_3$ is hydrogen or a linear, branched, or cyclic hydrocarbon containing from 1 to 7 carbon atoms; and wherein X and Y are, independently, hydrogen or a linear, branched, or cyclic hydrocarbon containing from 1 to 7 carbon atoms, or wherein X and Y are linked together form a nitrogen containing heterocylic $C_4$-$C_7$ ring.

The above described compound may also optionally contain a non-hydroxyl-containing amine compound.

Advantageously, the above compositions may be substantially free from one or more of the following: non-polar organic solvent; surfactants; non-hydroxyl-containing amines; a salt of hydrofluoric acid and a base that is substantially free from metal ions, other than ammonium fluoride (which is already present); water; and hydroxylamine and/or a hydroxylamine derivative, as defined above.

In one embodiment, the present invention relates to a composition which is capable of removing organic, organometallic, and/or metal oxide residues from substrates comprising metal and/or metal alloy portions and/or layers, wherein the composition includes 2-(2-aminoethylamino)-ethanol, from about 2% to about 80% by weight of a polar organic solvent (e.g., dimethylacetamide), from about 0.1% to about 3% by weight of ammonium fluoride, and optionally from about 2% to about 85% water.

Preferably, all of the compositions according to the invention have very low metal impurity/ion contents, i.e., less than about 10 ppm total. In a preferred embodiment, the compositions according to the invention have less than about 5 ppm total metal content, preferably not more than about 1 ppm total metal impurity and metal ion content.

The residue cleaning compositions of the present composition are effective in removing organometallic and selected metal oxide residue from a variety of integrated circuit constructs on substrates, e.g.: silicon; SiGe; Group III-V compounds, such as GaAs, Group II-VI compounds, such as TeS; magnetic materials, such as NiFe; glasses, such as used, for example in flat panel displays; or any combination thereof, especially those substrates including: metal and/or metal alloy layers, optionally with via holes features for interconnects such as layers containing aluminum, titanium, copper, and/or tungsten; oxide layers, such as silicon oxides; nitride layers, such as silicon nitride; and the like; or any combination thereof. The cleaning compositions of the present invention are also effective in removing organometallic and metal oxide residue generated on the substrate of etching equipment utilized in the fabrication of integrated circuits. Examples of commercially available etching equipment include that available from Lam Research. Tegal, Electrotech, Applied Materials, Tokyo Electron, Hitachi, and the like.

Another aspect of the invention relates to a method of cleaning a substrate using the compositions of the present invention, which method involves contacting a substrate having organometallic and/or metal oxide residue thereon with a stripping and cleaning composition for a time and at a temperature sufficient to remove the residue. In one preferred embodiment, the residue is removed with no observable etching to the substrate, that is, with etch rates less than about 1 angstrom per minute of immersion at the operating conditions.

In one embodiment, the substrate can be immersed in the composition according to the invention. In some cases, when a production line progress is temporarily interrupted, those substrates exposed to the residue removers of the present invention with the resultant very low etch rates can be salvaged, while those substrates immersed in more aggressive formulations are destroyed.

In an alternate embodiment, the composition according to the invention can be applied to a surface of the substrate, e.g., by spraying on, applying droplets, coating, overcoating (with the excess composition running off the substrate), or the like, or a combination thereof. The low flash point and vapor pressure of the preferred compositions of this invention allow this type of application without resulting in unacceptable evaporation and vapors.

In either embodiment, the time and temperature of the contact between the composition and the substrate layer(s) can be determined based on the particular material being removed from a substrate. Generally, the useful temperature is in the range of from about ambient or room temperature to about 100° C. and the contact time is typically from about 2 to about 60 minutes. However, the temperature range may expand to higher temperatures, especially when the flash point of the two-carbon atom linkage alkanolamine compound(s} are relatively high, as is the case when AEEA and/or DGA are included in the composition according to the invention.

In some embodiments the flash point of a formulation is above the flash point of the component in the formulation with the lowest flash point. particularly if that component is freely miscible and is present in a minor quantity. It is possible to use selected compositions of this invention at temperatures between about 101° C. and about 160° C., for example between about 115° C. and about 150° C. alternatively from about 115° C. to about 135° C. These higher temperatures can be used at atmospheric pressure and, of course, at superatmospheric pressure. The composition allow use of the higher temperatures from a technical standpoint and also allow use of the compositions from a regulatory standpoint. Regulations generally become more stringent as operating temperatures approach a predetermined fraction of the flash point.

The component with a boiling point below 150° C. in selected preferred compositions, and which is also the component which is most volatile at operating temperatures, is water. Water can be easily replenished to the solution, and water does not present a safety hazard.

The components with a boiling point below 150° C. in other selected preferred compositions, which are most volatile at operating temperatures, are hydroxylamine and water. Water and hydroxylamine can be easily replenished to the solution, and this replenishing solution does not present a significant fire hazard.

Especially in cases where one or more components (e.g., such as water solvent, a two-carbon atom linkage alkanolamine compound, or the like), or a portion thereof (e.g., such as the base of the HF-base salt or the like), of the compositions according to the invention evaporates (and/or degrades) significantly after prolonged exposure to operating conditions, a replenishing solution may be combined with the original composition according to the invention to at least partially replenish the evaporated (and/or degraded) component(s) (and/or portion(s)) of the original composition.

In a preferred embodiment where the original composition contains water, the replenishing composition contains water. In another preferred embodiment where the original composition contains polar organic solvent, the replenishing composition can contain polar organic solvent. The replenishing compositions according to the invention may optionally also contain, as necessary and where the original composition contained one or more of these components (or a portion thereof), at least one of the following; AEEA, at least one other two-carbon atom linkage alkanolamine compound, a base of the HF-base salt, a chelating agent and/or a corrosion inhibitor, hydroxylamine or a hydroxylamine derivative, a surfactant, a non-hydroxyl-containing amine compound, and any combination thereof.

Advantageously, the replenishing solutions of many embodiments of the present invention contain only water and optionally hydroxylamine or hydroxylamine derivative. Advantageously, the replenishing solutions of this embodiment are substantially free of polar organic solvents, alkanolamines, corrosion inhibitors, and chelators. Of course, if a replenishing solution contains both the residue remover (to make up that which is for example lost in the wash) and additional compounds, then for purposes of this disclosure the replenishing solution contains only the additional ingredients.

The replenishing solutions of many embodiments of the present invention contain only water, optionally hydroxylamine or hydroxylamine derivative, and a corrosion inhibitor and/or chelating agent. Advantageously, the replenishing solutions of this embodiment are substantially free of polar organic solvents and alkanolamines. Of course, if a replenishing solution contains both the residue remover (to make up that which is lost for example in the wash) and additional compounds, then for purposes of this disclosure the replenishing solution contains only the additional ingredients.

The replenishing solutions of many embodiments of the present invention contain water, AEEA, optionally hydroxylamine or hydroxylamine derivative, and optionally a corrosion inhibitor and/or chelating agent. When both the original composition according to the invention and the replenishing composition contain AREA and water, it is preferred that the AEEA:water ratio in the replenishing composition be not more than about 90%, preferably not more than about 75%, more preferably not more than about 50%, of the AEEA:water ratio in the original composition. That is, if there is 20% AEEA and 20% water in the original residue remover, then advantageously the replenishing solution has a weight ratio of AEEA:water of not more than about 0.9; 1, preferably not more than about 0.75:1, more preferably not more than about 0.5:1 The replenishing solutions are therefore less expensive than prior art replenishing formulations, which typically contained a greater ratio of alkanolamines to water than was present in the original residue remover. Advantageously, the replenishing solutions of this embodiment are substantially free of polar organic solvents. Of course, if a replenishing solution contains both the residue remover (to make up that which is lost for example in the wash) and additional compounds, then for purposes of this disclosure the replenishing solution contains only the additional ingredients.

Generally, the most prevalent component(s) (or portion(s)) thereof) present in the replenishing compositions are those which have relatively low vapor pressures at operating temperatures, or those which have relatively low boiling points, at least in comparison to the other components of the original composition according to the invention.

As a result, in another embodiment, the replenishing composition can advantageously contain less than about 20% of preferably can contain less than about 10% of, more preferably can contain less than about 5% of, alternately can be substantially free from, any component(s) (besides water) that has a boiling point of less than about 185° C., preferably less than about 200° C., alternately less than about 215° C., and that has a flash point of less than about 95° C., preferably less than about 100° C., alternately less than about 110° C.

When both the original composition according to the invention and the replenishing composition contain AEEA and another two-carbon atom linkage alkanolamine compound with a boiling point below that of AEEA, it is preferred that the AEEA:other alkanolamine ratio in the replenishing composition be not more than about 95%, preferably not more than about 80%, of the AEEA:other alkanolamine ratio in the original composition.

After treatment with the compositions of this invention, the substrate may then be rinsed in a low-boiling-point polar organic solvent, such as isopropyl alcohol or N-methylpyrrolidone, or in a mildly acidic organic acid solution, such as acetic or citric acid, followed by a deionized water rinse. Alternately, the substrate may be merely rinsed with a very dilute solution of a carboxylic acid and deionized water, or even just with deionized water, especially if the composition according to the invention is substantially free of other alkanolamines and/or other alcohol amines.

That is, after treatment with the compositions of this invention, the substrate may then be rinsed in a low molecular weight polar solvent, such as isopropyl alcohol, followed by a deionized water rinse. Alternately, the substrate may then be rinsed in a mildly acidic organic acid solution, such as acetic or citric acid in water or water/alcohol, followed by a deionized water rinse. Alternately and advantageously, the substrate may be merely rinsed with deionized water, especially if the composition according to the invention contains AEEA and at most 10% (and preferably at most about 5%) of other alkanolamines and/or alcohol amines. This result is obtainable because water-AEEA solutions formed during washing do not corrode substrates as much as prior art alkanolamines. Advantageously, the residue removing composition is substantially free of polar organic solvents, corrosion inhibitors, organic solvents (polar or non-polar), and chelating agents which are not readily miscible with water. This allows eliminating the low boiling temperature solvent rinse, which is a substantial advantage in semiconductor manufacture.

After being rinsed, the substrate can then be mechanically dried, such as with a spin drier, or nitrogen blow dried. Alternately or additionally, the substrate may be allowed to at least partially air dry and/or may be nominally heated. Another aspect of the invention relates to a method of etching, and optionally cleaning, a substrate using the compositions of the present invention, which method involves contacting a substrate comprising a metal or metal alloy to be etched, and optionally having organometallic and/or metal oxide residue thereon, with the composition according to the invention for a time and at a temperature sufficient to selectively etch the metal or metal alloy, and optionally remove the residue. In extreme etching situations, the etching formulation can advantageously contain an abrasive, or alternatively the substrate can be contacted with a rubbing surface having an abrasive thereon.

The etch rate of the metal or metal alloy can be advantageously tailored by selecting an appropriate two-carbon atom linkage alkanolamine compound or mixture thereof, based on the metal or metal alloy to be etched. For example, with an aluminum- or titanium-containing substrate, a relatively low etch rate can be obtained in most embodiments of this invention with the two-carbon atom linkage alkanolamine compound being only AEEA, whereas the etch rate can be incrementally increased by maintaining the same total percentage of two carbon atom linkage alkanolamine compound, but by incrementally decreasing the proportion of AEEA with respect to, e.g., DGA.

In one embodiment, the substrate can be immersed in the composition according to the invention. In an alternate embodiment, the composition according to the invention can be applied to a surface of the substrate, e.g., by spraying on, applying droplets, coating, overcoating (with the excess composition running off the substrate), or the like, or a combination thereof. In some etching situations, the etching formulation can advantageously contain an abrasive and be contacted with a smooth surface, or alternatively the substrate can be contacted with a rubbing surface having an abrasive thereon.

In either embodiment, the time and temperature are determined based on the particular material being removed from a substrate. Generally, the temperature is in the range of from about ambient or room temperature to about 120° C. and the contact time is typically from about 2 to about 60 minutes. However, the temperature range may expand to higher temperatures, especially when the flash point of the two-carbon atom linkage alkanolamine compound(s) are relatively high, as is the case when AEEA and/or DGA are included in the composition according to the invention.

EXAMPLES

Exemplary embodiments of the present invention will be illustrated by reference to the following examples, which are included to exemplify, but not to limit, the scope of the present invention.

Examples 1-8

Prior Art Compositions Containing 2-Carbon Alkanolamine Compounds

Table 1 below describes cleaning compositions A through H for Examples 1-8 to follow.

TABLE 1

| Clearing composition | Alkanolamine wt % | Chelating Agent wt % | Hydroxyl-amine wt % | Water wt % |
| --- | --- | --- | --- | --- |
| A | DGA (60%) | 5% catechol | 17.5% | 17.5% water |
| B | MIPA (55%) | 10% gallic acid | 15% | 20% water |
| C | MEA (60%) |  | 17.5% | 22.5% water |
| D | MEA (60%) | 5% gallic acid | 17.5% | 17.5% water |
| E | MIPA (60%) | 5% catechol | 17.5% | 17.5% water |
| F | MEA (30%) + MIPA (25%) | 10% catechol | 15% | 20% water |
| G | MEA (30%) + MIPA (25%) | 10% gallic acid | 15% | 20% water |
| H | DGA (55%) | 10% gallic acid | 15% | 20% water |

Example 1

A semiconductor wafer having a patterned metal stack consisting of TiN/Al/Ti/TiN/Ti/SiO$_2$ was treated with composition A at 75° C. for 30 minutes to remove process residue from the wafer, for comparative purposes. FIG. 1 is a scanning electron microscope (SEM) photograph of the wafer after this treatment. Substantial undercutting of both Ti layers are visible in this photograph.

Example 2

A semiconductor wafer having a patterned metal stack consisting of TiN/Al/Ti/TiN/Ti/SiO$_2$ was treated with composition B at 75° C. for 30 minutes to remove process residue from the wafer. FIG. 2 is a SEM photograph of the wafer after this treatment. No undercutting of the lower Ti layer is visible, and a slight undercutting of the upper Ti layer is visible.

Example 3

A semiconductor wafer having a patterned metal stack consisting of TiN/Al/Ti/TiN/Ti/SiO$_2$ was treated with composition C at 75° C. for 30 minutes to remove process residue from the wafer, as a control. FIG. 3 is a SEM photograph of the wafer after this treatment. Undercutting of both Ti layers is visible.

Example 4

A semiconductor wafer having a patterned metal stack consisting of TiN/Al/Ti/TiN/Ti/SiO$_2$ was treated with composition D at 75° C. for 30 minutes to remove process residue from the wafer. FIG. 4 is a SEM photograph of the wafer after this treatment. A slight undercutting of the lower Ti layer is visible, and no undercutting of the upper Ti layer is visible.

Example 5

A semiconductor wafer having a patterned metal stack consisting of W/Ti/SiO$_2$ was treated with composition E at 75° C. for 30 minutes to remove process residue from the wafer. FIG. 5 is a SEM photograph of the wafer after this treatment. No undercutting of the Ti layer is visible.

Example 6

A semiconductor wafer having a patterned metal stack consisting of TiN/Ti/Al/Ti/TiN/BPSG (boron phosphlosilicate glass) was treated with composition F at 75° C. for 30 minutes to remove process residue from the wafer. FIG. 6 is a SEM photograph of the wafer after this treatment. No) undercutting of the Ti layers is visible.

Example 7

A semiconductor wafer having a patterned metal stack consisting of TiN/Al/Ti/TiN/Ti/SiO$_2$ was treated with composition G at 75° C. for 30 minutes to remove process residue from the wafer. FIG. 7 is a SEM photograph of the wafer after this treatment. No undercutting of the Ti layers is visible.

Example 8

A semiconductor wafer having a patterned metal stack consisting of TiN/Al/Ti/TiN/Ti/SiO$_2$ was treated with composition H at 75° C. for 30 minutes to remove process residue from the wafer, for comparative purposes. FIG. 8 is SEM photograph of the water after this treatment. Undercutting of the Ti layers is visible.

The above examples show that prior art compositions B. D, F, F and G successfully remove residues from substrates having a titanium metallurgy with only moderate attack on the titanium metallurgy. Increased amounts of catechol or gallic acid produce an improved reduction of attack on the titanium metallurgy. The comparative compositions A, C and H all show substantial attack on the titanium metallurgy, even when a two carbon atom linkage alkanolamine compound is used in the absence of gallic acid or catechol. When gallic acid or catechol is used with an alkanolamine compound other than a two carbon atom linkage alkanolamine compound, the gallic acid or catechol does not show a proportionate reduction of attack of the composition on the titanium metallurgy.

Table 2 below describes cleaning compositions 1 through 14 for Examples 9-20 to follow.

TABLE 2

| Composition | AEEA or its derivatives | | Other Amines | | Solvent | | Hydroxylamine or derivatives | | Chelating Agents | | Others | |
|---|---|---|---|---|---|---|---|---|---|---|---|---|
| | Compound | Wt % | Compound | Wt % | Compound | Wt % | Compound | Wt % | Compound | Wt % | Compound | Wt % |
| Composition 1 | AEEA | 60 | | | | | Hydroxylamine | 17.5 | Catechol | 5 | Water | 17.5 |
| Composition 2 | | | DGA | 60 | | | Hydroxylamine | 17.5 | Catechol | 5 | Water | 17.5 |
| Composition 3 | | | MEA | 60 | | | Hydroxylamine | 17.5 | Catechol | 5 | Water | 17.5 |
| Composition 4 | AEEA | 50 | | | NMP | 50 | | | | | | |
| Composition 5 | AEEA | | | | DMAC | 30 | | | Catechol | 5 | | |
| Composition 6 | AEEA | 85 | | | | | | | | | Water | 15 |
| Composition 7 | AEEA | 60 | | | | | Hydroxylamine | 15 | Catechol | 5 | Water | 20 |
| Composition 8 | | | DGA | 60 | | | Hydroxylamine | 15 | Catechol | 5 | Water | 20 |
| Composition 9 | AEEA | 55 | | | PG | 9.5 | Hydroxylamine | 10 | Catechol | 5 | Water | 20.5 |
| Composition 10 | | | DGA | 30 | PG | 9.5 | Hydroxylamine | 10 | Catechol | 5 | Water | 20.5 |
| | | | MEA | 25 | | | | | | | | |
| Composition 11 | AEEA | 57.5 | | | | | DEHA | 20 | Gallic Acid | 2.5 | Water | 20 |
| Composition 12 | AEEA | 6.7 | MEA | 25.2 | | | Hydroxylamine | 12.6 | Catechol | 6.3 | Water | 26.1 |
| | | | MIPA | 21 | | | | | Gallic Acid | 2.1 | | |

TABLE 2-continued

| Composition 13 | AEEA | 48.9 | Hydroxylamine | 14.5 | Gallic Acid | 7.9 | Water | 26.7 |
| Composition 14 | AEEA | 40 | Hydroxylamine | 15 | Gallic Acid | 10 | Water | 35 |

| Chemical Name | Abbreviation |
| --- | --- |
| 2,2 Aminoethylethanolamine | AEEA |
| N-Methyl-2-Pyrolidone | NMP |
| Diglycolamine | DGA |
| Dimethylacetamide | DMAC |
| Propylene Glycol | PG |
| Mono Isopropanolamine | MIPA |
| N,N Diethylhydroxylamine | DEHA |
| Mono Ethanolamine | MEA |

Example 9

Comparison of Metal Etch Rates Between AEEA and Other Alkanolamines

About 4000 Å of aluminum and 550 Å of titanium were deposited on a silicon wafer surface using conventional semiconductor manufacturing processes. The thicknesses of the metal films were measured with a 4-Dimension Four Point Probe, Model 280, to determine the initial thickness of the metal film. Solutions of Compositions 1, 2 and 3 were placed in beakers and were heated to 75° C. Samples of the substrate were then totally immersed into the solutions maintained at 75° C. for 20 minutes. The samples were then taken out from the solution and immediately rinsed with deionized water to remove all the chemical solutions. The samples were then dried by blowing dry nitrogen across the surface. The thickness of the metal film was then measured again in the Four Point Probe to obtain the final thickness. The results are listed in Table 3 below. When AEEA was used in the formulation, there was no observable etching of the titanium film and the etching of the aluminum film was only half of the other alkanolamines.

A composite of films of ~500 Å TiN/~11,000 Å Al/~800 Å Ti was deposited on silicon oxide substrates. The metal film was then patterned using the convention lithography tools for semiconductor manufacturing. A pattern was then transferred to the metal film stack by plasma etching processes utilizing traditional etching equipment. FIG. 9A shows the patterned feature after etching processes examining under a Scanning Electron Microscope, Hitachi SEM 6400. The patterned substrate was then immersed in separate beakers containing Compositions 1 and 2 for 60 minutes at 75° C. The substrates were then rinsed in deionized water and were dried by blowing nitrogen across the substrate surfaces. The patterned substrate was then inspected again using Hitachi SEM 6400. FIGS. 9B and 9C show the result after the cleaning processes. SEM inspection of these patterned wafers also support the conclusions that AEEA-containing hydroxylamine formulations do not attack the sensitive titanium layer, while DGA-containing hydroxylamine formulations do attack the sensitive titanium layer when contacted under those conditions.

Example 10

Study of Corrosion of Metal Film with Different AEEA Mixtures

This example illustrates that AEEA can be formulated with other solvents and water without causing detrimental attack on the substrate film. About 10,000 Å of Aluminum and 3000 Å of titanium thin film were deposited on a silicon wafer surface using conventional semiconductor manufacturing processes. The thicknesses of the metal film were measured with a 4-Dimension Four Point Probe, Model 280 to determine the initial thickness of the metal film. Composition 4 is a mixture of AEEA and NMP, a common polar solvent used by the semiconductor industry as a photoresist stripper. Composition 5 is a mixture of AEEA, DMAC, and Catechol. Composition 6 is a 85% AEEA with 15% water solution. These solutions were placed in separate beakers and heated to 65° C. Samples of the substrate were then totally immersed into the solution and maintained at 65° C. for 20 minutes. The samples were then taken out from the solution and immediately rinsed with deionized water to remove all the chemical solutions. The samples were then dried by blowing dry nitrogen across the surface. The thickness of the metal film was then measured again in the Four Point Probe to obtain the final thickness. The results are listed in Table 4 below. There was no attack of the titanium and aluminum film with composition 5 and 6. The blend of NMP and AEEA shows that only 49 Å of metal has been etched away from a total of 9881 Å, which is a value acceptable by the industry.

Etch rates of less than about 2 angstroms per minute are acceptable for many applications, but etch rates of 1 angstrom or less per minute. preferably 0.5 angstroms or less per minutes are preferred.

It was surprising that a composition containing 85% AEEA with 15% water solution did not etch either aluminum or titanium. These metals have been known to etch when contacted with amines and water.

Example 11

Demonstration of Wide Process Window for AEEA

A lower aggressiveness of AEEA to sensitive metals widens the available process window (time, temperature) for cleaning. Optimum process condition and composition of DGA-containing remover solutions can be developed to minimize the metal attack, such as in Compositions 2, 8, and 10, which include at least one commercial formulation. However, the use of AEEA in a weight-for-weight substitution with DGA in Compositions 1, 7, and 9 showed less dependency on process conditions and less etch rate on both aluminum and titanium, while still maintaining compatibility with the substrate metal film. See Table 5 below.

Additionally, dielectric layers are not attached by the AEEA formulations

Example 12

The Use of AEEA with Chelating Agents and Hydroxylamine Deriviates

AREA can be used with gallic acid (Compositions 11 and 13) to obtain good compatibility, i.e., low etch rates, with the substrate aluminum and titanium metal films, as shown in Table 6 below. Increasing gallic acid from 2.5% to 7.5% moderately further reduces etch rates. Similar results are expected with gallic acid derivatives.

Similar results are also expected with N,N-diethyl-hydroxylamine.

Example 13

Tungsten Compatibility

About 5,000 Å of tungsten film was deposited on a silicon wafer surface using conventional semiconductor manufacturing processes. The thicknesses of the metal film were measured with a 4-Dimension Four Point Probe, Model 280, to determine the initial thickness of the metal film. Two solutions with different amounts of AEEA were mixed in a separate beakers according to Compositions 13 and 14. These solutions were maintained in separate beakers and heated to 65° C. Samples of the tungsten substrate were then totally immersed into the solution and maintained at 65° C. for 20 minutes. The samples were then taken out from the solution and immediately rinsed with deionized water to remove all the chemical solutions. The sample was then dried by blowing dry nitrogen across the surface. The thickness of the metal film was then measured again in the Four Point Probe to obtain the final thickness. Table 7 shows these compositions having minimum tungsten attack. Composition 14, with 10% gallic acid and 40% AEEA, had just slightly less etch rate than did sample 13 with about 7% gallic acid but 45% AEEA.

Compatibility with tungsten has become increasingly important to the semiconductor manufacturing process. As the device geometry gets smaller, the metal overlay on the tungsten may be misaligned and may expose the surface, which situation is commonly referred as "exposed tungsten plug." FIGS. 17A and 17B are SEM photographs of just such a misalignment. If the chemistry is too aggressive toward tungsten, the tungsten can be eroded or corroded and can cause disconnection of any wiring present on the substrate, as shown in FIG. 17C.

TABLE 3

| Comp. | Temp. | Time | Al Etch Rate | | | Ti Etch Rate | | |
|---|---|---|---|---|---|---|---|---|
| | | | Initial Thickness | Final Thickness | Total Thickness Loss | Initial Thickness | Final Thickness | Total Thickness Loss |
| 1 | 75° C. | 20 min | 4357 Å | 4335 Å | 22 Å | 544 Å | 544 Å | no loss |
| 2 | 75° C. | 20 min | 4250 Å | 4207 Å | 43 Å | 552 Å | 429 Å | 123 Å |
| 3 | 75° C. | 20 min | 4206 Å | 4164 Å | 42 Å | 556 Å | 552 Å | 3 Å |

TABLE 4

| Comp. | Temp. | Time | Al Etch Rate | | | Ti Etch Rate | | |
|---|---|---|---|---|---|---|---|---|
| | | | Initial Thickness | Final Thickness | Total Thickness Loss | Initial Thickness | Final Thickness | Total Thickness Loss |
| 4 | 65° C. | 20 min | 9881 Å | 9832 Å | 49 Å | 2731 Å | 2758 Å | no loss |
| 5 | 65° C. | 20 min | 9027 Å | 9048 Å | no loss | 2808 Å | 2810 Å | no loss |
| 6 | 65° C. | 20 min | 8917 Å | 8921 Å | no loss | 2770 Å | 2772 Å | no loss |

TABLE 5

| Comp. | Temp. | Time | Al Etch Rate | | | Ti Etch Rate | | |
|---|---|---|---|---|---|---|---|---|
| | | | Initial Thickness | Final Thickness | Total Thickness Loss | Initial Thickness | Final Thickness | Total Thickness Loss |
| 1 | 75° C. | 20 min | 4357 Å | 4335 Å | 22 Å | 544 Å | 544 Å | no loss |
| 2 | 75° C. | 20 min | 4250 Å | 4207 Å | 43 Å | 552 Å | 429 Å | 123 Å |
| 7 | 65° C. | 20 min | 10259 Å | 10263 Å | no loss | 2724 Å | 2727 Å | no loss |
| 8 | 65° C. | 20 min | 10256 Å | 10308 Å | no loss | 2765 Å | 2764 Å | 1 Å |
| 9 | 65° C. | 20 min | 10319 Å | 10321 Å | no loss | 2723 Å | 2720 Å | 4 Å |
| 10 | 65° C. | 20 min | 10250 Å | 10258 Å | no loss | 2722 Å | 2711 Å | 11 Å |

TABLE 6

| Comp. | Temp. | Time | Al Etch Rate | | | Ti Etch Raw | | |
|---|---|---|---|---|---|---|---|---|
| | | | Initial Thickness | Final Thickness | Etch Rate | Initial Thickness | Final Thickness | Etch Rate |
| 11 | 65° C. | 20 min | 10516 Å | 10512 Å | 0.2 Å/min | 2795 Å | 2780 Å | .75 Å/min |
| 12 | 65° C. | 20 min | 9863 Å | 9866 Å | no loss | 2849 Å | 2844 Å | .25 Å/min |

TABLE 7

| | | | W Etch Rate | | |
|---|---|---|---|---|---|
| Composition | Temperature | Time | Initial Thickness | Final Thickness | Etch Rate |
| 13 | 65° C. | 20 min | 4963 Å | 4931 Å | 1.6 Å/min |
| 14 | 65° C. | 20 min | 5012 Å | 4986 Å | 1.3 Å/min |

Examples 14-21

One use of these compositions is to strip photoresist and remove post-etch residues. The following steps may be utilized to construct wiring for semiconductor devices:

1. A barrier or adhesion layer such as titanium (Ti), titanium nitride (TiN), titanium tungsten (TiW), tantalum nitride (TaN), or the like, can be deposited on a dielectric surface, such as silicon, silicon dioxide, or the like;

2. A metal conducting layer such as copper, aluminum, or aluminum alloys, e.g., with silicon and/or copper can then be deposited over the barrier or adhesion layer;

3. The surface of the metal layer can then be capped with a layer of titanium, titanium nitride, titanium tungsten, silicon oxynitride (SiON), or a combination of these thin film, as an antireflective coating;

4. A photoresist can then be spin coated over the metal stack film and patterned using the conventional lithography tools, e.g., such as manufacturing by Cannon, Nikon, ASML, Ultratech Stepper, etc.;

5. The pattern can then be transferred to the film stack by plasma etching processes, e.g., using etching equipment from Applied Materials. Lam Research, TEGAL, TEL, etc.;

6. The resist mask can be removed by oxygen plasma ashing either in situ (on the etching equipment) or in a separate oxygen plasma asher produced by, e.g., Mattson, Gasonics, Matrix, etc.; and 7. The substrate can then be processed by cleaning with a solution, such as the composition according to the invention.

The patterned substrate may be exposed to the solution by either i. directly immersing the substrate wafer into a bath of the chemical solutions, which is maintained at a constant temperature, ranging from room temperature to about 15° C. below the flash point of the most volatile/dangerous component, or ii. Bringing the chemical solution to the wafer surface by dispensing the chemical solution at an operating temperature, ranging from room temperature to about 15° C. below the flash point of the most volatile/dangerous component, into a chamber where it can hold either a single wafer or cassettes of wafers.

After patterning, the substrates can then be rinsed in deionized water, if necessary, until the resistivity of the deionized water returned to at least about 18 MΩ, which is usually as the end point detection for wafer cleanliness. Optionally, an intermediate rinse can be performed with a solvent, e.g., such as isopropyl alcohol, N-methyl-2 pyrrolidone, a dilute solution of organic acids (such as citric acid, acetic acid etc.), or a combination thereof, followed by deionized water.

After rinsing, the wafer substrates can then be dried by blowing dry nitrogen across the surface, while rotating the wafer singly (single wafer process) or in a cassette (batch wafer process).

The following process may be used to make interconnections between wiring on semiconductor devices:

1. A layer of insulating material, e.g., such as silicon dioxide fluorinated silicon dioxide, carboneous silicon dioxide, a low dielectric organic material (such as polyimide, SILK™, etc.), or the like. can be deposited over a patterned metal surface to a desired thickness;

2. The surface of interlayer dielectric (ILD) material. which may have a via hole with a structure for interconnection, can then be planarized by processes such as chemical mechanical planarization (CMP), chemical etch back, etc.;

3. A photoresist can then be spin coated over the ILD film and patterned using conventional lithography tools, such as manufacturing by Cannon, Nikon, ASML, Ultratech Stepper, etc.;

4. The pattern can then be transferred to the ILD film by plasma etching processes e.g., using etching equipment from Applied Materials, Lam Research, TEGAL, TEL, etc.;

5. The resist mask can be removed by oxygen plasma ashing either in situ (on the etching equipment) or in a separate oxygen plasma asher produced by, e.g., Mattson, Gasonics, Matrix, etc.; and 6. The substrate can then be processed by cleaning with a solution, such as the composition according to the invention.

The patterned substrate may be exposed to the solution by either i. directly immersing the substrate wafer into a bath of the chemical solutions. which is maintained at a constant temperature, ranging from room temperature to about 15° C. below the flash point of the most volatile/dangerous component, or ii. Bringing the chemical solution to the wafer surface by dispensing the chemical solution at an operating temperature, ranging from room temperature to about 15° C. below the flash point of the most volatile/dangerous component, into a chamber where it can hold either a single wafer or cassettes of wafers.

After patterning, the substrates can then be rinsed in deionized water, if necessary, until the resistivity of the deionized water returned to at least about 18 MΩ, which is usually as the end point detection for wafer cleanliness. Optionally, an intermediate rinse can be performed with a solvent, e.g., such as isopropyl alcohol, N-methyl-2 pyrrolidone, a dilute solution of organic acids (such as citric acid, acetic acid etc.), or a combination thereof.

After rinsing, the wafer substrates can then be dried by blowing dry nitrogen across the surface, while rotating the wafer singly (single wafer process) or in a cassette (batch wafer process).

These processes were used for Examples 14-21 below.

Example 14

Comparison of Etch Residue Removal Performance

For Example 14, FIG. 10A demonstrates an examination under a Scanning Electron Microscope, Hitachi SEM 6400, which shows the patterned feature of a composite of films of 500 Å TiN/~5000 Å Al/~100 Å Ti after etching processes according to general procedures described above. Post-etch residue remained on the metal line surface. The patterned substrate was then immersed in separate beakers containing Compositions 1, 2, and 3 for 20 minutes at 70° C. The substrates were then rinsed in deionized water and dried by blowing nitrogen across the substrate surfaces. The patterned substrate was then inspected again using Hitachi SEM 6400. FIGS. 10B, 10C and 10D show the result after the cleaning processes. Composition 1 effectively removed all the etch residues from the substrate surface with no evidence of attack of the substrate.

Example 15

Comparison of Etch Residue Removal Performance

For Example 15, FIG. 11A demonstrates an examination under a Scanning Electron Microscope, Hitachi SEM 6400, which shows the patterned feature of a composite of films of ~100 Å TiN/~100 ÅAl/~250 Å TiN/<100 Å Ti after etching processes according to general procedures described above. Post-etch residue was seen surrounding the metal line structures. The patterned substrate was then immersed in separate beakers containing Compositions 1, 2, and 3 for 20 minutes at 70° C. The substrates were then rinsed in deionized water and dried by blowing nitrogen across the substrate surfaces. The patterned substrate was then inspected again using Hitachi SEM 6400. FIGS. 11B and 11C show the result after the cleaning processes. Composition 1 effectively removed all the etch residues from the substrate surface, as did Compositions 2 and 3.

Example 16

Effect of Aqueous AEEA Solutions with Chelating Agent and Fluoride Compound

About 10,000 Å of aluminum and 500 Å of titanium were deposited as a multilayer film on a silicon wafer surface using conventional semiconductor manufacturing processes and techniques. The thicknesses of the films were measured with a 4-Dimension Four Point Probe. Model 280, to determine the initial thickness of each film. Solution mixtures were prepared, according to Compositions 15 and 16. shown in Table 8. in a beaker and were heated to 65° C. Samples of the substrate were then totally immersed into the solution and maintained at 65° C. for 20 minutes. The samples were then taken out from the solution and immediately rinsed with deionized water to wash away the chemical solutions. The sample was then dried by blowing dry nitrogen across the surface. The thickness of the films were then measured again in the Four Point Probe to obtain the final thicknesses. The results indicated that the combination of AEEA and ammonium fluoride aggressively attacks aluminum but not titanium. See the results listed in Table 9 below. AEEA, AF, and water in the absence of corrosion inhibitors provides unacceptable etch of aluminum but no etch of titanium.

~250 Å TiN/~7000 Å Al/500 Å TiN after etching processes according to general procedures described above. Post-etch residue remained on the metal line surface. The patterned substrate was then immersed in separate beakers containing Compositions 1, 2, and 3 for 20 minutes at 70° C. The substrates were then rinsed in deionized water and dried by blowing nitrogen across the substrate surfaces. The patterned substrate was then inspected again using Hitachi SEM 6400. FIGS. 12B, 12C, and 12D show the result after the cleaning processes. Composition 1 with AEEA effectively removed all the etch residues from the substrate surface.

For Example 18, FIG. 13A demonstrates an examination under a Scanning Electron Microscope. Hitachi SEM 6400, which shows the patterned feature of a composite of a pad film of ~500 SiON/~14,000 Å Al/~1000 Å TaN after etching processes according to general procedures described above. Post-etch residue remained on the metal line surface. The patterned substrate was then immersed in separate beakers containing Compositions 11 and 13 for 30 minutes at 70° C. The substrates were then rinsed in deionized water and dried by blowing nitrogen across the substrate surfaces. The patterned substrate was then inspected again using Hitachi SEM 6400. FIGS. 13B and 13C show the result after the cleaning processes. Composition 13 effectively removed all the etch residues from the substrate surface without pitting the metal surface.

For Example 19, FIG. 14A demonstrates an examination under a Scanning Electron Microscope, Hitachi SEM 6400, which shows the patterned feature of a composite of film of ~400 Å TiN/~4500 Å Al/~800 Å TiN/~100 Å Ti after etching processes according to general procedures described above. Post-etch residue remained on the metal line surface. The patterned substrate was then immersed in separate beakers containing Compositions 7 and 8 for 60 minutes at 70° C. The substrates were then rinsed in deionized water and dried by blowing nitrogen across the substrate surfaces. The patterned substrate was then inspected again using Hitachi SEM 6400. FIGS. 14B and 14C show the result after the cleaning processes. Composition 7 with AEEA effectively removed all the etch residues from the substrate surface without attacking metal surface as much as Composition 8 with DGA.

For Example 20, FIG. 15A demonstrates an examination under a Scanning Electron Microscope, Hitachi SEM 6400, which shows the patterned feature of a composite of film of ~500 Å TiN/~11,000 Å Al/~800 ÅTi after etching processes according to general procedures described above. Post-etch residue remained on the metal line surface. The patterned substrate was then immersed in separate beakers containing

TABLE 9

|  | Temp. | Time | Al | | | Ti | | |
| --- | --- | --- | --- | --- | --- | --- | --- | --- |
|  |  |  | Initial Thickness | Final Thickness | Thickness Loss | Initial Thickness | Final Thickness | Thickness Loss |
| Composition 15 | 65° C. | 20 min | 10273 Å | 10230 Å | No Loss | 537 Å | 536 Å | 1 Å |
| Composition 16 | 65° C. | 20 min | 10256 Å | 6528 Å | 3728 Å | 544 Å | 544 Å | No Loss |

Examples 17-21

Comparison of Etch Residue Removal Performance Between AEEA, DGA, and MEA

For Example 17, FIG. 12A demonstrates an examination under a Scanning Electron Microscope, Hitachi SEM 6400, which shows the patterned feature of a composite of films of Compositions 9 and 10 for 60 minutes at 75° C. The substrates were then rinsed in deionized water and dried by blowing nitrogen across the substrate surfaces. The patterned substrate was then inspected again using Hitachi SEM 6400. FIGS. 15B and 15C show the result after the cleaning processes. Composition 9 with AEEA effectively removed all the etch residues from the substrate surface without attacking metal surface as much as Composition 10 with DGA and MEA.

For Example 21, FIG. 16A demonstrates an examination under a Scanning Electron Microscope, Hitachi SEM 6400, which shows the via hole patterned feature after etching processes according to general procedures described above. Post-etch residue remained on inside surface. The patterned substrate was then immersed in separate beakers containing Composition 7 and 8 for 30 minutes at 65° C. The substrates were then rinsed in deionized water and dried by blowing nitrogen across the substrate surfaces. The patterned substrate was then inspected again using Hitachi SEM 6400. FIGS. 16B and 16C show the result after the cleaning processes. Composition 7 effectively removed all the etch residues from the substrate surface without attacking metal surface.

Table 8 below describes cleaning compositions 15 through 21 for Examples 22-24 to follow, as well as prophetic compositions 22 through 30. The processes described above for Examples 14-21 are also used in Examples 22-24.

tions 15 and 16 for 20 minutes at 65° C. The substrates were then rinsed in deionized water and then dried by blowing nitrogen across the substrate surfaces. The patterned substrate was then inspected again using Hitachi SEM 6400. Compositions 15 and 16 effectively removed all the etch residues from the substrate surface. See Table 9 for results.

Example 23

Comparison of Etch Residue Performance Between Freshly Mixed and Used Compositions Containing AEEA. Hydroxylamine, and Another Two-Carbon Alkanolamine For example 23, composites of film having an external titanium and an external aluminum layer, respectively, were patterned and subject to etching under process conditions

TABLE 8

| Composition | AEEA or its derivatives Compound | Wt % | Other Amines Compound | Wt % | Solvent Compound | Wt % | Hydroxylamine or derivatives Compound | Wt % | Chelating Agents Compound | Wt % | Others Compound | Wt % |
|---|---|---|---|---|---|---|---|---|---|---|---|---|
| Composition 15 | AEEA | 85 | | | | | | | Gallic acid | 2.5 | Water | 12.5 |
| Composition 16 | AEEA | 85 | | | | | | | | | Water | 12.5 |
| | | | | | | | | | | | AF | 2.5 |
| Composition 17 | AEEA | 30 | DGA | 30 | | | Hydroxylamine | 17.5 | Catechol | 5 | Water | 17.5 |
| Composition 18 | AEEA | 30 | MEA | 30 | | | Hydroxylamine | 17.5 | Catechol | 5 | Water | 17.5 |
| Composition 19 | AEEA | 65 | | | | | Hydroxylamine | 17.5 | | | Water | 17.5 |
| Composition 20 | | | DGA | 65 | | | Hydroxylamine | 17.5 | | | Water | 17.5 |
| Composition 21 | AEEA | 35 | DGA | 30 | | | Hydroxylamine | 17.5 | | | Water | 17.5 |
| Composition 22 | AEEA | 80 | | | | | | | Catechol | 2-5 | Water | 15-18 |
| Composition 23 | AEEA | 80 | | | | | | | EDTA | 2-5 | Water | 15-18 |
| Composition 24 | | | | | | | Hydroxylamine | 15 | | | Water | 30-33 |
| | | | | | | | | | | | AF | 2-5 |
| Composition 25 | AEEA | 55 | DGA | 25 | | | | | Gallic Acid | 2-5 | Water | 10-13 |
| Composition 26 | AEEA | 55 | DGA | 30 | | | | | | | Water | 15 |
| Composition 27 | AEEA | 75 | DGA | 20 | | | | | Catechol | 5 | | |
| Composition 28 | AEEA | 60 | | | AEEDA | 20 | | | Catechol | 5 | Water | 15 |
| Composition 29 | AEEA | 20-50 | DGA | 0.1-20 | AEEDA | 0-50 | Hydroxylamine | 5-17.5 | Gallic acid | 0-10 | Water | 2.5-25 |
| | | | MEA | 0-20 | NMP | 0-50 | DEHA | 0-20 | Catechol | 0-10 | AF | 0-5 |
| | | | MIPA | 0-20 | DMAC | 0-35 | IPHA | 0-20 | EDTA | 0-10 | ABF | 0-5 |
| Composition 30 | AEEA | 10-00 | | | DMSO | 20-50 | | | Catechol | 0-10 | Choline | 0-10 |
| | | | | | | | | | Gallic acid | 0-10 | OH | 0-15 |
| | | | | | | | | | EDTA | 0-10 | Water | |
| | | | | | | | | | TBC | 0-10 | | |

Compositions 22-30 are prophetic compositions according to the invention.

| Chemical Name | Abbreviation |
|---|---|
| Monoisopropyl hydroxylamine | IPHA |
| Choline hydroxide | CholineOH |
| Tert-butyl catechol | TBC |
| Dimethyl sulfoxide | DMSO |
| Ethylenediaminetetraacetic acid, or a salt thereof | EDTA |
| Ammonium fluoride | AF |
| 2-(2-Aminoethylamino)-ethylamine | AEEDA |

Example 22

Comparison of Etch Residue Removal Performance Between AEEA and DGA in Hydroxylamine-Containing Compositions For example 22, composites of film having an external titanium and an external aluminum layer, respectively, were patterned and subject to etching under process conditions according to general procedures described above. The patterned substrate was initially examined under a Scanning Electron Microscope, Hitachi SEM 6400. Post-etch residue remained on the metal line surface. The patterned substrate was then immersed in separate beakers containing Compositions 17 and 18 for 20 minutes at 65° C. The substrates were then rinsed in deionized water and then dried by blowing nitrogen across the substrate surfaces. The patterned substrate was then inspected again using Hitachi SEAM 6400. A comparison was made between immersion of the patterned substrates in freshly-made formulations of Compositions 17 and 18 and immersion of the patterned substrates in formulations of Compositions 17 and 18 that were sitting at operating temperatures for about 24 hours. See Table 10 for results, showing that the attack of the aluminum and titanium film by compositions decreased after the solution was maintained at elevated temperatures for at least 24 hours. The more volatile components, DGA and MEA were presumably evaporated at an increased rate (in comparison to the higher boiling AEEA), thus lowering the amount of MEA and DGA relative to AEEA in the compositions, and presumably as a result lowering the etch rate of the films with time. This supports the advantage of having higher boiling point materials, such as AEEA, in compositions according to the invention. Operators want consistent. predictable performance from residue removers during storage for between 2 to 3 days. This interpretation of the results is also consistent with previous examples, suggesting that DGA is more aggressive to attack titanium than AEEA, and that MEA is more aggressive to attack aluminum than AEEA.

Example 24

Comparison of Etch Residue Removal Performance in Compositions Containing, Hydroxylamine and AEEA, DGA, or Both For example 24, composites of film having an external titanium and an external aluminum layer, respectively, are patterned and subject to etching under process conditions according to general procedures described above. The patterned substrate is initially examined under a Scanning Electron Microscope, Hitachi SEM 6400. Post-etch residue remains on the metal line surface. The patterned substrate is then immersed in separate beakers containing Compositions 19, 20, and 21 for 20 minutes at 55° C. The substrates are then rinsed in deionized water and are then dried by blowing nitrogen across the substrate surfaces. The patterned substrate is then inspected again using Hitachi SEM 6400. Composition 19 effectively remove all the etch residues from the substrate surface without attacking the aluminum surface, as compared to Composition 20. In addition, Composition 21 showed an intermediate result for the aluminum surface, but a superior result for the titanium surface, suggesting synergy between AEEA and DGA in selected cases. See Table 10 for results.

metal film after etching process according to general procedures described above. Post-etch residue remained on the metal line surface. The patterned substrate was then immersed in separate beaker containing Compositions 1,2, and 10 for 60 minutes at 70° C. The substrates were rinsed in deionized water and dried by blowing dry nitrogen across the substrate surfaces. The patterned substrate was then inspected again using Hitachi SEM 6400. FIGS. 18B, 18C, and 18D show the result after each of the cleaning processes on Compositions 1, 2, and 10, respectively. Composition 1, containing AEEA, effectively removed the etch residue from the metal surface without eroding the tungsten plug and attacking the aluminum surface. Composition 2 attacked the titanium layer and lifted the metal line off (FIG. 18D), and Composition 10 severely attacked the aluminum surface (FIG. 18C).

Example 26

The Effect of Gallic Acid on Aqueous AEEA Compositions,

For Example 26, FIG. 19A demonstrates an examination under a Scanning Electron Microscope, Hitachi 6400, showing a patterned feature of a composite film of 2504 TiN/~7000 Å Al/~500 Å TiN after etching processes according to general procedure described above. Post-etch residue remained on the metal line surface. The patterned substrate was then immersed in a separate beaker containing Compositions 6 and 15 for 20 minutes at 75° C. The substrates were rinsed in deionized water and dried by blowing dry nitrogen across the substrate surfaces. The patterned substrate was then inspected again using Hitachi SEM 6400. FIGS. 19B and 19C show the results after each of the cleaning processes. Composition 6, containing AEEA and water, (FIG. 198) and Composition 15 (FIG. 19C) were capable of effectively removing post-etch residues.

It has been found that in formulations containing AEEA and one or more of: polar organic solvents, water, an amine, other alkanolamines, chelators, and corrosion inhibitors provide excellent removal of etch residue from copper and copper alloy substrates with low, commercially acceptable rates of etching. Beneficially, in one embodiment, the formulations

TABLE 10

| | | | Al Etch Rate | | | Ti Etch Rate | | |
|---|---|---|---|---|---|---|---|---|
| Comp | Temp. | Time | Initial Thickness | Final Thickness | Total Lost Thickness | Initial Thickness | Final Thickness | Total Lost Thickness |
| 15 | 65° C. | 20 min | 10273 Å | 10300 Å | no loss | 536.7 Å | 536.3 Å | 0.4 Å |
| 16 | 65° C. | 20 min | 10256 Å | 6528 Å | 3728 Å* | 544.4 Å | 544.1 Å | 0.3 Å |
| 17 (0 hrs.) | 65° C. | 20 min | 9800 Å | 9796 Å | 4 Å | 536.6 Å | 534.1 Å | 2.5 Å |
| 18 (0 hrs.) | 65° C. | 20 min | 10349 Å | 10323 Å | 26 Å | 545.1 Å | 545.3 Å | no loss |
| 17 (24 hrs.) | 65° C. | 20 min | 10250 Å | 10300 Å | no loss | 539.5 Å | 540 Å | no loss |
| 18 (24 hrs.) | 65° C. | 20 min | 10339 Å | 10352 Å | no loss | 542.3 Å | 543 Å | no loss |
| 19 | 55° C. | 20 min | 10302 Å | 10335 Å | no loss | 541 Å | 408 Å | 133 Å |
| 20 | 55° C. | 20 min | 9505 Å | 9453 Å | 52 Å | 540 Å | 363 Å | 177 Å |
| 21 | 55° C. | 20 min | 10065 Å | 10027 Å | 37 Å | 544 Å | 490 Å | 54 Å |

*after etching, a white haze was observed on the substrate layer surface of this sample

Example 25

The Effect of AEEA on the Erosion of Tungsten in the Presence Aluminum

For Example 25, FIG. 18A demonstrates an examination under a Scanning Electron:Microscope. Hitachi 6400, showing an exposed tungsten plug on the patterned features of a are substantially free of hydroxylamine. Hydroxylamine in many formulations is aggressive to copper. In some embodiments, the use of hydroxylamine derivatives, in which alkyl groups may partially shield the function groups), can be advantageous, especially if combined with AEEA and one or more of water, polar organic solvents, chelating agent, corrosion inhibitors (e.g., benzotriazole, which is well-known for its non-aggressiveness toward copper layers), and the like.

It has also been found that the AEEA-based formulations do not aggressively attack the dielectric layers on the substrates.

Examples 27-31 provide additional compositions which can be used to clean substrates. The methods of cleaning a substrate using the cleaning compositions of the present invention involve contacting the substrate having residue thereon (for example, polymeric, organometallic or metal oxide residues) with a cleaning composition of the present invention for a time and at a temperature sufficient to remove the residues. Stirring, agitation, circulation, sonification or other techniques as are known in the art may optionally be used.

In one embodiment, the substrate is immersed in the cleaning composition. The time and temperature are determined based on the particular material being removed from a substrate.

In one embodiment, the temperature is in the range of from about ambient or room temperature to about 100° C. and the contact time is from about 15 seconds to about 30 minutes.

In another embodiment, the temperature and time of contact are from about 20 to about 50° C., and from about 30 seconds to about 10 minutes, e.g., about 5 minutes.

In one embodiment, the substrate is rinsed after using the composition. Preferred rinse solutions include, but are not limited to, isopropyl alcohol and deionized water or neat deioned water.

Exemplary embodiments of the present invention will be illustrated by reference to the following examples, which are included to exemplify, but not limit the scope of the present invention.

Example 27

Compositions 31-64 illustrate cleaning compositions in a wide range of component concentrations, said cleaning compositions capable of removing etch residue at room temperature in a time period of less than 15 seconds to 5 minutes without damaging the substrate materials.

| Composition | Ingredients | CAS # | % by weight |
|---|---|---|---|
| 31 | 2 Aminoethyl ethanolamine | 111-41-1 | 0.066 |
|  | 30% citric acid | 5949-29-1 | 2.5 |
|  | Tris-(2 hydroxyethylmethyl) ammonium hydroxide | 33667-48-0 | 1.1 |
|  | Methyldiethanolamine | 105-59-9 | 0.33 |
|  | H$_2$O | 7732-18-5 | Balance |
| 32 | 2 Aminoethyl ethanolamine | 111-41-1 | 0.09 |
|  | 30% citric acid | 5949-29-1 | 2.5 |
|  | Tris-(2 hydroxyethylmethyl) ammonium hydroxide | 33667-48-0 | 1.5 |
|  | Methyldiethanolamine | 105-59-9 | 0.45 |
|  | H$_2$O | 7732-18-5 | Balance |
| 33 | 2 Aminoethyl ethanolamine | 111-41-1 | 0.0447 |
|  | 30% citric acid | 5949-29-1 | 6.7 |
|  | Tris-(2 hydroxyethylmethyl) ammonium hydroxide | 33667-48-0 | 0.745 |
|  | Methyldiethanolamine | 105-59-9 | 0.2235 |
|  | bicine (N,N-Di(2-hydroxylethyl) glycine) | 150-25-4 | 0.1 |
|  | H$_2$O | 7732-18-5 | Balance |
| 34 | 2 Aminoethyl ethanolamine | 111-41-1 | 0.2559 |
|  | 30% citric acid | 5949-29-1 | 6.7 |
|  | Tris-(2 hydroxyethylmethyl) ammonium hydroxide | 33667-48-0 | 4.265 |
|  | Methyldiethanolamine | 105-59-9 | 1.2795 |
|  | H$_2$O | 7732-18-5 | Balance |
| 35 | 2 Aminoethyl ethanolamine | 111-41-1 | 0.5199 |
|  | 30% citric acid | 5949-29-1 | 133 |
|  | Tris-(2 hydroxyethylmethyl) ammonium hydroxide | 33667-48-0 | 8.665 |
|  | Methyldiethanolamine | 105-59-9 | 2.5995 |
|  | H$_2$O | 7732-18-5 | Balance |
| 36 | 2 Aminoethyl ethanolamine | 111-41-1 | 0.0339 |
|  | 30% citric acid | 5949-29-1 | 6.7 |
|  | Tris-(2 hydroxyethylmethyl) ammonium hydroxide | 33667-48-0 | 0.565 |
|  | Methyldiethanolamine | 105-59-9 | 0.1695 |
|  | bicine (N,N-Di(2-hydroxylethyl) glycine) | 150-25-4 | 1 |
|  | H$_2$O | 7732-18-5 | Balance |
| 37 | 2 Aminoethyl ethanolamine | 111-41-1 | 0.003 |
|  | 30% citric acid | 5949-29-1 | 6.7 |
|  | Tris-(2 hydroxyethylmethyl) ammonium hydroxide | 33667-48-0 | 0.05 |
|  | Methyldiethanolamine | 105-59-9 | 0.015 |
|  | bicine (N,N-Di(2-hydroxylethyl) glycine) | 150-25-4 | 0.5 |
|  | H$_2$O | 7732-18-5 | Balance |
| 38 | 2 Aminoethyl ethanolamine | 111-41-1 | 0.021 |
|  | 30% citric acid | 5949-29-1 | 6.7 |
|  | Tris-(2 hydroxyethylmethyl) ammonium hydroxide | 33667-48-0 | 0.35 |
|  | Methyldiethanolamine | 105-59-9 | 0.105 |
|  | Bicine (N,N-Di(2-hydroxylethyl) glycine) | 150-25-4 | 0.5 |
|  | H$_2$O | 7732-18-5 | Balance |
| 39 | 2 Aminoethyl ethanolamine | 111-41-1 | 0.4824 |
|  | 30% citric acid | 5949-29-1 | 13.3 |
|  | Tris-(2 hydroxyethylmethyl) ammonium hydroxide | 33667-48-0 | 8.04 |
|  | Methyldiethanolamine | 105-59-9 | 2.412 |
|  | H$_2$O | 7732-18-5 | Balance |
| 48 | 2 Aminoethyl ethanolamine | 111-41-1 | 0.66 |
|  | Tris-(2 hydroxyethylmethyl) ammonium hydroxide | 33667-48-0 | 11 |
|  | Methyldiethanolamine | 105-59-9 | 3.3 |
|  | 90% Lactic acid | 50 2 -5 | 1.7 |
|  | 30% citric acid | 5949-29-1 | 13.5 |
|  | H$_2$O | 7732-18-5 | Balance |
| 49 | 2 Aminoethyl ethanolamine | 111-4 -1 | 1.32 |
|  | Tris-(2 hydroxyethylmethyl) ammonium hydroxide | 33667-48-0 | 22.0 |
|  | Methyldiethanolamine | 105-59-9 | 6.6 |
|  | 90% Lactic acid | 50-21-5 | 4.5 |
|  | 30% citric acid | 5949-29-1 | 18.9 |
|  | H$_2$O | 7732-18-5 | Balance |
| 50 | 2 Aminoethyl ethanolamine | 111-41-1 | 0.66 |
|  | Tris-(2 hydroxyethylmethyl) ammonium hydroxide | 33667-48-0 | 11 |
|  | Methyldiethanolamme | 105-59-9 | 3.3 |
|  | 70% Glycolic Acid | 79-14-1 | 2.2 |
|  | 30% citric acid | 5949-29-1 | 13.5 |
|  | H$_2$O | 7732-18-5 | Balance |
| 51 | 2 Aminoethyl ethanolamine | 111-41-1 | 0.54 |
|  | Tris-(2 hydroxyethylmethyl) ammonium hydroxide | 33667-48-0 | 9 |
|  | Methyldiethanolamine | 105-59-9 | 7.7 |
|  | 90% Lactic acid | 50-21-5 | 1.7 |
|  | 30% citric acid | 5949-29-1 | 13.5 |
|  | H$_2$O | 7732- 8 5 | Balance |
| 52 | 2 Aminoethyl ethanolamine | 111-41-1 | 1.32 |
|  | Tris-(2 hydroxyethylmethyl) ammonium hydroxide | 33667-48-0 | 22 |
|  | Methyldiethanolamine | 105-59-9 | 16.6 |
|  | 90% Lactic acid | 50-21-5 | 4.5 |
|  | 30% citric acid | 5949-29-1 | 18.9 |
|  | H$_2$O | 7732-18-5 | Balance |
| 53 | 2 Aminoethyl ethanolamine | 111-41-1 | 1.32 |
|  | Tris-(2 hydroxyethylmethyl) ammonium hydroxide | 33667-48-0 | 22 |
|  | Methyldiethanolamine | 105-59-9 | 6.6 |
|  | 90% Lactic acid | 50-21-5 | 4.5 |
|  | 30% citric acid | 5949-29-1 | 18.9 |
|  | TEA | 102-71-6 | 10 |
|  | H$_2$O | 7732-18-5 | balance |

| Composition | Ingredients | CAS # | % by weight |
|---|---|---|---|
| 54 | 2 Aminoethyl ethanolamine | 111-41-1 | 1.32 |
| | Tris-(2 hydroxyethylmethyl) ammonium hydroxide | 33667-48-0 | 22 |
| | Methyldiethanolamine | 105-59-9 | 6.6 |
| | 90% Lactic acid | 50-21-5 | 4.5 |
| | 30% citric acid | 5949-29-1 | 18.9 |
| | TEA | 102-71-6 | 20 |
| | H$_2$O | 7732-18-5 | Balance |
| 55 | 2 Aminoethyl ethanolamine | 111-41-1 | 1.32 |
| | Tris-(2 hydroxyethylmethyl) ammonium hydroxide | 33667-48-0 | 22 |
| | Methyldiethanolamine | 105-59-9 | 6.6 |
| | 90% Lactic acid | 50-21-5 | 4.5 |
| | 30% citric acid | 5949-29-1 | 18.9 |
| | TEA | 102-71-6 | 30 |
| | H$_2$O | 7732-18-5 | Balance |
| 56 | 2 Aminoethyl ethanolamine | 111-41-1 | 0.48 |
| | Tris-(2 hydroxyethylmethyl) ammonium hydroxide | 33667-48-0 | 16 |
| | Methyldiethanolamine | 105-59-9 | 2.4 |
| | 90% Lactic acid | 50-21-5 | 1.7 |
| | 30% citric acid | 5949-29-1 | 1.35 |
| | DMEE | 1704-62-7 | 5 |
| | H$_2$O | 7732-18-5 | Balance |
| 57 | 2 Aminoethyl ethanolamine | 111-41-1 | 0.1740 |
| | Tris-(2 hydroxyethylmethyl) ammonium hydroxide | 33667-48-0 | 2.9 |
| | Methyldiethanolamine | 105-59-9 | 0.87 |
| | 90% Lactic acid | 50-21-5 | 1.7 |
| | 30% citric acid | 5949-29-1 | 13.5 |
| | MIPA | 78-96-6 | 5 |
| | H$_2$O | 7732-18-5 | Balance |
| 58 | 2 Aminoethyl ethanolamine | 111-41-1 | 0.99 |
| | Tris-(2 hydroxyethylmethyl) ammonium hydroxide | 33667-48-0 | 16.5 |
| | Methyldiethanolamine | 105-59-9 | 4.95 |
| | 90% Lactic acid | 50-21-5 | 4 |
| | 30% citric acid | 5949-29-1 | 20 |
| | PA | 25212-19-5 | 5 |
| | 12% EPA | 25212-19-5 | 12 |
| | H$_2$O | 7732-18-5 | Balance |
| 59 | 2 Aminoethyl ethanolamine | 111-41-1 | 0.969 |
| | Tris-(2 hydroxyethylmethyl) ammonium hydroxide | 33667-48-0 | 16.15 |
| | Methyldiethanolamine | 105-59-9 | 4.845 |
| | 90% Lactic acid | 50-21-5 | 4.6 |
| | 30% citric acid | 5949-29-1 | 20.2 |
| | TETA | 112-24-3 | 1 |
| | EPA | 25212-19-5 | 16.4 |
| | H$_2$O | 7732-18-5 | Balance |
| 60 | 2 Aminoethyl ethanolamine | 111-41-1 | 0.735 |
| | Tris-(2 hydroxyethylmethyl) ammonium hydroxide | 33667-48-0 | 12.25 |
| | Methyldiethanolamine | 105-59-9 | 3.675 |
| | 90% Lactic acid | 50-21-5 | 6 |
| | 30% citric acid | 5949-29-1 | 8.5 |
| | TETA | 112-24-3 | 0.5 |
| | EPA | 25212-19-5 | 8 |
| | H$_2$O | 7732-18-5 | Balance |
| 61 | 2 Aminoethyl ethanolamine | 111-41-1 | 0.735 |
| | Tris-(2 hydroxyethylmethyl) ammonium hydroxide | 33667-48-0 | 12.25 |
| | Methyldiethanolamine | 105-59-9 | 3.675 |
| | 70% Glycolic Acid | 79-14-1 | 5.6 |
| | 30% citric acid | 5949-29-1 | 3.0 |
| | TETA | 112-24-3 | 1 |
| | EPA | 25212-19-5 | 8.0 |
| | H$_2$O | 7732-18-5 | Balance |
| 62 | 2 Aminoethyl ethanolamine | 111-41-1 | 1.132 |
| | Tris-(2 hydroxyethylmethyl) ammonium hydroxide | 33667-48-0 | 2.2 |
| | Methyldiethanolamine | 105-59-9 | 1.66 |
| | 90% Lactic acid | 50-21-5 | 0.45 |
| | 30% citric acid | 5949-29-1 | 4.73 |
| | H$_2$O | 7732-18-5 | Balance |
| 63 | 2 Aminoethyl ethanolamine | 111-41-1 | 10.66 |
| | Tris-(2 hydroxyethylmethyl) ammonium hydroxide | 33667-48-0 | 11 |
| | Methyldiethanolamine | 105-59-9 | 3.3 |
| | 90% Lactic acid | 50-21-5 | 1.7 |
| | 30% citric acid | 5949-29-1 | 13.5 |
| | H$_2$O | 7732-18-5 | Balance |
| 64 | 2 Aminoethyl ethanolamine | 111-41-1 | 0.66 |
| | Tris-(2 hydroxyethylmethyl) ammonium hydroxide | 33667-48-0 | 11 |
| | Methyldiethanolamine | 105-59-9 | 13.3 |
| | 90% Lactic acid | 50-21-5 | 4.5 |
| | 30% citric acid | 5949-29-1 | 18.9 |
| | H$_2$O | 7732-18-5 | Balance |

Example 28

Compositions 65-70 illustrate the additional benefits of adding surfactants to the compositions of the Invention.

| Composition | Ingredients | CAS # | % by weight |
|---|---|---|---|
| 65 | 2 Aminoethyl ethanolamine | 111-41-1 | 0.042 |
| | 30% citric acid | 5949-29-1 | 6.7 |
| | Tris-(2 hydroxyethylmethyl) ammonium hydroxide | 33667-48-0 | 0.7 |
| | Methyldiethanolamine | 105-59-9 | 0.21 |
| | EPA | 25212-19-5 | 1 |
| | H$_2$O | 7732-18-5 | Balance |
| 66 | 2 Aminoethyl ethanolamine | 111-41-1 | 0.0126 |
| | 30% citric acid | 5949-29-1 | 6.7 |
| | Tris-(2 hydroxyethylmethyl) ammonium hydroxide | 33667-48-0 | 0.21 |
| | Methyldiethanolamine | 105-59-9 | 0.063 |
| | bicine (N,N-Di(2-hydroxylethyl)-glycine | 150-25-4 | 0.5 |
| | (Polyoxyethylene(23)lauryl ether) | 9002-92-0 | 0.05 |
| | H$_2$O | 7732-18-5 | Balance |
| 67 | 2 Aminoethyl ethanolamine | 111-41-1 | 0.0126 |
| | 30% citric acid | 5949-29-1 | 6.7 |
| | Tris-(2 hydroxyethylmethyl) ammonium hydroxide | 33667-48-0 | 0.21 |
| | Methyldiethanolamine | 105-59-9 | 0.063 |
| | bicine (N,N-Di(2-hydroxylethyl)-glycine | 150-25-4 | 0.5 |
| | Monoammonium bis(nonafluoro-butanesulfonyl)imide | 129318-48-5 | 0.005 |
| | H$_2$O | 7732-18-5 | Balance |
| 68 | 2 Aminoethyl ethanolamine | 111-41-1 | 0.0219 |
| | 30% citric acid | 5949-29-1 | 6.7 |
| | Tris-(2 hydroxyethylmethyl) ammonium hydroxide | 33667-48-0 | 0.365 |
| | Methyldiethanolamine | 105-59-9 | 0.1095 |
| | Monoammonium bis(nonafluoro-butanesulfonyl)imide | 129318-48-5 | 0.02 |
| | H$_2$O | 7732-18-5 | Balance |
| 69 | 2 Aminoethyl ethanolamine | 111-41-1 | 0.0048 |
| | 30% citric acid | 5949-29-1 | 6.7 |
| | Tris-(2 hydroxyethylmethyl) ammonium hydroxide | 33667-48-0 | 0.08 |
| | Methyldiethanolamine | 105-59-9 | 0.024 |
| | bicine (N,N-Di(2-hydroxylethyl)-glycine | 150-25-4 | 0.5 |
| | ftergent 215M | | 0.02 |
| | H$_2$O | 7732-18-5 | Balance |

-continued

| Composition | Ingredients | CAS # | % by weight |
|---|---|---|---|
| 70 | 2 Aminoethyl ethanolamine | 111-41-1 | 0.006 |
|  | 30% citric acid | 5949-29-1 | 6.7 |
|  | Tris-(2 hydroxyethylmethyl) ammonium hydroxide | 33667-48-0 | 0.1 |
|  | Methyldiethanolamine | 105-59-9 | 0.03 |
|  | bicine (N,N-Di(2-hydroxylethyl)-glycine | 150-25-4 | 0.5 |
|  | 3,3,4,4,5,5,6,6,7,7,8,8-Tridecafluorooctanesulfonic acid | 27619-97-2 | 0.02 |
|  | H$_2$O | 7732-18-5 | Balance |

Example 29

Compositions 71-76 illustrate the additional benefits of adding other corrosion inhibitors to the compositions of the invention.

| Composition | Ingredients | CAS # | % by weight |
|---|---|---|---|
| 71 | 2 Aminoethyl ethanolamine | 111-41-1 | 0.66 |
|  | Tris-(2 hydroxyethylmethyl) ammonium hydroxide | 33667-48-0 | 11 |
|  | Methyldiethanolamine | 105-59-9 | 3.3 |
|  | 70% Glycolic acid | 79-14-1 | 2.2 |
|  | 30% citric acid | 5949-29-1 | 13.5 |
|  | 1,2,3,4,5,6-hexakis-O-[3-(hydroxy-amino)-3-iminopropyl]Hexitol | 950752-25-7 | 0.15 |
|  | H$_2$O | 7732-18-5 | Balance |
| 72 | 2 Aminoethyl ethanolamine | 111-41-1 | 0.66 |
|  | Tris-(2 hydroxyethylmethyl) ammonium hydroxide | 33667-48-0 | 11 |
|  | Methyldiethanolamine | 105-59-9 | 3.3 |
|  | 90% Lactic acid | 50-21-5 | 1.7 |
|  | 30% citric acid | 5949-29-1 | 13.5 |
|  | 1,2,3,4,5,6-hexakis-O-[3-(hydroxy-amino)-3-iminopropyl]Hexitol | 950752-25-7 | 5 |
|  | H$_2$O | 7732-18-5 | Balance |
| 73 | 2 Aminoethyl ethanolamine | 111-41-1 | 0.48 |
|  | Tris-(2 hydroxyethylmethyl) ammonium hydroxide | 33667-48-0 | 8 |
|  | Methyldiethanolamine | 105-59-9 | 2.4 |
|  | DMEE | 1704-62-7 | 5 |
|  | 90% Lactic acid | 50-21-5 | 1.7 |
|  | 30% citric acid | 5949-29-1 | 13.5 |
|  | 1,2,3,4,5,6-hexakis-O-[3-(hydroxy-amino)-3-iminopropyl]Hexitol | 950752-25-7 | 0.15 |
|  | H$_2$O | 7732-18-5 | Balance |
| 74 | 2 Aminoethyl ethanolamine | 111-41-1 | 0.48 |
|  | Tris-(2 hydroxyethylmethyl) ammonium hydroxide | 33667-48-0 | 8 |
|  | Methyldiethanolamine | 105-59-9 | 2.4 |
|  | MIPA | 78-96-6 | 5 |
|  | 90% Lactic acid | 50-21-5 | 1.7 |
|  | 30% citric acid | 5949-29-1 | 13.5 |
|  | 1,2,3,4,5,6-hexakis-O-[3-(hydroxy-amino)-3-iminopropyl]Hexitol | 950752-25-7 | 0.15 |
|  | H$_2$O | 7732-18-5 | Balance |
| 75 | 2 Aminoethyl ethanolamine | 111-41-1 | 1.32 |
|  | Tris-(2 hydroxyethylmethyl) ammonium hydroxide | 33667-48-0 | 22 |
|  | Methyldiethanolamine | 105-59-9 | 6.6 |
|  | 90% Lactic acid | 50-21-5 | 4.5 |
|  | 30% citric acid | 5949-29-1 | 18.9 |
|  | Xylitol | 87-99-0 | 20 |
|  | H$_2$O | 7732-18-5 | Balance |
| 76 | 2 Aminoethyl ethanolamine | 111-41-1 | 1.32 |
|  | Tris-(2 hydroxyethylmethyl) ammonium hydroxide | 33667-48-0 | 22 |
|  | Methyldiethanolamine | 105-59-9 | 6.6 |
|  | 90% Lactic acid | 50-21-5 | 4.5 |
|  | 30% citric acid | 5949-29-1 | 18.9 |
|  | Sorbitol | 50-70-4 | 20 |
|  | H$_2$O | 7732-18-5 | Balance |

Example 30

Compositions 77-79 illustrate that the compositions of the invention can include additional solvents, such as propylene glycol, and that the pH of the said compositions can further be adjusted with acids.

| Composition | Ingredients | CAS # | % by weight |
|---|---|---|---|
| 77 | 2 Aminoethyl ethanolamine | 111-41-1 | 0.0126 |
|  | 30% citric acid | 5949-29-1 | 6.7 |
|  | Tris-(2 hydroxyethylmethyl) ammonium hydroxide | 33667-48-0 | 0.21 |
|  | Methyldiethanolamine | 105-59-9 | 0.063 |
|  | bicine (N,N-Di(2-hydroxylethyl)-glycine) | 150-25-4 | 0.5 |
|  | Sulfuric acid | 7664-93-9 | 0.1 |
|  | H$_2$O | 7732-18-5 | Balance |
| 78 | 2 Aminoethyl ethanolamine | 111-41-1 | 0.0126 |
|  | 30% citric acid | 5949-29-1 | 6.7 |
|  | Tris-(2 hydroxyethylmethyl) ammonium hydroxide | 33667-48-0 | 0.21 |
|  | Methyldiethanolamine | 105-59-9 | 0.063 |
|  | bicine (N,N-Di(2-hydroxylethyl)-glycine) | 150-25-4 | 0.5 |
|  | PG | 57-55-6 | 2 |
|  | H$_2$O | 7732-18-5 | Balance |
| 79 | 2 Aminoethyl ethanolamine | 111-41-1 | 1.32 |
|  | Tris-(2 hydroxyethylmethyl) ammonium hydroxide | 33667-48-0 | 22 |
|  | Methyldiethanolamine | 105-59-9 | 6.6 |
|  | 90% Lactic acid | 50-21-5 | 4.5 |
|  | 30% citric acid | 5949-29-1 | 18.9 |
|  | PG | 57-55-6 | 10 |
|  | H$_2$O | 7732-18-5 | Balance |

Example 31

AEEA with TMAH and Choline Hydroxide

Compositions 80-87 demonstrate that other quaternary ammonium inhibitors, such as Tetramethylammonium hydroxide or choline hydroxide can replace Tri-(Hydroxyethylmethyl ammonium) hydroxide on an equal molar or equal weight basis.

| Composition | AEEA | INHIBITOR Choline Hydroxide (40%) | INHIBITOR Tetramethyl ammonium hydroxide (25%) | AMINE MDEA | CHELATING AGENT Lactic Acid (90%) | CHELATING AGENT Citric Acid (30%) | SURFACTANT EPA (12.2%) | Total Water Balance | Total |
|---|---|---|---|---|---|---|---|---|---|
| 80 | 1 | 31.25 | | 4 | 6 | 8.5 | | 49.25 | 100 |
| 81 | 1 | 31.25 | | 4 | 6 | 8.5 | 8 | 41.25 | 100 |
| 82 | 1 | 11 | | 4 | 6 | 8.5 | | 69.5 | 100 |
| 83 | 1 | 11 | | 4 | 6 | 8.5 | 8 | 68.7 | 100 |
| 84 | 1 | | 50 | 4 | 6 | 8.5 | | 30.15 | 100 |
| 85 | 1 | | 50 | 4 | 6 | 8.5 | 8 | 21.25 | 100 |
| 86 | 1 | | 16.8 | 4 | 6 | 8.5 | | 63.7 | 100 |
| 87 | 1 | | 16.8 | 4 | 6 | 8.5 | 8 | 63.0 | 100 |

Example 32

Composition AEEA with Chelating Agent Other than Carboxylic Acids

Compositions 88-93 demonstrate that other chelating agent can be used in-place of organic carboxylic acid. The pH of these solutions is 6.0-8.0.

| Composition | AEEA | Tris-(2 hydroxyethylmethyl)ammonium hydroxide | MDEA | TETA | DeQuest® 2000 | EPA (12.2%) | Water Balance |
|---|---|---|---|---|---|---|---|
| 88 | 0.3 | 7 | 1.8 | 1.0 | 7 | 1.0 | Balance |
| 89 | 0.3 | 7 | 1.8 | 1.0 | 7 | 1 | Balance |
| 90 | 0.3 | 7 | 1.8 | 1.0 | 7 | 1 | Balance |
| 91 | 0.3 | 14 | 4 | 0.3 | 15 | 1 | Balance |
| 92 | 0.3 | 14 | 4 | 0.3 | 15 | 1 | Balance |
| 93 | 0.3 | 14 | 4 | 0.3 | 15 | 1 | Balance |

TABLE 11

| Abbreviation | Chemical Name | CAS # |
|---|---|---|
| AEEA | 2-(2-aminoethylamino)ethanol; 2 aminoethyl ethanolamine | 111-41-1 |
| THEMAH | trishydroxyethylmethylammonium hydroxide | 33667-48-0 |
| Lactic Acid (90%) | 2-Hydroxypropionic acid | 50-21-5 |
| Citric Acid (30%) | 3-Hydroxypentanedioc acid | 77-92-9 |
| Glyoxylic acid (50%) | Hydroxyacetic acid | 563-96-2 |
| MDEA | Methyldiethanolamine | 105-59-9 |
| PG | propylene glycol | 57-55-6 |
| TEA | triethanolamine | 102-71-6 |
| DMEE | N,N Dimethylethoxyethanol | 1704-62-7 |
| MIPA | monoisopropanolamine | 78-96-6 |
| EPA-SK-01 (12.2%) | epoxypolyamide | 25212-19-5 |
| PA | N-aminoethylisopropanolamine | 123-84-2 |
| TETA | triethylenetetramine | 112-24-3 |
| DTPA | diethylenetriaminepentaacetic acid | 67-43-6 |
| EDTA | ethylenediaminetetraacetic acid | 60-00-4 |
| EDTPO | N,N,N',N'-ethylenediaminetetrakis-(methylenephosphonic Acid) | 1429-50-1 |
| IDA | iminodiacetic acid | 142-73-4 |
| CyDTA | trans-1,2-Diaminocyclohexane-N,N,N',N'-tetraacetic acid | 125572-95-4 |
| DEHA (85%) | diethylhydroxylamine | 3710-84-7 |
| H-TEMPO | 4-hydroxy-2,2,6,6-tetramethyl-piperidine-1-oxyl | 2226-96-2 |
| DMAB | dimethylamine borane | 74-94-2 |
| DMAc | Dimethylacetamide | 127-19-5 |
| DMSO | dimethylsulfoxide | 67-68-5 |
| DGBE | diethyleneglycolmonobutylether | 112-34-5 |
| PMDTA | N,N,N',N'',N''-pentamethyl-diethylenetriamine | 3030-47-5 |
| DGA | diglycolamine | 929-06-6 |
| SDS | sodium dodecyl sulfate | 151-21-3 |
| PEG | polyethylene glycol 200 | 25322-68-3 |
| POELE | polyethylene glycol lauryl ether | 9002-92-0 |
| POEDA | polyethylene glycol dodecyl amine | 70824-83-8 |
| EEA | ethylethanolamine | 110-73-6 |
| TMHDA | N,N,N',N'-tetramethylhexanediamine | 111-18-2 |
| DEEA | N,N-diethylethanolamine | 100-37-8 |
| MBM | N-butylethanolamine | 111-75-1 |
| MEA | monoethanolamine | 141-43-5 |
| EDA | ethylenediamine | 107-15-3 |
| DETA | diethylenetriamine | 111-40-0 |
| TMEDA | tetramethylethylenediamine | 110-18-9 |
| TMAH (25%) | tetramethylammonium hydroxide | 75-59-2 |
| NH$_3$ (28%) | ammonia | 7664-41-7 |
| BTMAH | benzyltetramethylammonium hydroxide | 100-85-6 |
| TBAH | tetrabutylammonium hydroxide | 2052-49-5 |
| MMEA | monomethyl ethanolamine | 109-83-1 |
| DEA | diethanolamine | 111-42-2 |
| NPA | n-propanolamine | 156-87-6 |
| AEEDA | N-(-2-aminoethyl)-ethylenediamine | 71124-11-3 |
| | 1,2,3,4,5,6-hexakis-O-[3-(hydroxy-amino)-3-iminopropyl]Hexitol Sorbitol | 950752-25-7 |
| | Xylito | 50-70-4 |
| | Xylitol | 97-99-0 |
| DeQuest® 2000 | 50% solution of Amino tris-(methylenephosphonic acid) | 6419-19-8/ |
| | Phosphonic acid | 13598-36-2 |

| Name | Chemical Name |
|---|---|
| Choline | (2-hydroxyethyltrimethylammonium hydroxide) |
| Bischoline | bis(2-hydroxyethyl) dimethylammonium hydroxide |
| Trischoline | Tris (2-hydroxyethyl)methylammonium hydroxide |

It should further be apparent to those skilled in the art that various changes in form and details of the invention as shown and described may be made. It is intended that such changes be included within the spirit and scope of the claims appended hereto. The above examples are exemplary, and the scope of the invention should be determined by the claims below and, in the event of continuations or divisionals of this application, by the claims therein.

What is claimed is:

1. A method of removing etching residue from a semiconductor substrate, said method comprising:
   (a) providing a substrate comprising metal and/or metal alloy portions and/or layers and a surface having organic, organometallic, and/or metal oxide residue thereon, and
   (b) contacting the substrate with a composition comprising 2-(2-aminoethylamino)-ethanol, methyldiethanolamine, and water and which composition is substantially free of hydroxylamine,
   wherein said composition is capable of removing said organic, organometallic, and metal oxide residues, for a time and at a temperature sufficient to remove the residue from the semiconductor substrate, and
   wherein 2-(2-aminoethylamino)-ethanol is present in an amount less than about 1.5% by weight.

2. The method of claim 1, wherein the composition further comprises at least one of a chelating agent and a corrosion inhibitor,
   wherein the corrosion inhibitor is selected from the group consisting of choline hydroxide; bischoline hydroxide; trischoline hydroxide; TMAH; TMAH pentahydrate; BTMAH; TBAH and mixtures thereof, and
   wherein the chelating agent is selected from the group consisting of amino tris(methylenephosphonic acid), phosphonic acid, citric acid, lactic acid, glycolic acid, tartaric acid, formic acid, glyoxylic acid, acetic acid, propionic acid and mixtures thereof.

3. The method of claim 1, which further comprises an alkanolamine compound other than 2-(2 aminoethylamino)-ethanol.

4. The method of claim 3, wherein the alkanolamine compound other than 2-(2 aminoethylamino)-ethanol and methyldiethanolamine is selected from the group consisting of DGA; MEA; MMEA; MIPA; DEA; 2-[(2-aminoethyl)-(2-hydroxyethyl)-amino]-ethanol; TEA; N-aminoethyl-N'-hydroxyethyl-ethylenediamine;
   N,N'-dihydroxyethyl-ethylenediamine; 2[2-(2-aminoethoxy)-ethylamino]-ethanol; 2[2-(2-aminoethylamino)-ethoxy]-ethanol; 2-[2-(2-aminoethoxy)-ethoxy]ethanol;
   tertiarybutyldiethanolamine; isopropanolamine; diisopropanolamine; NPA;
   isobutanolamine; 2-(2-aminoethoxy)-propanol; 1-hydroxy-2-aminobenzene;
   aminoethylpropanolamine; diethyl ethanolamine;
   monobutylethanolamine and mixtures thereof.

5. The method of claim 1 further comprising an amine compound that is not an alkanolamine.

6. The method of claim 5 wherein the amine compound is selected from the group consisting of o-diaminobenzene; p-diaminobenzene; N-(2-aminoethyl)-ethylenediamine; piperazine, N-substituted piperazine derivatives, piperidine; N-substituted piperidine derivatives; 2-methyleneaminopropylenediamine;
   hexamethylene tetramine; EDA; DETA; PMDTA; TETA; tetramethylethylenediamine and mixtures thereof.

7. The method of claim 1 further comprising a surfactant.

8. The method of claim 7 wherein the surfactant is selected from the group consisting of epoxy polyamide resin; 3,3,4,4,5,5,6,6,7,7,8,8-tridecafluorooctanesulfonic acid; Ftergent 215M; monoammonium bis(nonafluorobutanesulfonyl)imide; polyoxyethylene(23)lauryl ether and mixtures thereof.

9. The method of claim 1 further comprising a polar organic solvent.

10. The method of claim 1 wherein the composition can further be diluted with deionized water at point of use to a dilution rate up to about 300 to 1.

* * * * *

UNITED STATES PATENT AND TRADEMARK OFFICE
CERTIFICATE OF CORRECTION

| | |
|---|---|
| PATENT NO. | : 8,003,587 B2 |
| APPLICATION NO. | : 12/403600 |
| DATED | : August 23, 2011 |
| INVENTOR(S) | : Wai Mun Lee et al. |

It is certified that error appears in the above-identified patent and that said Letters Patent is hereby corrected as shown below:

Column 4, line 17: After "materials to" delete "the" and replace with -- be --
Column 9, line 66: Delete "isobutanol amine;" and replace with -- isobutanolamine; --
Column 14, line 11: Delete "task-" and replace with -- task, --
Column 14, line 13: Delete "t)" and replace with -- to --
Column 15, line 18: Delete "li-alloy" and replace with -- Ti-alloy --
Column 15, line 18: Delete "A1-alloy," and replace with -- Al-alloy, --
Column 15, line 37: Delete "eases" and replace with -- cases --
Column 16, line 22: Delete "thiphenol-amino-carboxylic" and replace with -- thiphenol; amino-carboxylic --
Column 16, line 24: After "ethylene oxide" insert -- ; --
Column 16, line 31: After "issued Sep." delete "3D," and replace with -- 30, --
Column 19, line 17: Delete "IF-base" and replace with -- HF-base --
Column 21, line 19: After "such that" delete "in" and replace with -- m --
Column 21, line 32: At the end of the line, delete "$R_1$" and replace with -- $R_3$ --
Column 23, line 49: After "of 2-" delete "(9-" and replace with -- (2- --
Column 24, line 42: After "where" delete "n" and replace with -- $R_4$ --
Column 24, line 43: Delete " $R_2^9$," and replace with -- $R_2'$, --
Column 24, line 43: Delete "X," and replace with -- Z, --
Column 25, line 1: Delete "atoms," and replace with -- atoms; --
Column 25, line 1: Before "or" insert -- and wherein X and Y are, independently, hydrogen or a linear, branched, or cyclic hydrocarbon containing from 1 to 7 carbon atoms, --
Column 25, line 2: Delete "N" and insert -- X --
Column 25, line 10: Delete "fromn" and replace with -- from --
Column 26, line 11: After "together" delete "for" and replace with -- from --
Column 27, line 33: Delete "0.151%" and replace with -- 0.15% --
Column 28, line 7: After "present in" delete "al" and replace with -- an --
Column 29, line 64: After "water" insert -- , --
Column 30, line 46: Delete "AREA" and replace with -- AEEA --
Column 30, line 53: Delete "0.9; 1," and replace with -- 0.9: 1, --

Signed and Sealed this
Seventh Day of February, 2012

David J. Kappos
*Director of the United States Patent and Trademark Office*

CERTIFICATE OF CORRECTION (continued)
U.S. Pat. No. 8,003,587 B2

Column 36, line 66: Delete "AREA" and replace with -- AEEA --
Column 46, line 24: Delete "2504" and replace with -- ~250Å --
Column 46, line 63: Delete "groups)," and replace with -- group(s), --

In the Tables:
Column 47, line 67, Fourth Column: Delete "133" and replace with -- 13.3 --
Column 48, line 34, Third Column: Delete "50 2 – 5" and replace with -- 50-21-5 --
Column 48, line 53, Third Column: Delete "7732- 8 5" and replace with -- 7732-18-5 --
Column 54, line 57, Table 11: Move "Sorbitol      50-70-4" to a line before "Xylito      97-99-0"